US008088221B2

(12) United States Patent
Shapiro

(10) Patent No.: US 8,088,221 B2
(45) Date of Patent: *Jan. 3, 2012

(54) METHOD AND SYSTEM FOR DIAMOND DEPOSITION USING A LIQUID-SOLVENT CARBON-TRANFSER MECHANISM

(76) Inventor: Zalman M. Shapiro, Pittsburgh, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/084,521

(22) Filed: Apr. 11, 2011

(65) Prior Publication Data

US 2011/0185964 A1 Aug. 4, 2011

Related U.S. Application Data

(62) Division of application No. 12/485,016, filed on Jun. 15, 2009, now Pat. No. 7,922,815, which is a division of application No. 12/163,980, filed on Jun. 27, 2008, now Pat. No. 7,547,358.

(60) Provisional application No. 61/033,421, filed on Mar. 3, 2008.

(51) Int. Cl.
*C30B 29/04* (2006.01)

(52) U.S. Cl. ............... 117/68; 117/70; 117/72; 117/74; 117/929; 423/446

(58) Field of Classification Search .................. 117/68, 117/70, 72, 74, 929; 423/446
See application file for complete search history.

(56) References Cited

U.S. PATENT DOCUMENTS

| | | | |
|---|---|---|---|
| 2,996,763 A | 8/1961 | Wentorf, Jr. | |
| 3,030,188 A | 4/1962 | Eversole | |
| 3,038,409 A | 6/1962 | Edgerly et al. | |
| 3,142,539 A | 7/1964 | Brinkman et al. | |
| 3,175,885 A | 3/1965 | Brinkman et al. | |
| 3,371,996 A | 3/1968 | Hibshman | |
| 3,630,677 A | 12/1971 | Angus | |

(Continued)

FOREIGN PATENT DOCUMENTS

GB 761 531 11/1956

(Continued)

OTHER PUBLICATIONS

Ainsley, et al., "The Solubility of Carbon in Sodium", "Journal of Nuclear Materials", Mar. 6, 1974, pp. 255-276, vol. 52, Publisher: North-Holland Publishing Company.

(Continued)

*Primary Examiner* — Bob M Kunemund
(74) *Attorney, Agent, or Firm* — Charles A. Lemaire; Jonathan M. Rixen; Lemaire Patent Law Firm, P.L.L.C.

(57) ABSTRACT

A system and method for growing diamond crystals from diamond crystal seeds by epitaxial deposition at low temperatures and atmospheric and comparatively low pressures. A solvent is circulated (by thermal convection and/or pumping), wherein carbon is added in a hot leg, transfers to a cold leg having, in some embodiments, a range of progressively lowered temperatures and concentrations of carbon via the circulating solvent, and deposits layer-by-layer on diamond seeds located at the progressively lower temperatures since as diamond deposits the carbon concentration lowers and the temperature is lowered to keep the solvent supersaturated. The solvent includes metal(s) or compound(s) that have low melting temperatures and transfer carbon at comparatively low temperatures. A controller receives parameter signals from a variety of sensors located in the system, processes these signals, and optimizes diamond deposition by outputting the necessary control signals to a plurality of control devices (e.g., valves, heaters, coolers, pumps).

20 Claims, 17 Drawing Sheets

U.S. PATENT DOCUMENTS

| | | | |
|---|---|---|---|
| 3,705,937 | A | 12/1972 | Dzevitsky |
| 3,853,700 | A | 12/1974 | Armijo |
| 3,892,539 | A | 7/1975 | Midler, Jr. |
| 3,906,082 | A | 9/1975 | Shulzhenko et al. |
| 4,049,788 | A | 9/1977 | Bierbach et al. |
| 4,105,493 | A | 8/1978 | Chauvy |
| 4,849,199 | A | 7/1989 | Pinneo |
| 4,939,763 | A | 7/1990 | Pinneo et al. |
| 4,960,562 | A | 10/1990 | Okuda et al. |
| 4,963,200 | A | 10/1990 | Okuda et al. |
| 4,984,534 | A | 1/1991 | Ito et al. |
| 5,015,528 | A | 5/1991 | Pinneo |
| 5,209,812 | A | 5/1993 | Wu et al. |
| 5,391,846 | A | 2/1995 | Taylor et al. |
| 5,441,013 | A | 8/1995 | Jeng et al. |
| 5,516,884 | A | 5/1996 | Bianconi |
| 5,609,926 | A | 3/1997 | Prins |
| 6,019,509 | A | 2/2000 | Speckbrock et al. |
| 6,919,061 | B1 | 7/2005 | Sherman et al. |
| 7,235,130 | B2 | 6/2007 | Hemley et al. |
| 7,258,741 | B2 | 8/2007 | Linares et al. |
| 2005/0020853 | A1 | 1/2005 | Kuroda et al. |
| 2006/0288927 | A1 | 12/2006 | Chodelka et al. |
| 2007/0014965 | A1 | 1/2007 | Chodelka et al. |
| 2007/0017437 | A1 | 1/2007 | Genis et al. |
| 2007/0164427 | A1 | 7/2007 | Sauciuc et al. |
| 2007/0180951 | A1 | 8/2007 | Armstrong et al. |
| 2007/0193864 | A1 | 8/2007 | Beerling |

FOREIGN PATENT DOCUMENTS

| | | |
|---|---|---|
| WO | WO 2007002399 A2 | 1/2007 |
| WO | WO 2007002402 A2 | 1/2007 |
| WO | PCTUS0935783 | 3/2010 |

OTHER PUBLICATIONS

Davis, "The New Diamond Age", "Wired", Sep. 2003, vol. 11.09.

Gorder, Pam Frost, "Bucky Diamonds in the Rough", "Physical Review-Focus", Jan. 30, 2003, pp. 037401, vol. 11, No. 90.

Kesser, "Sodium Technology Quarterly Report", "Reactor Technology", Mar. 1971, vol. ANL/ST-8, Publisher: Argonne National Laboratory.

May, Paul W., "The New Diamond Age?", "Science", Mar. 14, 2008, pp. 1490-1491, vol. 319, Publisher: AAAS.

Sangster, "C-Na (Carbon-Sodium) System", "Journal of Phase Equilibria and Diffusion", Sep. 27, 2007, pp. 571-579, vol. 28, No. 6.

Spear, et al., "High temperature chemistry of CVD (chemical vapor deposition) diamond growth", "Pure and Applied Chemistry", 1994, pp. 1773-1782, vol. 66, No. 9, Published in: Great Britain.

Tsymbal, Evgeny Y., "Section 1-Crystal Structure (lecture notes)", "Solid-State Physics 927", Sep. 7, 2003, pp. 1-9, Publisher: University of Nebraska-Lincoln (Department of Physics and Astronomy).

Wang, et al., "Calculated phase diagrams for activated low pressure diamond growth from C-H, C-O, and C-H-O systems", "Journal of Materials Research", Dec. 1997, pp. 3250-3253, vol. 12, No. 12.

Wang, et al., "Modern Thermodynamics for CVD Diamond", Mar. 23, 2006, Publisher: Dept. of Microelectronics, Fudan University, Shanghai, China, Published in: China.

Weaver, et al., "Thermodynamic Computation of Phase Equilibria in the Sodium-Carbon-Oxygen System", "Metallurgical Transactions", Apr. 1977, pp. 603-607, vol. 8A.

FIG. 1B

| Element | Melting Point (°C) | Boiling Point (°C) | Density (g/cm³) |
|---|---|---|---|
| Group I Alkali Metals | - | - | - |
| Lithium (Li) | 180 | 1342 | 0.53 |
| Sodium (Na) | 97 | 882.9 | 0.97 |
| Potassium (K) | 63 | 760 | 0.86 |
| Rubidium (Rb) | 38 | 686 | 1.532 |
| Caesium (Cs) | 28.4 | 669.3 | 1.88 |
| Francium (Fr) | 26.9 | 676.9 | 1.87 |
| Carbon Allotropes | - | - | - |
| Diamond | 3500 | 4200 | 3.510 |
| Graphite | 3500 | 4200 | 2.250 |

FIG. 1C

| Compound | Melting Point (°C) | Boiling Point (°C) | Density (g/cm³) |
|---|---|---|---|
| Carbon-Absorbing Salts | - | - | - |
| NaOH | 318.4 | 1390 | 2.13 |
| KOH | 360.4 | 1320-1324 | 2.04 |
| LiOH | 450 | 924 | 1.46 |
| Inclusion Compounds | - | - | - |
| $Na_2C_2$ | 700 | - | 1.575 |
| LiH | 680 | - | 0.82 |
| $Li_2C_2$ | - | - | 1.65 |
| $KHC_2$ | - | - | - |
| NaH | d800 | - | 0.92 |
| $Na_3N$ | d300 | - | - |
| LiBH | d275 | - | 0.66 |
| $NaBH_4$ | d400 | - | 1.074 |

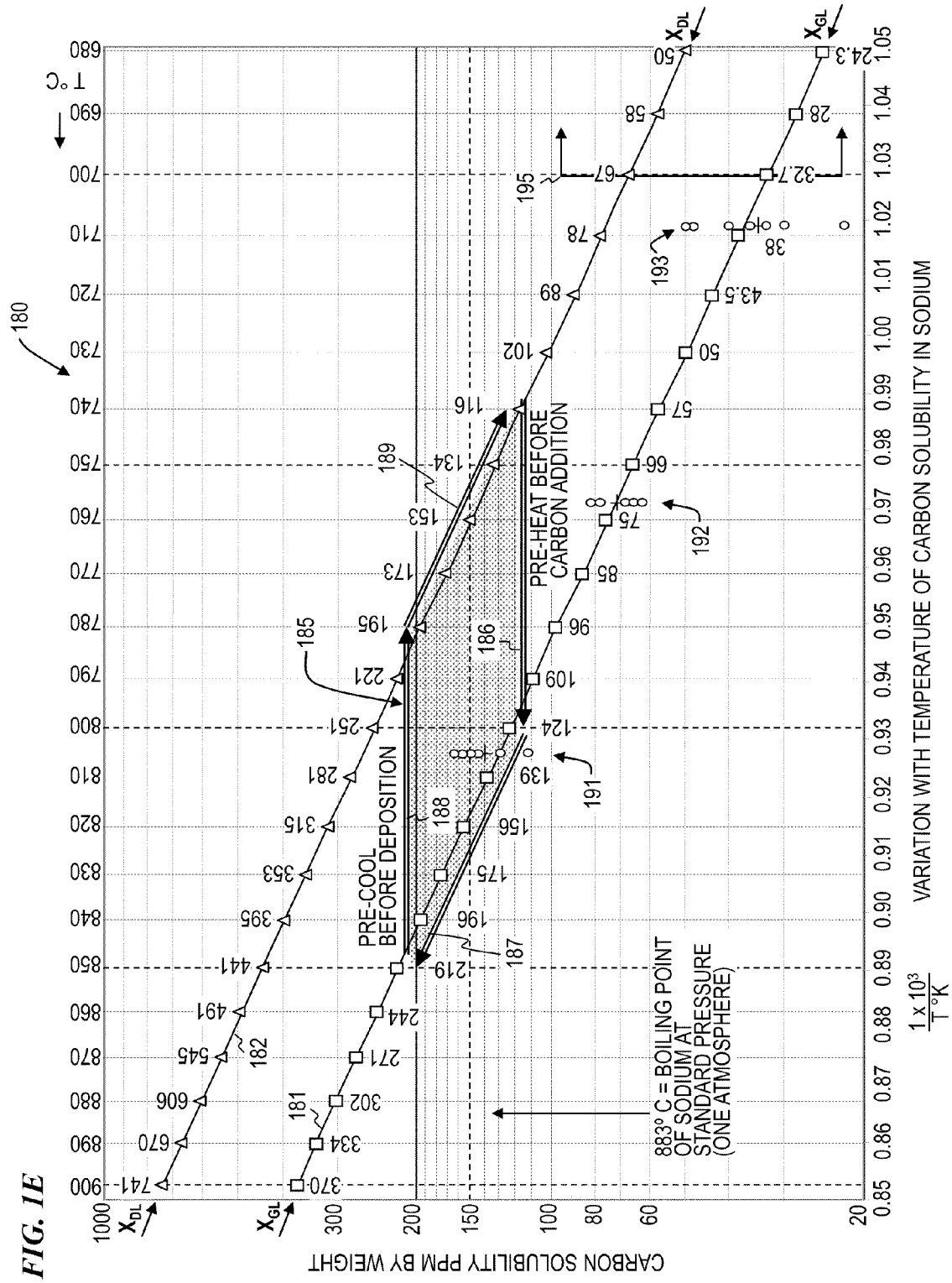

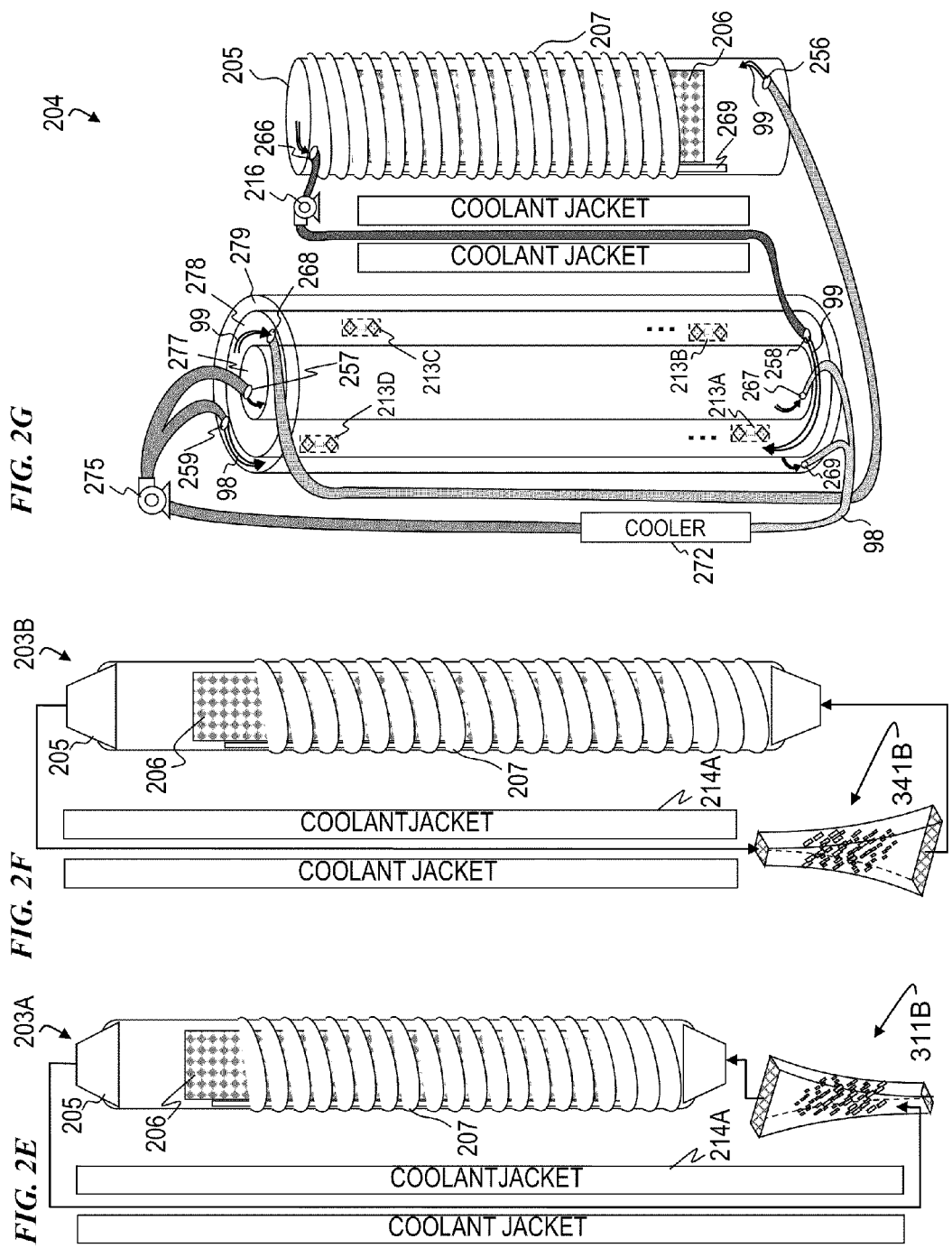

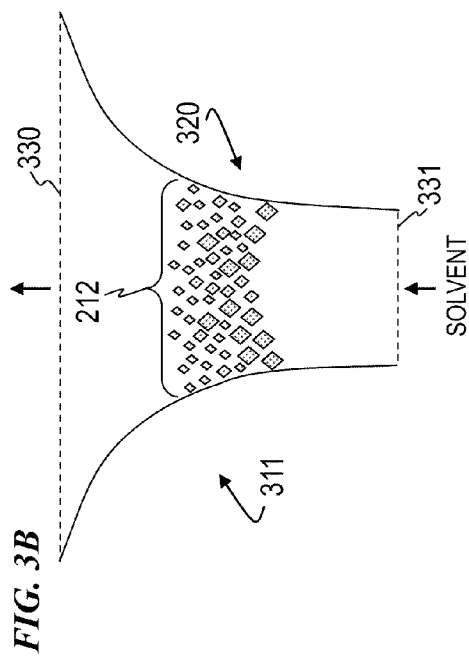
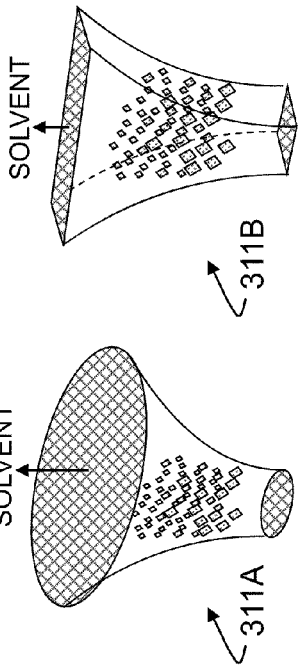
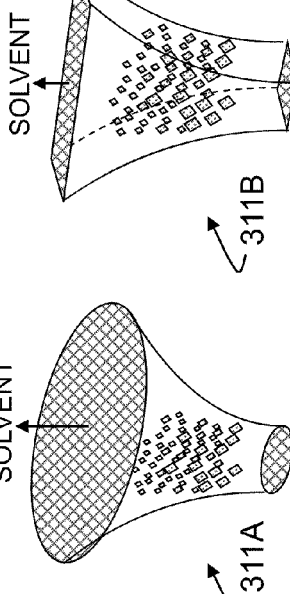
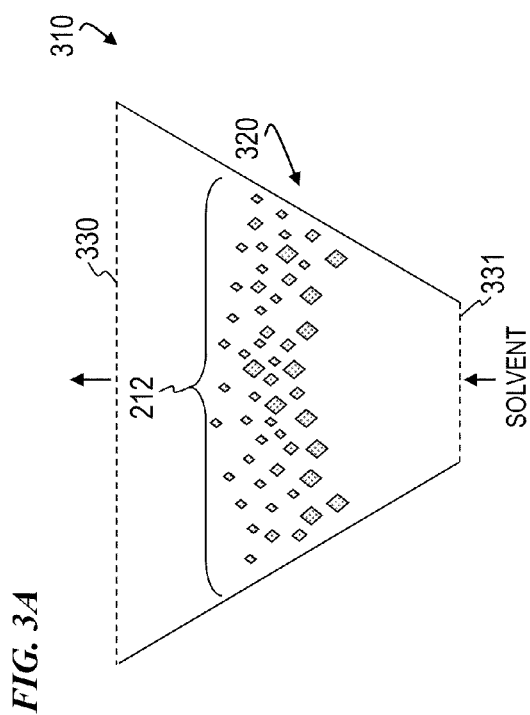
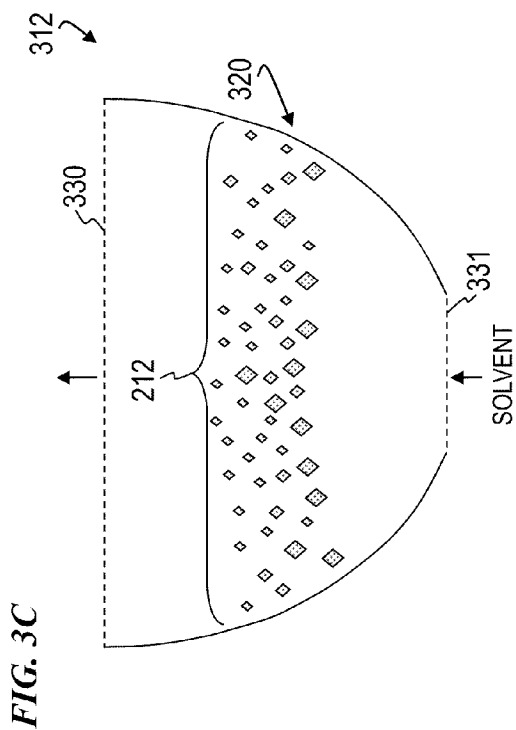
FLUIDIZED-BED DESIGNS WITH VARYING CROSS-SECTIONAL-AREA-PER-VERTICAL-DISTANCE

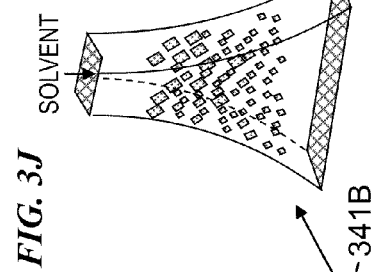
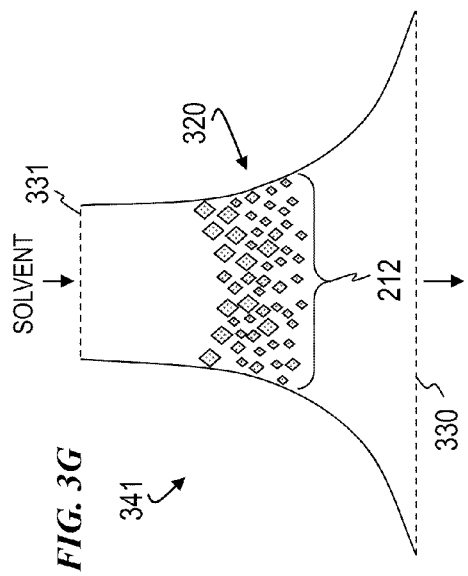
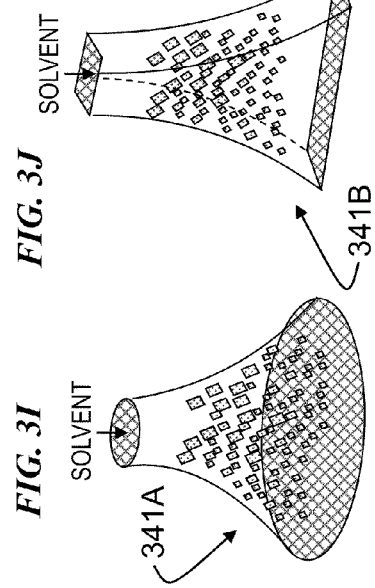
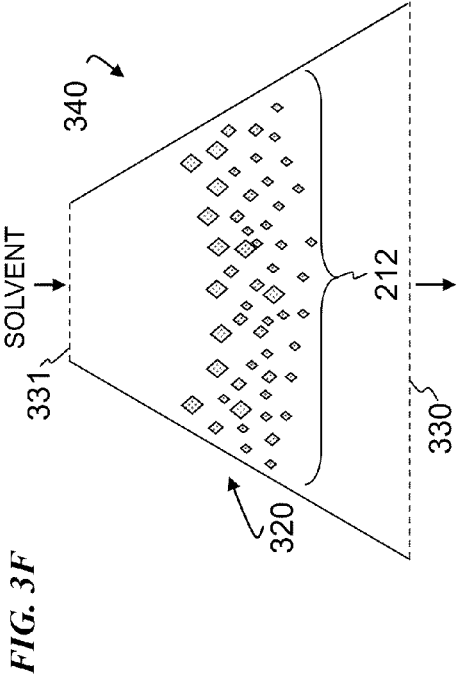
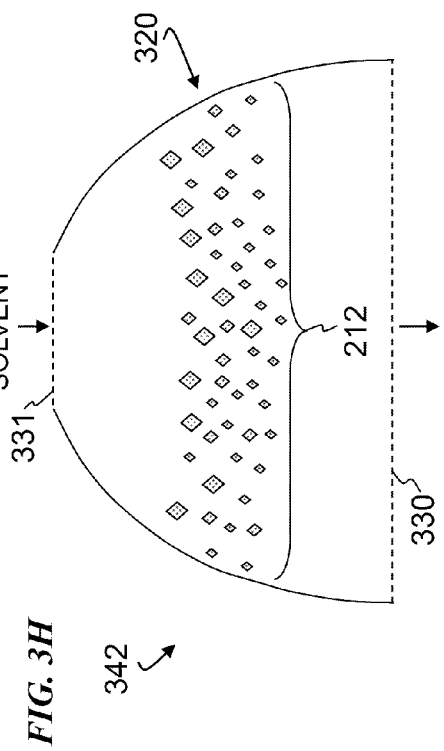

METHOD AND SYSTEM FOR DIAMOND DEPOSITION USING A LIQUID-SOLVENT CARBON-TRANFSER MECHANISM

CROSS-REFERENCE TO RELATED APPLICATION

This application is a divisional under 35 U.S.C. §120 of U.S. patent application Ser. No. 12/485,016 (which issued as U.S. Pat. No. 7,922,815 on Apr. 12, 2011) filed on Jun. 15, 2009, titled "SYSTEM AND METHOD FOR EPITAXIAL DEPOSITION OF A CRYSTAL USING A LIQUID-SOLVENT FLUIDIZED-BED MECHANISM", which is a divisional under 35 U.S.C. §120 of U.S. patent application Ser. No. 12/163,980 filed on Jun. 27, 2008 (which issued as U.S. Pat. No. 7,547,358 on Jun. 16, 2009), titled "SYSTEM AND METHOD FOR DIAMOND DEPOSITION USING A LIQUID-SOLVENT CARBON-TRANSFER MECHANISM", which claims benefit under 35 U.S.C. §119(e) of U.S. Provisional Patent Application No. 61/033,421 filed on Mar. 3, 2008, titled "SYSTEM AND METHOD FOR DIAMOND SYNTHESIS USING A LIQUID-SOLVENT CARBON-TRANSFER MECHANISM," each one of which is incorporated herein by reference in its entirety. This application is related to PCT Application No. PCT/US2009/035783 filed on Mar. 2, 2009, titled "SYSTEM AND METHOD FOR DIAMOND DEPOSITION USING A LIQUID-SOLVENT CARBON-TRANSFER MECHANISM", which also claims benefit of U.S. Provisional Patent Application No. 61/033,421 filed on Mar. 3, 2008, titled "SYSTEM AND METHOD FOR DIAMOND SYNTHESIS USING A LIQUID-SOLVENT CARBON-TRANSFER MECHANISM," each one of which is incorporated herein by reference in its entirety.

FIELD OF THE INVENTION

The present invention relates to diamond deposition, and more particularly to relatively low-temperature, relatively low-pressure diamond deposition using a liquid-solvent carbon-transfer mechanism to form gem-quality and/or semiconductor-quality crystal structures.

BACKGROUND OF THE INVENTION

Allotropes are pure forms of the same elements that differ in structure. Carbon has two main allotropes: diamond and graphite. Diamond is a cubic crystal of tetrahedrally-bonded carbon atoms. Diamond has a density of 3.51 grams per cubic centimeter. Graphite consists of parallel sheets of carbon atoms, each sheet containing hexagonal arrays of carbon atoms. The density of graphite is 2.25 grams per cubic centimeter. (A third allotrope, amorphous carbon, has a density ranging from about 1.8 to 2.2 grams per cubic centimeter. A fourth allotrope of carbon, consisting of a graphite-like sheet of carbon atoms that wraps to itself to form a ball, tube or similar structure, is referred to generally as a fullerene, and specific forms are known as buckyballs, carbon nanotubes and the like.) Natural diamonds are formed deep in the earth crust, under conditions of high temperature and pressure, and exist in a metastable state. Thus, diamond will revert to graphite if subjected to high temperature at low pressure. This reversion rate is function of temperature, pressure and time. Thus at 1000 degrees Celsius (° C.), diamond will revert to graphite at a slow but measurable rate.

Natural diamonds are commonly found in Kimberlitic pipes (commonly referred to as blue earth) expelled from great depths in the earth's crust. These diamonds are found in the presence of various minerals that contain a variety of elements including magnesium (Mg), aluminum (Al), chromium (Cr), manganese (Mn), iron (Fe), nickel (Ni), cobalt (Co), titanium (Ti), and silicon (Si). These diamonds often have carbon inclusions as well as trace impurities that impart color to an otherwise colorless crystal. For example, nitrogen gas ($N_2$) colors yellow.

A variety of techniques have been developed for artificially depositing and/or synthesizing diamonds. One type of diamond synthesis technique uses a high temperature, high pressure (HTHP) process. An HTHP process is described in U.S. Pat. No. 3,906,082 (hereinafter, "Shulzhenko et al."), titled "METHOD OF MAKING DIAMONDS SYNTHETICALLY", issued Sep. 16, 1975, and incorporated herein by reference. Shulzhenko et al. describe a method of diamond synthesis, by which a reaction mixture is prepared comprising, taken in direct contact, a carbonaceous material and a combination of components selected from the group containing silver chloride, calcium carbonate, calcium oxide and from a group containing aluminium and boron. Then the reaction mixture is subjected to the action of a temperature of at least about 1,800° C. and a pressure of at least 85 kbar for a time required for forming a diamond.

Another HTHP process is described in U.S. Patent Application Publication 2006 288927 A1 (hereinafter "Chodelka et al."), titled "SYSTEM AND HIGH PRESSURE, HIGH TEMPERATURE APPARATUS FOR PRODUCING SYNTHETIC DIAMONDS", published Dec. 28, 2006, and incorporated herein by reference. Chodelka et al. disclose an apparatus for growing a synthetic diamond comprises a growth chamber, at least one manifold allowing access to the growth chamber, and a plurality of safety clamps positioned on opposite sides of the growth chamber; wherein the growth chamber and the plurality of safety clamps are comprised of a material having a tensile strength of about 120,000-200,000 psi, a yield strength of about 100,000-160,000 psi, an elongation of about 10-20%, an area reduction of about 40-50%, an impact strength of about 30-40 ft-lbs, and a hardness greater than 320 BHN.

U.S. Pat. No. 4,984,534 (hereinafter, "Ito et al."), titled "METHOD FOR SYNTHESIS OF DIAMOND", issued Jan. 15, 1991, describes another diamond synthesis technique, and is incorporated herein by reference. Ito et al. describe a method for synthesis of diamond which is characterized by contacting a gas obtained by excitation of carbon monoxide and hydrogen in such a ratio as carbon monoxide being at least 1 mole % per total of carbon monoxide and hydrogen with a substrate in the presence of a reducing metal, a method for synthesis of diamond which is characterized by contacting with a substrate a gas obtained by excitation of carbon dioxide and hydrogen mixed at such a ratio of carbon dioxide being 0.1-20 mol % per hydrogen, and a method for synthesis of diamond by depositing diamond on the surface of a substrate by introducing onto the surface of the substrate a plasma obtained from hydrogen and carbon source gas by irradiation of microwave in a plasma generator which is characterized in that progress of microwave oscillated from one microwave oscillator is divided and thus divided respective microwaves and led to a plurality of plasma generators. Also disclosed is a diamond synthesis apparatus which is characterized by comprising a microwave oscillator for oscillation of microwave, a branched waveguide for dividing the microwave oscillated from said microwave oscillator and a plurality of plasma generators which are connected with said branched waveguide and have a substrate for deposition of diamond, respectively.

Another diamond synthesis technique is described in U.S. Pat. No. 7,235,130 (hereinafter, "Mao et al."), titled "APPARATUS AND METHOD FOR DIAMOND PRODUCTION", issued Jun. 26, 2007, and incorporated herein by reference. Mao et al. describe an apparatus for producing diamond in a deposition chamber including a heat-sinking holder for holding a diamond and for making thermal contact with a side surface of the diamond adjacent to an edge of a growth surface of the diamond, a noncontact temperature measurement device positioned to measure temperature of the diamond across the growth surface of the diamond and a main process controller for receiving a temperature measurement from the noncontact temperature measurement device and controlling temperature of the growth surface such that all temperature gradients across the growth surface are less than 20° C. The method for producing diamond includes positioning diamond in a holder such that a thermal contact is made with a side surface of the diamond adjacent to an edge of a growth surface of the diamond, measuring temperature of the growth surface of the diamond to generate temperature measurements, controlling temperature of the growth surface based upon the temperature measurements, and growing single-crystal diamond by microwave plasma chemical vapor deposition on the growth surface, wherein a growth rate of the diamond is greater than one micrometer per hour.

Chemical vapor deposition (CVD) is another technique for synthesizing diamonds. A CVD process is described in U.S. Pat. No. 7,258,741 (hereinafter "Linares et al."), titled "SYSTEM AND METHOD FOR PRODUCING SYNTHETIC DIAMOND", issued Aug. 21, 2007, and incorporated herein by reference. Linares et al. disclose synthetic monocrystalline diamond compositions having one or more monocrystalline diamond layers formed by chemical vapor deposition, the layers including one or more layers having an increased concentration of one or more impurities (such as boron and/or isotopes of carbon), as compared to other layers or comparable layers without such impurities. Such compositions provide an improved combination of properties, including color, strength, velocity of sound, electrical conductivity, and control of defects. A related method for preparing such a composition is also described, as well as a system for use in performing such a method, and articles incorporating such a composition.

U.S. Pat. No. 3,142,539 (hereinafter "Brinkman et al. '539"), titled "METHOD FOR ARTIFICIAL SYNTHESIS OF DIAMONDS", issued Jul. 28, 1964, describes another diamond synthesis technique and is incorporated herein by reference. Brinkman et al. describe contacting a seed diamond being maintained at a temperature of about 1273-2073° K (1000-1800° C.), with a flux of carbon atoms exceeding a critical minimum value. Brinkman et al. describe the critical minimum value for the temperature difference as creating a graphite-saturation-limit carbon concentration ($X_{GL}(T_{2c})$) in their molten solvent in their graphite-dissolving station at a higher temperature $T_{2c}$ wherein that carbon concentration is twice the graphite-saturation-limit carbon concentration ($X_{GL}(T_1)$) at the diamond-deposition location and diamond-deposition temperature $T_1$ such that $X_{GL}(T_{2c})=2X_{GL}(T_1)$. In one embodiment described by Brinkman et al. the carbon atoms are transported from the carbon source (where their carbon source, graphite, is dissolving into their molten medium (e.g., lead)) to the surface of the diamond seed by the circulating molten medium. In another embodiment described by Brinkman et al. the carbon atoms are transported from the source to the surface of the seed diamond via a vapor stream in a vacuum or an inert gas atmosphere. Brinkman et al. assert that satisfactory metals meeting the required criteria of melting and boiling points, and carbon solubility ranges, for use as the molten medium are, for example, copper, lead, aluminum, bismuth, gold, silver, antimony, tin, gallium, indium, and germanium. Brinkman et al. assert such metals may be used either separately or together, for instance copper-gold, silver-gold, and lead-tin alloys. Brinkman et al. further describe that the seed diamond(s) is/are positioned on a stand held by a wire, and that vertical movement of the wire changes the position of the stand in an orifice, thereby providing flow regulation of the circulating molten medium.

U.S. Pat. No. 5,015,528 (hereinafter, "Pinneo"), titled "FLUIDIZED BED DIAMOND PARTICLE GROWTH", issued May 14, 1991, describes a fluidized-bed diamond-synthesis technique and is incorporated herein by reference. Pinneo describes a process for forming synthetic diamond by vapor deposition of a carbon gas source in the presence of atomic hydrogen on a substrate contained in a gas-driven fluidized bed. The patent describes that the diamond may be overcoated by vapor deposition of a non-diamond material.

U.S. Pat. No. 5,609,926, (hereinafter, "Prins"), titled "DIAMOND DOPING", issued Mar. 11, 1997, describes a method for doping diamonds with relatively large atoms such as aluminium, phosphorus, arsenic and antimony, and is incorporated herein by reference. Prins describes a method of producing a doped diamond including the steps of implanting dopant atoms in the diamond at low temperature to create a damaged region of point defects in the form of vacancies and interstitial dopant atoms within the crystal lattice of the diamond and annealing the diamond to reduce lattice damage and cause dopant interstitial atoms to move into lattice positions, the dopant atoms having an atomic number of at least 13 and being capable of providing the diamond with an optical or electrical property when situated in a lattice position in the crystal lattice of the diamond and the implantation dose being selected to create less damage than would be created when carbon atoms are implanted to a density of $2.5 \times 10^{18}/cm^3$.

An article by R. Ainsley, Linda P. Hartlib, P.M Holroyd and G. Long, titled "The Solubility of Carbon in Sodium", Journal of Nuclear Materials 52 (1974) 255-276 (hereinafter, "Ainsley et al."), describes the solubility of carbon in sodium and is incorporated herein by reference. Prior-art FIG. 1D herein is based on Ainsley et al. Ainsley et al. describe that the solubility of carbon in sodium has been determined over the temperature range of about 490 to 832° C. and can be expressed by the relation $\log_{10}S$ (wt PPM)=7.646–5970/T (K). The authors state that the carbon is present probably as the dicarbide ion, except if oxygen or nitrogen is added, when the amount of dissolved carbon is enhanced by the formation of carbonate and cyanide respectively. When the sodium is cooled below freezing, the dissolved carbon readily plates out or absorbs on to surfaces in a way which is not easily reversed.

U.S. Pat. No. 3,038,409 (hereinafter, "Edgerly et al.), titled "EDDY CURRENT MAGNETIC LIQUID METAL PUMP", issued Jun. 12, 1962, describes an apparatus for pumping electrically conductive fluid, and is incorporated herein by reference.

U.S. Pat. No. 4,105,493 titled "Production of shaving foil" issued to Jean-Daniel Chauvy on Aug. 8, 1978, describes a steel-etching technique useful for making fine-holed metal screens, and is incorporated herein by reference.

What is needed is an improved diamond-deposition process and system. In particular, there is a need for a more efficient low-pressure, low-temperature diamond-deposition process.

SUMMARY OF THE INVENTION

In some embodiments, the present invention provides an apparatus for growing diamond crystal, the apparatus comprising a solvent-containing vessel that includes a carbon-addition station configured to add carbon to a molten solvent in order to produce a carbon-bearing molten solvent, a diamond-deposition station configured to deposit carbon as diamond from the carbon-bearing molten solvent onto at least one diamond-deposition surface, a solvent-flow system configured to flow the carbon-bearing molten solvent from the carbon-addition station to the diamond-deposition station, and a plurality of control devices operatively coupled to control operation of the solvent-containing vessel; the apparatus further comprising a plurality of sensors operatively coupled to the solvent-containing vessel, wherein each one of the plurality of sensors is configured to detect and transmit one or more process parameters; and a controller operatively coupled to receive the one or more transmitted parameters from each of the plurality of sensors, and operatively coupled to send out one or more control signals to each of the plurality of control devices based on the one or more transmitted parameters.

In some embodiments, the present invention provides a method for growing diamond crystal, the method comprising providing a carbon-addition station configured to add carbon to a molten solvent in order to produce a carbon-bearing molten solvent; providing a diamond-deposition station configured to deposit carbon in a diamond-crystal structure from the carbon-bearing molten solvent onto at least one diamond-deposition surface; providing a controller; flowing the carbon-bearing molten solvent from the carbon-addition station to the diamond-deposition station; measuring one or more process parameters, wherein the measuring of the one or more parameters include transmitting the one or more parameters to the controller; and receiving the transmitted parameters at the controller, and maintaining, via the controller, the deposition based on the transmitted parameters.

In some embodiments, the solvent-flow system and process circulate the carbon-bearing molten solvent from the diamond-deposition station back to the carbon-addition station.

In some embodiments, the carbon-bearing molten solvent includes one or more Group I alkali metals. In some embodiments, the solvent includes sodium. In some embodiments, the solvent is sodium.

In some embodiments, the diamond-deposition station and process are configured to deposit carbon epitaxially on a diamond substrate or diamond seeds. In other embodiments, the diamond-deposition station and process are configured for heteroepitaxial deposition onto a non-diamond substrate.

In some embodiments, the one or more process parameters that are measured include a first temperature associated with a first location in the diamond-deposition station and a second temperature associated with a separate second location in the diamond-deposition station, wherein the second temperature is cooler than the first temperature such that a temperature gradient and a carbon-concentration gradient form between and the first and second locations in the diamond-deposition station, and wherein the controller controls the temperature gradient such that the diamond deposition at the diamond-deposition station occurs at both the first and second locations. In some embodiments, the diamond-deposition station is configured to create a temperature gradient in the diamond-deposition station in order that diamond is deposited at each temperature and at the reducing concentration of carbon.

In some embodiments, the one or more process parameters include a flow rate of the carbon-bearing molten solvent, and the controller controls the flow rate such that the deposition at the diamond-deposition station occurs at a plurality of separated locations in the flowing solvent.

In some embodiments, the one or more seed diamonds are suspended within the carbon-bearing molten solvent at the diamond-deposition station in a fluidized-bed configuration by controlling solvent velocity in a solvent-flow channel. In some such embodiments, the solvent-velocity control includes changing a cross-sectional area of the solvent-flow channel as a function of vertical position along the solvent-flow channel.

BRIEF DESCRIPTION OF THE DRAWINGS

FIG. 1B is a table comparing the physical properties of the Group I Alkali Metals with the physical properties of diamond and graphite.

FIG. 1C is a table that provides the physical properties of a plurality of carbon-dissolving low-melting-point salts and a plurality of inclusion compounds.

FIG. 1E is a conceptual graph of graphite-carbon solubility and diamond-carbon solubility in sodium versus temperature, showing a temperature cycle for circulating solvent according to some embodiments of the invention.

FIG. 2E is a perspective schematic diagram of a fluidized-bed liquid-solvent diamond-deposition system 203A using thermal-gradient-driven flow with a solvent that is less dense than the diamonds being grown.

FIG. 2F is a perspective schematic diagram of a fluidized-bed liquid-solvent diamond-deposition system 203B using thermal-gradient-driven flow with a solvent that is more dense than the diamonds being grown.

FIG. 2G is a perspective schematic diagram of a spiral-flow liquid-solvent diamond-deposition system 204 using pump-driven flow with a solvent that is less dense than the diamonds being grown.

FIG. 3A is a vertical cross-sectional block diagram of a fluidized-bed liquid-solvent diamond-deposition station 310, wherein the station has a cone-frustum shape having a trapezoidal cross section.

FIG. 3B is a vertical cross-sectional block diagram of a fluidized-bed liquid-solvent diamond-deposition station 311, wherein the station is substantially similar to the station illustrated in FIG. 3A except that the station 311 has a funnel-like shape whose cross section has convex interior sides, rather than a trapezoidal shape.

FIG. 3C is a vertical cross-sectional block diagram of a fluidized-bed liquid-solvent diamond-deposition station 312, wherein the station is substantially similar to the station illustrated in FIG. 3A except that the station 312 has a funnel-like shape whose cross section has concave interior sides, rather than trapezoidal shape.

FIG. 3D is a perspective schematic representation of a fluidized-bed liquid-solvent diamond-deposition station 311A, wherein the station has a vertical cross section as shown in FIG. 3B, and is oval or circularly symmetric in horizontal cross section.

FIG. 3E is a perspective schematic representation of a fluidized-bed liquid-solvent diamond-deposition station 311B, wherein the station has a vertical cross section as shown in FIG. 3B, but is rectangular in horizontal cross section, with substantially parallel front and back walls.

FIG. 3F is a vertical cross-sectional block diagram of a downward-flow fluidized-bed liquid-solvent diamond-deposition station 340, wherein the station 340 has a cone-frustum shape having a trapezoidal cross section similar to station 310 of FIG. 3A, except upside down in order to accommodate solvents that are more dense than the diamond crystals.

FIG. 3G is a vertical cross-sectional block diagram of a downward-flow fluidized-bed liquid-solvent diamond-deposition station 341, wherein the station 341 has a funnel-like shape whose cross section has convex interior sides, similar to station 311 of FIG. 3B, except upside down in order to accommodate solvents that are more dense than the diamond crystals.

FIG. 3H is a vertical cross-sectional block diagram of a downward-flow fluidized-bed liquid-solvent diamond-deposition station 342, wherein the station 342 has a funnel-like shape whose cross section has concave interior sides similar to station 312 of FIG. 3C, except upside down in order to accommodate solvents that are more dense than the diamond crystals.

FIG. 3I is a perspective schematic representation of a fluidized-bed liquid-solvent diamond-deposition station 341A, wherein the station has a vertical cross section as shown in FIG. 3G, and is oval or circularly symmetric in horizontal cross section.

FIG. 3J is a perspective schematic representation of a fluidized-bed liquid-solvent diamond-deposition station 341B, wherein the station has a vertical cross section as shown in FIG. 3G, but is rectangular in horizontal cross section, with substantially parallel front and back walls.

DETAILED DESCRIPTION OF THE INVENTION

Figure 1A:
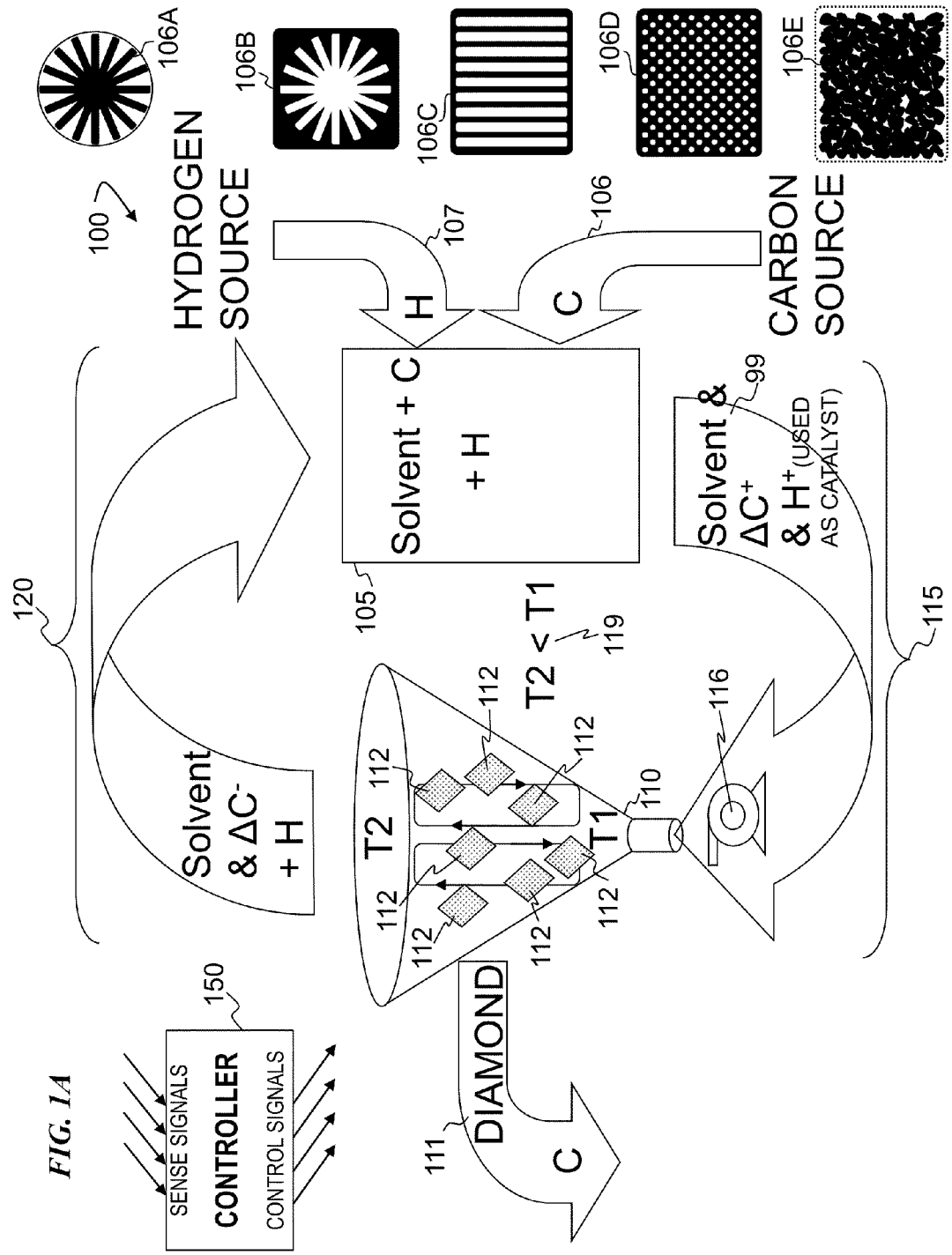
FIG. 1A is a schematic flowchart 100 representing one embodiment of a liquid-solvent diamond-deposition system.

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

The present invention is directed to the deposition of diamond material on one or more seed surfaces using a liquid solvent. While the process may also be called "diamond synthesis," the material deposited and the resulting crystals are carbon diamonds and not a synthetic stone of some other material, thus the term "diamond deposition" is preferred. In some embodiments, the deposition is additive to a diamond seed crystal, and substantially maintains the same crystal structure as the starting seed. This type of deposition, i.e., the growth on a monocrystalline substrate of a crystalline substance that forms substantially the same lattice structure and orientation of the substrate, is known as epitaxial deposition. A monocrystalline substrate is a crystalline solid in which the crystal lattice of the entire sample is continuous and unbroken to the edges of the sample, with no grain boundaries. A polycrystalline material has a plurality of crystals of differing orientations that are separated by grain boundaries. An amorphous substrate, on the other hand, has no long-range order of the positions of the atoms. In contrast to epitaxial deposition, other types of deposition methods deposit polycrystalline or amorphous layers.

Where the crystalline substance growing epitaxially on the monocrystalline substrate is made of the same material as the monocrystalline substrate, the deposition is referred to as homoepitaxial deposition. Where a crystalline substance epitaxially grows on a crystalline substrate made of a different material than the crystalline substance (which works well only when that grown substance has a crystalline structure substantially similar to the substrate), the deposition is known as heteroepitaxial deposition. In some embodiments, the present invention provides a method and apparatus for epitaxial deposition of diamond material on one or more seed surfaces using a liquid solvent. In some embodiments of each system and method described herein, whenever epitaxial growth is discussed, some embodiments of the present invention use homoepitaxial deposition (deposition of diamond crystal onto diamond seed material), and other embodiments use heteroepitaxial deposition (deposition of diamond crystal onto substrate material other than diamond).

In some embodiments, the present invention is used to form gem-quality single-crystal diamonds of large size (e.g., in some embodiments, more than on carat (wherein one carat equals 0.2 grams), while in other embodiments, single-crystal diamonds of more than about 2 carats, more than about 3 carats, more than about 4 carats, more than about 5 carats, more than about 6 carats, more than about 7 carats, more than about 8 carats, more than about 9 carats, or more than 10 carats are formed).

In some embodiments, the present invention provides an apparatus for growing diamond crystal, the apparatus comprising a carbon-addition station; a diamond-deposition station; and a solvent-flow system configured to flow a carbon-bearing molten-alkali-metal solvent used to carry carbon from the carbon-addition station to the diamond-deposition station, wherein epitaxial deposition of the carbon onto one or more seed diamonds occurs at the diamond-deposition station.

In some embodiments, the present invention provides a method for growing diamond crystal, the method comprising providing a carbon-addition station; providing a diamond-deposition station; and flowing a carbon-bearing molten-alkali-metal solvent used to carry carbon from the carbon-addition station to the diamond-deposition station, wherein epitaxial deposition of the carbon onto one or more seed diamonds occurs at the diamond-deposition station. In some embodiments, the solvent includes one or more alkali metals, such as sodium. In some embodiments, the solvent includes a eutectic mixture of two or more alkali metals. In some embodiments, the solvent includes a eutectic mixture of sodium and potassium.

In some embodiments, the carbon-addition stations 105 or 205 in the various figures (also called carbon-dissolving stations or carbon-dissolution stations) are configured to dissolve carbon from a solid source of carbon. In some embodiments, the carbon-addition station is configured to add carbon to a molten solvent from a gaseous source of carbon at the carbon-addition station. In some embodiments, the carbon-addition station is configured to add carbon from a hydrocarbon.

Due to the fluidized bed used in some embodiments, a large number of the above-mentioned large diamonds can be formed simultaneously (e.g., in some embodiments, 10 or more seeds, while in other embodiments, 20 or more seeds, 50 or more seeds, 100 or more seeds, 200 or more seeds, 500 or more seeds, or even 1000 or more seeds can be deposited with sufficient diamond to each form gem-quality stones) in each of one or more diamond-deposition stations 110 (see FIG. 1A—in some embodiments, such diamond-deposition stations can also be called carbon-deposition stations, carbon-sink stations, diamond-formation stations or diamond-synthesis stations) that are supplied with carbon-bearing liquid solvent 99 within a system 100 as generally described in FIG. 1A and the other systems described herein.

In some embodiments, a plurality of diamond-deposition stations operate in parallel and are fed carbon-bearing molten solvent from a single solvent stream from one or more carbon-addition stations. In other embodiments, a plurality of deposition stations are connected in series, wherein the solvent 99, partially depleted of its initial carbon content, from the first deposition station is input to the next station in the series, and so on for further stations, and wherein each station in the series is at a lower range of temperatures than the range of temperatures used in the previous deposition station. In still other embodiments, each of a plurality of deposition stations are connected in series in each of a plurality of strings of deposition stations, and wherein the strings are connected in parallel to one another.

In some embodiments, because each growing diamond seed in a batch is supported in a freely moving state by the flowing solvent 99, diamond crystal is deposited on all faces of the diamonds as they grow. In some embodiments, this diamond growth on all faces of the diamonds is facilitated by suspending the diamonds that are being grown in a flow of the solvent (i.e., wherein the diamonds are suspended (held up) in upward-flowing solvent (if the diamonds are more dense than the solvent, which is the case for a sodium solvent) in which the diamonds would otherwise sink, and are suspended (held down) in downward-flowing solvent (if the diamonds are less dense than the solvent, which is the case for a lead solvent) in which the diamonds would otherwise float).

In some embodiments, the number of seeds in the fluidized bed is kept reasonably low, in order to prevent undue abrasion of the seeds against one another. Further, since, in some embodiments, different-sized diamonds will tend to drift within the fluidized bed to a level having substantially like-sized diamonds, and since each level will tend to have a carbon-concentration level and a carbon-concentration-rate-of-change value in the solvent 99 that differs from other levels, the rates of deposition can be adjusted (e.g., by controlling the carbon-saturation levels throughout the diamond-deposition station by controlling the temperatures and rate of temperature change through the diamond-deposition station) to be toward an optimal rate for each size of diamond as they grow from seed-sized to harvest-sized diamonds).

In other embodiments, the diamond-deposition processes described herein are used to deposit additional diamond material to a diamond or diamond-like carbon (DLC) seed material deposited on a non-diamond substrate that starts in wafer form, such as a silicon wafer (wherein the resulting wafer-shaped diamond surface is suitable for use in the semiconductor art, such as for transistor switches or light-emitting devices) or onto other substrate shapes, such as saw blades or other cutting tools or pieces used as the edges of such cutting tools, or other surfaces, such as pistons and/or cylinders, that slide across one another and benefit from protection against wear (in some embodiments, a diamond film formed (e.g., by CVD) on a substrate of another material acts as the seed). In some embodiments, a plurality of wafers are placed in the solvent stream in the diamond-deposition station 110 (e.g., a plurality of wafers spaced side-by-side (i.e., in parallel) with solvent flowing between the wafers, and/or placed serially in the stream such that solvent having flowed across one of the wafers then flows across another of the wafers), each wafer having a starting seed layer of diamond deposited on a surface of the wafer, such that the flowing solution of the present invention deposits additional diamond on that surface (e.g., increases the thickness of the diamond layer).

In some such embodiments, the relatively low temperatures (e.g., about 700 to about 1000° C., in some embodiments) and relatively low pressures (e.g., about one to about ten atmospheres, in some embodiments) provide advantages (such as avoiding changes to crystal structure due to heating cycles, and the ability to handle larger workpieces) not possible or not as easily accomplished using conventional HTHP (high-temperature, high-pressure) diamond processes, since the surface area and volume of the HTHP diamond-growth chamber must be kept small to achieve the required pressures. In addition, some embodiments of the present invention provide higher growth rates than provided by conventional CVD (chemical vapor deposition) diamond techniques.

FIG. 1A is a schematic flowchart representing a liquid-solvent diamond-deposition system 100. In some embodiments, system 100 (which schematically represents some embodiments of any of the other systems and processors described herein) includes a carbon-bearing solvent 99 flowing through a carbon-addition (carbon-source) station 105 where solvent 99 acquires carbon (from a gas (such as acetylene or methane) and/or by dissolving a solid source of carbon such as graphite) to become a higher-carbon-amount solvent stream 115, then through a diamond-deposition (carbon-sink) station 110 where solvent 99 deposits carbon in diamond-allotrope crystal structure on seeds and thus becomes a lower-carbon-amount solvent stream 120.

In some embodiments, a temperature gradient 119 is applied to system 100 (i.e., in some embodiments, the lower portion of carbon-deposition station 110 (i.e., the solvent-entry end) is hotter than the upper portion of diamond-deposition station 110 (i.e., the solvent-exit end)) such that carbon from a carbon source 106 dissolves into solvent 99 (e.g., a molten liquid metal such as sodium or a sodium-potassium solution or other suitable liquid solvent) at the carbon-addition station 105 and carbon leaves the solvent 99 and deposits in diamond-crystal crystal structure onto one or more seed diamonds 112 (using homoepitaxial deposition) at diamond-deposition station 110.

At each location in the path of the flowing solvent 99, the solvent 99 will have a carbon content or concentration. If the temperature of the solvent is below a saturation temperature for the given carbon concentration (or equivalently, if the carbon concentration is above the saturation concentration for a given temperature), carbon will precipitate or deposit from the solution. If the temperature of the solvent is above a saturation temperature for the given carbon concentration (or equivalently, if the carbon concentration is below the saturation concentration for a given temperature), carbon will dissolve from a solid source of carbon into the solution. It is believed that the saturation concentration of carbon in the solvent is different for carbon in a diamond structure as opposed to carbon in a graphite structure. In particular, it is believed that the saturation concentration of carbon relative to diamond is about two times the saturation concentration of carbon relative to graphite for most temperatures used for depositing diamond according to the present invention, however the present invention is not limited to this relationship. Thus, in some embodiments, when the solvent 99 leaves the carbon-addition station at a given highest dissolving temperature and being substantially saturated with carbon relative to dissolving graphite, it will contain only about half the concentration of carbon needed to deposit diamond, and thus its temperature must be dropped to a temperature that is below the saturation temperature needed to deposit diamond (the temperature drop needed (for a given carbon concentration, the difference between the saturation temperature relative to graphite and the saturation temperature relative to diamond) is typically between about 50 Kelvin and 80 Kelvin at standard atmospheric pressure, as discussed elsewhere herein). In some embodiments, before it reaches the diamond seeds, the solvent 99 is cooled to a temperature at least low enough that, based on the carbon content of the solvent at that location, the solvent will not dissolve or otherwise reduce the diamond mass of the diamond seeds, and preferably to a temperature that will cause diamond to deposit on the seed(s).

As used herein, "molten" refers to the liquid state of a substance. For example, a molten metal is a metal in its liquid state. In other embodiments, the diamond deposition is done using a substrate other than diamond (heteroepitaxial or other type of deposition), for example depositing diamond film (e.g., polycrystalline) on a substrate such as silicon, silicon oxide or sapphire (e.g., in some embodiments, a CVD process is used to deposit an initial layer of diamond on such a substrate, and that diamond-coated substrate is then used as a diamond seed material for the present invention, wherein additional diamond material is deposited from the molten solvent 99 onto the initial diamond layer—since the present invention, in some embodiments, can deposit diamond at a faster rate than CVD).

In some embodiments, the transfer of carbon from carbon-addition station 105 to diamond-deposition station 110 occurs due to increases and decreases in the equilibrium solubility of carbon in the solvent 99 (e.g., as a function of temperature, since carbon enters the solvent 99 due to increased solubility at higher temperatures in the carbon-addition station 105, and carbon leaves the solvent 99 due to decreasing solubility as the temperature is lowered in the diamond-deposition station 110). For example, at carbon-addition station 105, carbon from carbon source 106 will dissolve into the solvent 99 toward the carbon-saturation point of the solvent 99 (until the saturation point is reached for that temperature), based on such parameters as the temperature, the surface area of the carbon (the greater the effective surface area of carbon in the carbon-addition station 105, the faster carbon will dissolve) and velocity of the solvent 99 through the carbon-addition station 105 (in some embodiments, the slower the effective velocity of the solvent 99 past the solute in a given carbon-addition station 105 (the longer the residence time where the solvent is in contact with the solute), the more carbon will dissolve). While the solvent 99 may not become fully saturated relative to the temperature in the carbon-addition station 105, enough carbon will dissolve such that when the temperature is then reduced, the saturation point of carbon in the solvent 99 relative to the temperature will be reached. In some embodiments, the carbon-concentration-saturation point of carbon from a graphite source is lower than the carbon concentration needed to deposit diamond, and thus the temperature of solvent 99 is lowered such that the carbon concentration level relative to temperature is high enough to deposit diamond.

In some embodiments, a solvent 99 having a temperature and carbon concentration level that is saturated relative to dissolving graphite at that temperature must have its temperature reduced by about 50 to 60 degrees Celsius in order to be able to deposit carbon as diamond. (Such a solvent is even more supersaturated relative to deposition of carbon as graphite, so solvent 99 is removed from carbon-addition station 105 and contact with other items or materials that could act as seeds for deposition of graphite is avoided until after solvent 99 leaves the diamond-deposition station 110.) When the saturated solvent 99 reaches the diamond-deposition station 110 and the temperature of the solvent 99 is then further reduced, the solubility of carbon in the solvent 99 further decreases causing carbon to leave the solvent 99 (because the solution has become supersaturated relative to the level needed for deposition of carbon as diamond) and deposit on the diamond seeds at a rate based on temperature (the lower the temperature in the diamond-deposition station 110, the more carbon will deposit, however at too low a temperature the carbon will deposit at a rate too rapid for epitaxial growth and that surplus carbon will leave the solvent (e.g., precipitate) as graphite or in graphite-like deposits rather than as diamond crystal on the seed diamonds), surface area of the diamond seeds in contact with the moving solvent 99 (the greater the effective surface area of diamond seed in the diamond-deposition station 110, the more diamond will deposit, however using a large number of very tiny diamond seeds (thus having a large surface area) will result in about that number of relatively small diamonds and a relatively large total mass of diamond, however a smaller number of larger seeds may result in larger diamonds, even though a smaller total mass of diamond may be deposited) and velocity of the solvent 99 through the diamond-deposition station 110 (the slower the effective velocity of the solvent 99 in the diamond-deposition station 110, the more diamond will deposit for a given volume of solvent 99, however diamond will deposit at a faster rate if a sufficient amount of high-carbon solvent 99 is continually provided). Of course, if the velocity of solvent 99 through the diamond-deposition station 110 is slowed to zero, the saturation point of the solvent 99 at the temperature of a given location in the diamond-deposition station 110 may be closely approached, but the rate of deposition slows as more carbon is removed and solvent 99 gets closer to the saturation point, and thus some embodiments of the present invention progressively cool the solvent 99 as its carbon content is depleted, in order to maintain the solvent 99 in a supersaturated condition.

Figure 1D:
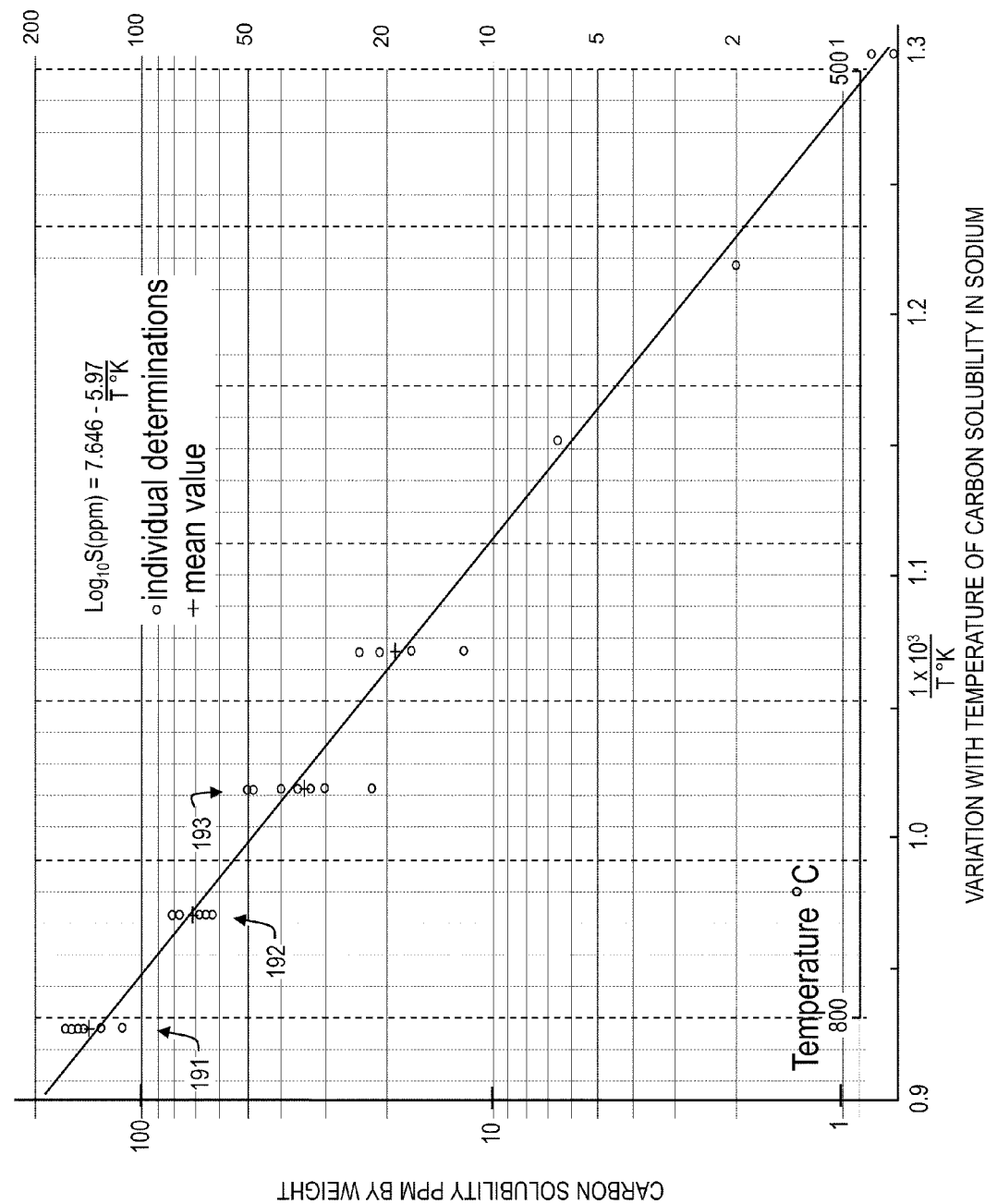
FIG. 1D is a graph of carbon solubility in sodium versus temperature.

Prior-art FIG. 1D, which is taken from an article by R. Ainsley, Linda P. Hartlib, P. M. Holroyd and G. Long, titled "The Solubility of Carbon in Sodium", Journal of Nuclear Materials 52 (1974) 255-276, illustrates how the solubility of carbon in sodium decreases as temperature decreases. Importantly, in some embodiments, when the solvent is supersaturated with carbon solute relative to the solubility of diamond in the solvent, the solute carbon that comes out of solution solvent 99 at station 110 epitaxially crystallizes in diamond-crystal structure on seed diamonds 112, as opposed to depositing, or precipitating in graphite form. In some embodiments, things that could act as seeds for graphite deposition are eliminated from the vicinity of the diamond seeds, such that any carbon coming out of solution deposits as diamond on the diamond seeds, and not as graphite. In some embodiments, factors like flow rate of solvent 99, temperatures of solvent 99, and the use of catalysts (e.g., the amount of hydrogen from hydrogen source 107) are carefully controlled to an optimum parameter value of each, such that the carbon leaving the solvent 99 at station 110 favors organizing as a diamond crystal.

A paper by Rossini, Frederick D.; Jessup, Ralph S., "Heat and free energy of formation of carbon dioxide, and of the transition between graphite and diamond," in J. Research Natl. Bur. Standards (1938), 21, pp 491-513 (Research Paper No. 1141) is incorporated herein by reference. Rossini et al. reviewed the existing data on the entropies of $O_2$, $CO_2$, graphite and diamond, and those on the heats of combustion of natural and artificial graphite and of diamond. The Rossini et al. thermochemical data were combined with values of the entropies to obtain values for the heat and free energy of formation of $CO_2$, and for the transition between graphite and diamond.

For C(c, graphite)+$O_2$(g)=$CO_2$(g), at 25°, per mol., $$\Delta H = -393{,}355 \pm 46 \text{ NBS international joules, or } -94{,}030 \pm 11 \text{ cal.} \quad (1)$$

$$\Delta F° = -394{,}228 \pm 58 \text{ NBS international joules, or } -94{,}239 \pm 14 \text{ cal.} \quad (2)$$

For C(c, graphite)=C(c, diamond), at 25° C. and pressure of 1 atmospheric, $$\Delta H = 1899 \pm 124 \text{ joules, or } 454 \pm 30 \text{ cal.} \quad (3)$$

$$\Delta F = 2872 \pm 129 \text{ joules, or } 686 \pm 31 \text{ cal.} \quad (4)$$

For this transition, the following Equation (5) was derived, with some approximations, for the range 273° to 1400° K., (0° to 1127° C.) and pressures of 0 to 20,000 atmospheric:

$$\Delta F = 541.82 + 6700/T + 1.17662T \log 10T - 2.43723T - 0.000221T^2 - (0.045660 + 0.91236 \times 10^{-6} T - 0.7830 \times 10 - 10T^2 - 0.3623 \times 10 - 12T^3)P + 0.19 \times 10^{-6} P^2 \text{ cal./mol.} \quad (5)$$

(Conversion factor from NBS international cal. to joules is 4.1833.) (6)

Table 1 shows an approximation, derived from an assumed extension (wherein, in particular, the values in Table 1 shown in italics (those for temperatures above about 1103 Kelvin or 830° Celsius) are in the assumed extension) of the data of FIG. 1D from Ainsley et al., of the solubility limit for carbon from a graphite source (the column labeled "graphite limit=$X_{GL}$"). Table 1 also shows an approximation, derived from an assumed extension of Brinkman et al. (U.S. Pat. No. 3,142,539), of the solubility limit for carbon from (or to) a diamond source (the column labeled "diamond limit=$X_{DL}$") wherein $$X_{DL} = X_{GL} \exp(\Delta G/NkT), \quad (7)$$

wherein $\Delta G$ is the Gibbs free energy (called $\Delta F$ in Equation (5)), and is calculated from Equations (5) and (6), assuming a pressure P=1 (one atmosphere) and various temperatures T measured in Kelvin, N is Avogadro's number, k is Boltzman's constant, and exp( ) is the exponential function. In some embodiments, the present invention uses a pressure of one atmosphere, while in other embodiments, higher pressures are used to keep the solvent from boiling, and the data in Table 1 and FIG. 1E are recalculated for those pressures. The value for Average $X_{DL}$ Change PPM/degree (column 8 of Table 1) is an average for a twenty-Kelvin range centered at the temperature listed at each row; this average is calculated by subtracting the $X_{DL}$ in PPM number in column 6 for ten degrees lower (one row down) from the $X_{DL}$ in PPM number in column 6 for ten degrees higher (one row up). For example, the 7.3 PPM/degree value shown in the row for 1173 Kelvin is obtained by the quotient (817−670)/(1183−1163)=147/20=7.35. The values in the column $(1-X_{DL})/(1-X_{GL})$ show that this factor is substantially equal to one for this range, and thus is assumed to be one for the other calculations.

TABLE 1

Calculated solubility limits of carbon in sodium

| K Kelvin | 1000/K. 1000/deg Kelvin | °C. Degrees Celsius | PPM Carbon graphite sol. limit = $X_{GL}$ | $X_{DL}/X_{GL}$ = exp($\Delta$G/NkT) | PPM Carbon diamond sol. limit = $X_{DL}$ | (1-$X_{DL}$)/ (1-$X_{GL}$) | Average $X_{DL}$ Change PPM/degree |
|---|---|---|---|---|---|---|---|
| 1273 | 0.7855 | 1000 | 930 | 1.988281 | 1849 | 1.000932 | |
| 1263 | 0.7918 | 990 | 850 | 1.988281 | 1690 | 1.000851 | 15.1 |
| 1253 | 0.7981 | 980 | 777 | 1.989921 | 1546 | 1.000778 | 13.8 |
| 1243 | 0.8045 | 970 | 710 | 1.991587 | 1414 | 1.000711 | 12.5 |
| 1233 | 0.8110 | 960 | 650 | 1.993279 | 1296 | 1.000651 | 11.4 |
| 1223 | 0.8177 | 950 | 594 | 1.994999 | 1185 | 1.000595 | 10.5 |
| 1213 | 0.8244 | 940 | 544 | 1.996747 | 1086 | 1.000545 | 9.8 |
| 1203 | 0.8313 | 930 | 495 | 1.998524 | 989 | 1.000495 | 9.5 |
| 1193 | 0.8382 | 920 | 448 | 2.000333 | 896 | 1.000448 | 8.6 |
| 1183 | 0.8453 | 910 | 408 | 2.002173 | 817 | 1.000408 | 7.7 |
| 1173 | 0.8525 | 900 | 370 | 2.004045 | 741 | 1.000370 | 7.3 |
| 1163 | 0.8598 | 890 | 334 | 2.005952 | 670 | 1.000334 | 6.8 |
| 1153 | 0.8673 | 880 | 302 | 2.007895 | 606 | 1.000302 | 6.3 |
| 1143 | 0.8749 | 870 | 271 | 2.009874 | 545 | 1.000271 | 5.8 |
| 1133 | 0.8826 | 860 | 244 | 2.011892 | 491 | 1.000244 | 5.2 |
| 1123 | 0.8905 | 850 | 219 | 2.013949 | 441 | 1.000219 | 4.8 |
| 1113 | 0.8985 | 840 | 196 | 2.016047 | 395 | 1.000196 | 4.4 |
| 1103 | 0.9066 | 830 | 175 | 2.018189 | 353 | 1.000175 | 4.0 |
| 1093 | 0.9149 | 820 | 156 | 2.020374 | 315 | 1.000156 | 3.6 |
| 1083 | 0.9234 | 810 | 139 | 2.022606 | 281 | 1.000139 | 3.2 |
| 1073 | 0.9320 | 800 | 124 | 2.024885 | 251 | 1.000124 | 3.0 |
| 1063 | 0.9407 | 790 | 109 | 2.027215 | 221 | 1.000109 | 2.8 |
| 1053 | 0.9497 | 780 | 96 | 2.029596 | 195 | 1.000096 | 2.4 |
| 1043 | 0.9588 | 770 | 85 | 2.032032 | 173 | 1.000085 | 2.1 |
| 1033 | 0.9681 | 760 | 75 | 2.034523 | 153 | 1.000075 | 1.9 |
| 1023 | 0.9775 | 750 | 66 | 2.037073 | 134 | 1.000066 | 1.8 |
| 1013 | 0.9872 | 740 | 57 | 2.039683 | 116 | 1.000057 | 1.6 |
| 1003 | 0.9970 | 730 | 50 | 2.042357 | 102 | 1.000050 | 1.4 |
| 993 | 1.0070 | 720 | 43.5 | 2.045096 | 89 | 1.000044 | 1.2 |
| 983 | 1.0173 | 710 | 38 | 2.047904 | 78 | 1.000038 | 1.1 |
| 973 | 1.0277 | 700 | 32.7 | 2.050784 | 67 | 1.000033 | 1.0 |
| 963 | 1.0384 | 690 | 28 | 2.053738 | 58 | 1.000028 | 0.9 |
| 953 | 1.0493 | 680 | 24.3 | 2.056769 | 50 | 1.000024 | |

FIG. 1E is a conceptual graph 180 (a conceptual graph being a graph showing the concept of the present invention, wherein many of the values are assumed or calculated, and in some embodiments, the carbon solubility in PPM for each temperature need not be measured or precisely determined, but will be replaced by readily obtained empirical measurements if need be, as described elsewhere herein) of graphite-carbon solubility $X_{GL}$ (line 181) and diamond-carbon solubility $X_{DL}$ (line 182) in sodium versus temperature using the data from Table 1, and showing an example temperature cycle 185 for circulating solvent according to some embodiments of the invention. FIG. 1E also depicts data sets 191, 192, and 193, which represent the three highest-temperature sample-measurement data sets illustrated in FIG. 1D (Ainsley et al.).

In some embodiments, example temperature cycle 185 includes four "legs" 186, 187, 188, and 189. In some embodiments, cycle 185 includes a first leg 186 wherein the solvent 99 is preheated to a temperature equal to or above the temperature needed to dissolve additional carbon from a graphite source (for example, if a sodium solvent 99 already has about 116 parts per million (PPM) of carbon in the sodium, the temperature may need to be raised to at least about 795 degrees Celsius in order to dissolve additional carbon into solvent 99. Operation of the carbon-addition station 105 at temperature-relative-to-carbon-concentration points to the left of line 181 of FIG. 1E (i.e., at higher temperatures than line 181) helps ensure that the solvent is not saturated relative to graphite dissolution and thus solvent 99 at these temperatures and carbon concentrations will dissolve more carbon from the graphite source.

In this example, as shown in FIG. 1E, the temperature of solvent 99 is raised to a $T_2$ temperature of about 850 degrees Celsius (represented by the arrow of leg 187 of temperature cycle 185, wherein the solvent temperature along leg 187, which represents operation of carbon-addition station 105, for a given carbon concentration level in solvent 99 relative to graphite solubility as represented on graph 180 is at or above the saturation temperature indicated graphite-carbon solubility $X_{GL}$ line 181 along leg 187, and carbon concentration as represented on graph 180 for a given temperature is at or below graphite-carbon solubility $X_{GL}$ line 181 when dissolving graphite along leg 187). In some embodiments, at a temperature of about 850 degrees Celsius, about 219 PPM carbon can dissolve into the sodium solvent from a graphite source.

In some embodiments, the solvent then leaves carbon-addition station and is cooled (represented by leg 188 of temperature cycle 185) from temperature $T_2$ to a $T_1$ temperature wherein, relative to the concentration of carbon, the solvent 99 is supersaturated relative to the deposition of carbon as diamond (this is the region above and to the right of diamond-carbon solubility $X_{DL}$ line 182).

In some embodiments, the solvent temperature, starting from temperature $T_1$, is gradually lowered (along leg 189) inside diamond-deposition station 110 (as shown by the arrow of leg 189 of FIG. 1E) at a rate corresponding to the reduction of carbon concentration due to diamond deposition, in order to keep solvent 99 just enough supersaturated relative to the deposition of carbon as diamond to deposit carbon as diamond (i.e., barely to the right of $X_{DL}$ line 182), but not so excessively supersaturated that spontaneous precipitation as graphite is caused without the presence of graphite seed materials (such graphite seed materials and items are avoided during legs 188 and 189 to the extent possible). The low temperature $T_0$ is reached at the end of leg 189. Thus, in this example, the temperature gradient in diamond-deposition station 110 is represented by leg 189, which lowers the temperature of the solvent at a rate corresponding to the rate of diamond deposition, which equals the rate of depletion of the carbon concentration in solvent 99. This keeps the solution with a carbon concentration that is supersaturated relative to the deposition of diamond for substantially all of the length of diamond-deposition station 110.

Thus, as shown in FIG. 1E, some exemplary embodiments raise the temperature of solvent 99 to about 850 degrees Celsius before or inside carbon-addition station 105 (e.g., along or below legs 186 and/or 187 of FIG. 1E, i.e., in the region further to the left of line 181) such that the concentration of carbon reaches the carbon concentration limit relative to the dissolving of carbon from a graphite source (e.g., about 219 PPM, in some embodiments) for that temperature, then lowers the temperature (along leg 188 of FIG. 1E) to a level that is barely supersaturated relative to the deposition of carbon as diamond (about 785 degrees Celsius for 219 PPM, in some embodiments). The temperature is gradually further lowered (along leg 189 of FIG. 1E) at a temperature-drop rate corresponding to the reducing concentration of carbon in solvent 99, such that solvent 99 is kept barely supersaturated relative to the deposition-of-carbon-as-diamond level (as can be seen from operating just to the right of $X_{DL}$ line 182, in some embodiments, leg 189 would operate diamond-deposition station 110 to a temperature just below 780 degrees when the carbon concentration is 195 PPM, a temperature just below 770 degrees when the carbon concentration is 173 PPM, a temperature just below 760 degrees when the carbon concentration is 153 PPM, a temperature just below 750 degrees when the carbon concentration is 134 PPM, and a temperature just below 740 degrees when the carbon concentration is 116 PPM). In some embodiments, the present invention is not operated below approximately 700 degrees C. (represented by arrow-line 195), in order to avoid solidification of sodium carbide that may occur below this temperature.

In some embodiments (see Table 1), the calculated approximate average rate of change in $X_{DL}$ (PPM per degree Celsius) for various twenty-degree ranges that are centered every ten degrees (this average rate is calculated from concentrations at plus ten degrees to minus ten degrees from each value) are approximately as follows:
4.8 PPM per degree at about 850 degrees Celsius, 4.4 PPM/degree at about 840 degrees Celsius,
4 PPM/degree at about 830 degrees Celsius, 3.6 PPM/degree at about 820 degrees Celsius,
3.2 PPM/degree at about 810 degrees Celsius, 3 PPM/degree at about 800 degrees Celsius,
2.8 PPM/degree at about 790 degrees Celsius, 2.4 PPM/degree at about 780 degrees Celsius,
2.1 PPM/degree at about 770 degrees Celsius, 1.9 PPM/degree at about 760 degrees Celsius,
1.8 PPM/degree at about 750 degrees Celsius, 1.6 PPM/degree at about 740 degrees Celsius,
1.4 PPM/degree at about 730 degrees Celsius, 1.2 PPM/degree at about 720 degrees Celsius,
1.1 PPM/degree at about 710 degrees Celsius, and 1.0 PPM per degree at about 700 degrees Celsius (note that each of these values for rates of solubility change are calculated from assumed values of $X_{DL}$, which are each about twice the values and twice the rates of change as for $X_{GL}$ at the same temperatures). Thus, in some embodiments, the temperature is lowered at a rate (degrees per PPM, which is the inverse of PPM per degree) corresponding to the decrease in carbon concentration. In some embodiments, the flow velocity of solvent 99 or the coolant 98 or both are adjusted by varying the cross-sectional area of the passages through which they flow. Since the above example temperatures and concentrations are calculations based on certain assumptions, some embodiments perform empirical measurements to determine an optimal rate of temperature drop to correspond to the rate of decrease in carbon concentration. In some embodiments, a counter-flow direction of coolant flow is provided on each of two opposing faces of the deposition chamber, wherein the width of the chamber (measured perpendicular to both a normal vector of the faces and to the direction of flow of solvent 99 (e.g., measured horizontal and parallel to the faces for vertically flowing solvent) is adjusted and/or varied (to adjust the flow velocity of solvent 99 along its path through diamond-deposition station 110 by varying the cross-sectional area of the flow path) such that diamond is deposited, the diamond seeds at any level or temperature do not dissolve, and no undesirable graphite is formed in the chamber of diamond-deposition station 110.

In some embodiments, temperature cycling is performed along temperature and/or concentration gradients that differ from legs 186, 187, 188, and 189 of FIG. 1E, and thus use temperatures $T_2$, $T_1$, and $T_0$ that are higher or lower than the values in the example of FIG. 1E. Also note that, in some embodiments, maintaining a decreasing temperature gradient in diamond-deposition station 110 that matches the rate of depletion of carbon from solvent 99 (e.g., by diamond deposition) can be considered to be the same as maintaining a decreasing carbon concentration that matches the rate of temperature drop in diamond-deposition station 110.

In some embodiments, diamond deposition continues until diamonds with the desired size are created. In some embodiments, a controller 150 senses various parameters and automatically controls (using look-up tables (e.g., one or more tables containing control parameters that are looked up based on the sensed signals) or feedback circuits or the like) a plurality of parameters of system 100 (e.g., gas pressure above solvent 99 (e.g., enough pressure to keep the solution from boiling), flow rates of solvent 99, various temperatures, and other similar parameters) such that optimal conditions for diamond deposition exist. In some embodiments, the controller 150 receives a plurality of sensor signals from locations throughout system 100, processes those signals, and then outputs the necessary control signals to keep diamond deposition performing optimally. In some embodiments, grown diamonds are removed from diamond-deposition station 110 via diamond-retrieval port 111.

In some embodiments, port 111 includes a glove box that includes its own inert gas source (e.g., helium, argon or the like) and a getter (e.g., a zirconium getter) for purging/filtering out any unwanted contaminants such as oxygen or nitrogen from port 111 prior to moving finished diamonds into port 111. In some such embodiments, the glove box has storage facilities for holding a plurality of seed-diamond loads and a plurality of grown-diamond loads, in order that a plurality of diamond-deposition runs may be processed without having to open the interior portions of the conduit of system 100 and diamond-deposition station 110 to the external atmosphere, thus reducing the amount of purging and cleaning of those interior portions of system 100.

In some embodiments, carbon source 106 includes one or more solid pieces of graphite. In some embodiments, carbon source 106 includes one or pieces of high-carbon steel (e.g., a solid mixture of iron and optionally other metals), wherein the carbon in the steel will leave the steel to go into solution into the sodium (or other metal) solvent 99. In some such embodiments, a high-carbon steel source provides a high-purity carbon solute from which carbon can dissolve into molten sodium. In some embodiments, carbon source 106 includes a gaseous hydrocarbon. In some embodiments, carbon source 106 uses solid carbon that is configured such that carbon source 106 has the maximum surface area that is reasonably attainable given the physical constraints of system 100 (e.g., in some embodiments, carbon source 106 has a large surface area, but it still fits inside station 105 such that the flow of solvent 99 through station 105 is not significantly slowed). Carbon sources 106A-106E are top-view cross-section representations of various embodiments that can be used for carbon source 106. In some embodiments, carbon source 106 includes a star-shaped piece of carbon as depicted by element 106A that fits in a cylindrically-shaped carbon-addition station 105. In some embodiments, carbon source 106 includes a piece of carbon having a star-shaped flow-through opening as depicted by element 106B. In some embodiments, carbon source 106 includes a piece of carbon having slit-like flow-through openings as depicted by element 106C. In some embodiments, carbon source 106 includes a piece of carbon having cylindrical flow-through openings (e.g., in some embodiments, drilled holes) as depicted by element 106D. In some embodiments, carbon source 106 includes a plurality of carbon spears. In some embodiments, carbon source 106 includes chunks, granules, or other suitably sized pieces of carbon held in a flow-through cage such that the pieces cannot escape carbon-addition station 105, as depicted by assembly 106E.

In some embodiments (see FIG. 2B), temperature gradient 119 (with or without assistance by pump 116 (or 216 of FIG. 2B)) causes the solvent 99 to flow in an upward direction through carbon-addition station 105 and in a downward direction through diamond-deposition station 110 (a counter-clockwise direction in FIG. 1A) by convection due to the less-dense hotter solvent 99 rising up through hotter carbon-addition station 105 and the more-dense cooler solvent 99 sinking down through the cooler diamond-deposition station 110. In other embodiments, system 100 is configured such that pump 116, or some other force, causes the solvent 99 to flow in a downward direction through carbon-addition station 105 and in an upward direction through diamond-deposition station 110 (a clockwise direction in FIG. 1A, which is counter to a normal convection flow). In some embodiments, temperature gradient 119 is applied by adding heat in or near carbon-addition station 105 and by removing heat in diamond-deposition station 110. In some embodiments, the solvent 99 is heated before it enters carbon-addition station 105 in order that it can dissolve as much carbon as possible, and is cooled before it enters diamond-deposition station 110 in order that it can deposit as much diamond in the desired locations and in the desired crystal configuration (e.g., symmetrically on the diamond seeds) as possible.

In some embodiments, control of the amount of carbon placed into solution in solvent 99 is controlled by the flow rate of solvent 99 (faster flow rate lowers the residency time, reducing the amount of carbon dissolved at a given temperature of solvent), by the temperature (at a given temperature, the solvent will dissolve an amount of carbon that closely approaches the saturation amount if enough surface area and residency time are provided), and/or the surface area of the carbon solute (a very long path through the carbon-addition station 105 and/or a high surface area of contact allows the amount of dissolved carbon to closely approach the saturation amount). In some embodiments, the temperature of the solvent is set to a value just above the saturation temperature (relative to graphite solubility) for the desired amount of carbon in solvent 99 (e.g., if 100 PPM of carbon is desired and the saturation temperature for that amount of carbon is 785 degrees Celsius, the temperature might be set to 786 degrees Celsius and the surface area of the carbon solute and the residency time would be set sufficiently high such that 100 PPM carbon was put into solution. In some such embodiments, an empirical determination of how much carbon will dissolve at a given flow rate through a given carbon-addition station 105 (with its given surface area). Such a method allows relatively precise control of the amount of carbon and the temperature of the solvent 99 without having to sense the carbon concentration in real time. Since introducing solvent 99 into diamond-deposition station 110 when it is much above its saturation temperature may dissolve the diamond seeds, and cooling solvent 99 too much before it reaches diamond-deposition station 110 is likely to undesirably precipitate carbon or deposit carbon in the conduit or other location other than the diamond seeds, it is desirable to have solvent 99 at its saturation temperature (relative to diamond solubility) as it enters diamond-deposition station 110 and then to lower the temperature to just below the saturation temperature at each successive location across a temperature gradient in diamond-deposition station 110.

In some embodiments, the temperature gradient and the flow rate through diamond-deposition station 110 are empirically determined by performing a test run of saturated solvent 99 through a diamond-deposition station 110 having a given flow rate and temperature gradient (the maximum temperature, minimum temperature and rate of temperature drop per distance), and measuring the amount of diamond growth (or loss of seed diamond by dissolving) and/or of amorphous carbon deposition or precipitating at each of a plurality of locations in diamond-deposition station 110. Based on the measurements, the flow rate and/or the temperature gradient are adjusted and further test runs are performed and their measurements taken, and the process repeated recursively until a desired set of parameters (e.g., flow rate, maximum and minimum temperature, and the sizes, lengths and/or shapes of the carbon-addition station 105 and diamond-deposition station 110) are determined.

In other embodiments, the solvent 99 is set to a moderately higher temperature than the saturation temperature for the amount of carbon in solution before or at the point it enters the carbon-addition station 105 such that it dissolves carbon at a significant rate from the first carbon-solute source it encounters (i.e., if solvent 99 enters the carbon-addition station 105 at a temperature below the saturation temperature relative to graphite dissolving for its concentration of carbon, the presence of the graphite in the carbon-addition station will act as a seed and carbon will precipitate out and deposit on the graphite rather than having the source graphite dissolve into the solvent 99 as desired), and its temperature may be increased and/or kept above its saturation temperature throughout the carbon-addition station 105 such that carbon is dissolved into the solvent to the amount desired. Since the rate of dissolving slows as the saturation temperature is reached and the rate of dissolving becomes zero at the saturation temperature, keeping the solvent temperature at least moderately above its saturation temperature helps ensure that carbon is dissolved from the carbon source even at the point the solvent leaves the carbon-addition station.

In some embodiments, a sensor 260 (see FIG. 2A) measures the carbon content of the solution of carbon in solvent 99 and controls the flow rate (e.g., by varying the speed of a pump or controlling a flow-control valve or varying, e.g., a width of a flow channel or other suitable method) and/or maximum temperature of the solvent 99 in carbon-addition station 105 such that the desired concentration of carbon can be used to set the temperatures in the temperature gradient in the diamond-deposition station 110. In some embodiments, a suitable sensor measures the carbon concentration and the controller 150 increases the flow rate, (or otherwise reduces the residency time of the solvent 99 in the presence of carbon solute) or decreases the solute temperature, or both if the concentration is too high. Conversely, controller 150 reduces the flow rate or increases the temperature if the concentration is too low. For example, the solvent leaving the carbon-addition station 105 might have e.g., about 219 parts-per-million (PPM) at 850 degrees C. (e.g., and the upper-left-hand end of arrow 187 of FIG. 1E), or 200 PPM by weight of carbon and be at about 842 degrees C. (note that at 842 degrees C. line 181 of the graph of FIG. 1E indicates a saturation carbon concentration, relative to deposition of graphite of approximately 200 PPM) in order to be capable of dissolving a sufficient amount of graphite carbon given its flow rate and residency time in the carbon-addition station 105 (wherein the saturation temperature relative to graphite dissolving in a sodium solvent with 200 PPM by weight carbon might be about 842 degrees C., assuming the data in FIG. 1E). When the solvent is at its saturation temperature relative to graphite, carbon in graphite form neither dissolves into nor deposits out of the solution.

In some embodiments, the solution (still having about 200 PPM carbon) is then cooled to about 782 degrees C. such that the solution is at about or slightly below its saturation temperature relative to deposition of carbon as diamond (i.e., about 200 PPM carbon and just under 782 degrees C., at the right-hand end of arrow 188) as it enters the diamond-deposition station (but not far below its saturation temperature relative to deposition of carbon as diamond, in order that carbon does not spontaneously precipitate graphite into the solution or deposit on the conduit between the carbon-addition station 105 and the diamond-deposition station). As the diamond is deposited, the concentration of carbon in solution decreases, so further along the flow in the diamond-deposition station, the concentration of carbon might be 173 PPM and the temperature have been dropped to 770 degrees C. (e.g., by contact with the walls of the diamond-deposition station on the other side of which coolant 98 is flowing in a counter-flow direction) thus maintaining a gradually decreasing temperature gradient in the diamond-deposition station and keeping the solvent 99 at or slightly below its saturation temperature relative to diamond deposition); still further along the flow in the diamond-deposition station, the concentration of carbon might be 153 PPM and the temperature have been dropped to 760 degrees C.; yet still further along the flow in the diamond-deposition station, the concentration of carbon might be 134 PPM and the temperature have been dropped to 750 degrees C.; and yet further still along the flow in the diamond-deposition station (say, at the exit), the concentration of carbon might be 116 PPM and the temperature have been dropped to 740 degrees C. The above example concentrations and temperatures are roughly based on the graph of FIG. 1E using a sodium solvent, and other embodiments may use higher temperatures and higher carbon concentrations or lower temperatures and lower concentrations, and the range of temperatures may be larger or smaller in other embodiments.

In other embodiments, other solvents may be used (e.g., in some embodiments, reduced-melting-point-temperature alloys (e.g., eutectic alloys) of NaK (sodium-potassium) or GaInSn (e.g., Galinstan™ or another eutectic or reduced-melting-point-temperature mixture of approximately 60-70 weight percent gallium (Ga), approximately 50-20 weight percent indium (In), and approximately 1-10 weight percent tin (Sn), and which has the advantage over Na or NaK of not being flammable in air at room temperature—in some embodiments, a fluoropolymer coating, if appropriate to the temperature ranges being used, is used to prevent wetting of the conduit and carbon-addition and diamond-deposition stations) or other suitable alloy is used in order that the system can be cooled to about room temperature and still have the solvent remain in a liquid state so that it may be easily removed or reintroduced into the conduit loop). In still other embodiments, higher-temperature solvents such as lead or lead-tin alloys, or any of the other solvents described in Brinkman et al. (U.S. Pat. No. 3,142,539) are used, wherein the present invention provides a temperature gradient in diamond-deposition station 110, in order to deposit diamond at a range of temperatures and a range of concentrations along a path through the diamond-deposition station 110, and or utilizing the additional measurement and control facilities described herein, and/or using a combination of other features described herein with the invention described in Brinkman et al.

In some embodiments, carbon-addition station 105 is heated via a heat exchanger that includes an external electrical heating coil or electrical induction or other electrical heating source. In some embodiments, station 105 is heated via an electrical heating coil that is located within the walls of station 105. In some embodiments, station 105 is heated via an electrical heating coil (properly insulated, of course) that is located inside of station 105. In some embodiments, station 105 is heated via a heat exchanger powered by other than an electrical heating coil (e.g., a natural-gas-fired heat exchanger).

In some embodiments, station 110 is cooled via a heat exchanger that includes a cooling jacket. In some embodiments (e.g., where seed diamonds 112 are not fluidized in a solvent 99 that is less dense than the diamonds during diamond deposition and the solvent 99 flows in a downward direction through diamond-deposition station 110), the cooling-jacket coolant 98 enters at the bottom of station 110 and exits at the top of station 110. Since the solvent 99 loses carbon as it moves through station 110, a larger driving force (i.e., lower carbon solubility due to a further decrease in temperature) is needed to get carbon out of the solvent 99 at the lower portion of station 110 than at the upper portion of station 110. The temperature gradient thus increases the degree of carbon utilization, since as the carbon is deposited, the carbon content is reduced and the temperature is reduced such that deposition continues to occur at every deposition level in diamond-deposition station 110 due to the temperature gradient. Therefore, in some embodiments, the lower portion of station 110 is made cooler by setting up a counter-flow heat exchanger, wherein the coolant 98 rising through station 110 extracts heat from the downward flowing solvent 99 (incrementally cooling the solvent 99 as it moves through the station 110, thus increasing the saturation and causing the carbon to continue to deposit as diamond throughout the station 110), thereby establishing a temperature and density gradient such that the lower portion of station 110 is cooler than the upper portion of station 110 (the solvent as it deposits carbon as diamond). In some embodiments, station 110 is cooled via a heat exchanger that includes cooling pipes through which a liquid coolant 98 is passed, and that are located within the walls of station 110. In some embodiments, the coolant includes molten metal(s) (e.g., tin, NaK, or other similar metals) or molten salt(s) or other suitable liquid. In other embodiments, coolants other than liquids are used (e.g., gasses such as air or $CO_2$). In some embodiments, the temperature difference needed for temperature gradient 119 is provided by transferring heat away from station 110 to the surrounding air via a plurality of heat-exchanger fins connected to station 110. In some embodiments (e.g., where seed diamonds 112 are fluidized during diamond deposition), station 110 is cooled via a heat exchanger that provides a substantially constant temperature across station 110 such that the carbon solubility is substantially constant throughout station 110.

In some embodiments, diamond-deposition station 110 functions as a fluidized bed such that seed diamonds 112 are suspended within diamond-deposition station 110 during diamond deposition. The suspension of seed diamonds 112 in a fluidized bed setup promotes diamond-crystal growth that is substantially evenly distributed among the facets of a given seed diamond 112. In some embodiments, where seed diamonds 112 are more dense than the solvent 99 (and therefore would sink to the bottom of diamond-deposition station 110 during diamond deposition, except for the upward flow of solvent 99 through diamond-deposition station 110), a pump 116 (e.g., mechanical, eddy-current, or other suitable pump) provides an upward solvent flow that is counter-current to the direction of solvent flow that would be caused by temperature gradient 119 if there were no pump (i.e., resulting in an overall upward flow of solvent 99 through the diamond-deposition station 110) in order to keep seed diamonds 112 suspended during diamond deposition. In other embodiments, where seed diamonds 112 are less dense than the solvent 99 (and therefore would rise to the top of diamond-deposition station 110 during diamond deposition), mechanical pump 116 provides an assist to solvent flow that is in the same direction as solvent flow caused by temperature gradient 119 flow (i.e., resulting in increased downward flow of solvent 99 through the diamond-deposition station 110) in order to keep seed diamonds 112 suspended during diamond deposition (since they would otherwise float to the top). In some embodiments, mechanical pump 116 also provides better control of the flow rate (and therefore velocity) of solvent 99.

In some embodiments, in order to enhance the control of seed diamonds 112 by changing solvent velocity during diamond deposition, station 110 has a funnel shape as illustrated in FIG. 1A. In some embodiments (e.g., where seed diamonds 112 are more dense than the solvent 99), mechanical pump 116 forces the solvent 99 into diamond-deposition station 110 at the narrower bottom of diamond-deposition station 110 and out the wider top of diamond-deposition station 110 such that the velocity of the solvent 99 at the bottom is faster than the velocity at the top. The velocity of the solvent 99 is faster at the bottom because the solvent velocity (cm/s) at a given level within station 110 is equal to the solvent flow rate ($cm^3/s$) divided by the cross-sectional area ($cm^2$) at that level. Therefore, if the solvent flow rate is kept constant, the solvent velocity will be faster as it goes through the narrower (smaller cross-sectional area) opening at the bottom of station 110 than it will be as it goes through the wider (larger cross-sectional area) opening at the top of station 110. The difference in solvent velocities within the funnel-shaped diamond-deposition station 110 provides an equilibrium suspension for seed diamonds 112, as illustrated by FIG. 1A. That is, in some embodiments, seed diamonds 112 are forced up and away from the bottom entry-point of station 110 by the increased vertical velocity of solvent 99 at this level, and as the vertical velocity of solvent 99 is reduced due to the increasing cross-sectional area of station 112, an equilibrium level is reached between the shape, size, and/or weight of each individual seed diamond 112 and the solvent density, viscosity and/or velocity such that seed diamonds 112 are suspended within the solvent 99. The suspension of seed diamonds 112 rotates and/or tumbles the individual seed diamonds around during diamond deposition such that all facets of each diamond are exposed to the supersaturated carbon in the solvent 99, thereby promoting substantially equally-distributed diamond-crystal growth. In some embodiments, (e.g., where the solvent 99 flows in a downward direction in the diamond-deposition station 110 such that seed diamonds 112 settle on the bottom (e.g., a screened bottom, in order to prevent the seeds from leaving) of station 110 during diamond deposition) station 110 includes a sound-transducer diaphragm, ultrasonic transmitter or other suitable vibration source that provides intermittent shaking of seed diamonds 112 during diamond deposition to promote equally-distributed diamond-crystal growth.

In some embodiments, the macro shape of seed diamonds 112 is a thinly-sliced wafer. In some embodiments, the macro shape of seed diamonds 112 is octahedron (the most common natural crystal habit for a face-centered cubic diamond crystal), while in other embodiments, the starting shape is cubic or other shape that is easily sawn, cleaved, formed or even formed by crushing, in some embodiments. In some embodiments, seed diamonds 112 are doped during diamond deposition such that the finished diamonds have semi-conducting qualities (e.g., in some embodiments, seed diamonds 112 are doped with boron (e.g., via a compound such as $NaBH_4$, which is a compound that decomposes at 400 degrees Celsius, being added to solvent 99) (see FIG. 1C)). In some embodiments, seed diamonds 112 are doped according to U.S. Pat. No. 5,609,926, which is incorporated herein by reference. In some embodiments, seed diamonds 112 doped with boron also produce finished diamonds having a blue or grey hue. In some embodiments, nitrogen is added to system 100 during diamond deposition to impart varying shades of yellow to the finished diamonds. In some embodiments, the nitrogen is added as nitrogen gas ($N_2$). In some embodiments, the nitrogen is added as sodium nitride ($Na_3N$), which decomposes at 300 degrees Celsius (see FIG. 1C). In some embodiments, inclusions other than nitrogen and boron are added to system 100 during diamond deposition to impart hues and/or semi-conducting properties to the finished diamonds (see, for example, the various inclusion compounds listed in FIG. 1C).

Although small concentrations of simple impurities such as iron (Fe), nickel (Ni), chromium (Cr), cobalt (Co), and copper (Cu) can be present with carbide-forming solvents without showing a tendency toward epitaxial inclusions, the solvent employed for solvent 99 should be as pure as reasonably possible and the surface of seed diamonds 112 should be as clean as reasonably possible. In some embodiments, therefore, seed diamonds 112 are cleaned (using a suitable acid, base, alcohol, organic solvent, soap, other cleaner, which, in some embodiments, may be used alone, in succession or in certain combinations), rinsed and thoroughly dried in order to provide a clean surface before the diamond-deposition operation begins. In some embodiments, seed diamonds 112 are cleaned with alcohol. In other embodiments (e.g., where seed diamonds 112 are in a very-small-piece or powder-like form), seed diamonds 112 are cleaned using chromic acid, which helps eliminate extra amorphous and graphite carbon that may be present in the seed powder. In other embodiments, seed diamonds 112 are cleaned in warm, dilute hydrochloric acid to remove any unwanted contaminants on the surface of seed diamonds 112 such as iron. In some embodiments, cleaned seed diamonds 112 are placed into system 100 and heated and/or vacuum-dried (in some embodiments, to evaporate solvents and cleaners). In some embodiments, a getter (e.g., in some embodiments, a heated zirconium getter or other getter such as are well known in the vacuum-tube art) is used to remove any remaining oxygen, nitrogen and like contaminants from system 100 before (or after) placing seed diamonds 112 into system 100.

In some embodiments, the solvent 99 used to transport carbon from carbon-addition station 105 to diamond-deposition station 110 is a molten metal. In some embodiments, the molten metal includes a Group I Alkali Metal such as sodium, potassium, cesium, and/or rubidium. In some embodiments, Group I Alkali Metals are used because they are significantly less dense than seed diamonds 112. For example, see FIG. 1B, which compares the physical properties of the Group I Alkali Metals with the physical properties of diamond and graphite. In some embodiments, the molten metal includes a Group I Alkali Metal other than sodium. In some embodiments, the molten metal includes a mixture of sodium and potassium. In some embodiments, the molten metal includes a eutectic mixture of sodium and potassium. In some embodiments, the molten metal includes a mixture of sodium and one or more carbon-absorbing low-melting-point metals other than potassium. In some embodiments, the molten metal includes a carbon-absorbing low-melting-point metal other than sodium (e.g., lead). In some embodiments, the molten metal includes a mixture of two or more carbon-absorbing low-melting-point metals other than sodium. In some embodiments, the solvent 99 includes one or more carbon-absorbing low-melting-point salts. For example, see FIG. 1C, which provides the physical properties for a plurality of carbon-absorbing low-melting-point salts.

In some embodiments, an optional hydrogen source 107 (e.g., adding hydrogen or a hydrocarbon) is provided at the carbon-addition station 105 to catalyze the epitaxial deposition of carbon at diamond-deposition station 110. In some embodiments, since hydrogen forms Group I metal hydrides that decompose at high temperatures, hydrogen source 107 includes a metal hydride. For example, sodium hydride (NaH), which dissolves in molten sodium, decomposes at 800 degrees Celsius (see FIG. 1C), a temperature well within the range of the present invention. In some embodiments, hydrogen source 107 includes methane (in some embodiments, methane provides both a source of hydrogen catalyst and a source of carbon). In other embodiments, hydrogen source 107 includes a hydrocarbon other than methane. In some embodiments, hydrogen source 107 includes hydrogen gas.

In some preferred embodiments, solvent 99 includes molten metal (e.g., sodium) and the temperature at carbon-addition station 105 is controlled to a suitable value in a range of approximately 600-900 degrees Celsius, and the temperature at diamond-deposition station 110 is controlled to a suitable value such that epitaxial deposition at station 110 is optimal for growth of single-crystal diamond crystal epitaxially on the seeds (e.g., in some embodiments, the temperature at the exit port of diamond-deposition station 110 is approximately 75-300 Kelvin cooler than the temperature at the exit port of carbon-addition station 105). (Sodium has a melting point of 370.87 K (or 97.72 degrees Celsius (207.9° F.)) and a boiling point (at one-atmosphere standard pressure) of 1156 K (or 883 degrees Celsius (1621° F.)) and is thus liquid within a 785.13 K range, but will remain liquid over a larger range if the pressure is increased.)

In some embodiments, system 100 is pressurized during diamond deposition in order to raise the temperature of the solvent 99 above its normal boiling point (i.e., its boiling point at atmospheric pressure) in order to prevent solvent boiling. In some embodiments, the ability to raise solvent temperature above its normal boiling point results in even higher carbon solubility into the solvent 99, and therefore, improved diamond deposition on a larger number of seed or a larger area of diamond-deposition surface. In some embodiments, diamond deposition is more efficient at higher temperatures. In some embodiments, an inert gas (e.g., helium or argon) is maintained at an elevated pressure (e.g., above one atmosphere, for example, 2-5 atmospheres, 5-10 atmospheres, 10-20 atmospheres, 20-50 atmospheres, 50-100 atmospheres, 100-200 atmospheres, or above 200 atmospheres) above the solvent 99 in at least one passage connected to the solvent-circulation loop, in order to keep the solvent from boiling and thus allow higher-temperature operation of the diamond-deposition station 110. Note that using the factor $\exp(\Delta G/NkT)$ (used to in Equation (7) to calculate the diamond solubility limit from the graphite solubility limit, $X_{DL}=X_{GL}\exp(\Delta G/NkT)$, where $\Delta G$ is the free-energy difference between diamond and graphite), which equals the ratio of $X_{DL}/X_{GL}$ is within a few percent of two for pressures between 0.1 atmosphere and 200 atmospheres, but at higher pressures drops slightly to a factor of about 1.97 at 1,000 atmospheres and 850 degrees C., to a factor of about 1.65 at 10000 atmospheres and 850 degrees C., and to a factor of about 1.37 at 20,000 atmospheres and 850 degrees C.

In some preferred embodiments, solvent 99 includes liquid sodium, system 100 is pressurized such that the temperature of solvent 99 at the exit port of carbon-addition station 105 is controlled to a suitable value in a range of approximately 850-950 degrees Celsius, and the temperature range (i.e., the temperature differential between the entry and exit ports) in diamond-deposition station 110 is controlled to a suitable range of values such that epitaxial deposition at station 110 is optimal for reasonably rapid growth of single-crystal diamond (e.g., in some embodiments, the temperature of solvent 99 at the highest-temperature diamond seed (i.e., the seed nearest the entry port) of diamond-deposition station 110 is approximately 50-80 Kelvin cooler than the graphite-saturation temperature of solvent 99 as it leaves carbon-addition station 105). Note that from a given starting (higher) temperature $T_2$ of solvent having carbon at saturation at its saturation limit $X_{GL}$ (relative to graphite), the 50-80 Kelvin temperature drop to $T_1$ in that solvent having the same given carbon concentration (i.e., the carbon concentration for carbon dissolved from a graphite source at $T_2$) results in a carbon concentration $X_{DL}$ that is approximately twice the saturation limit for carbon dissolved from graphite at the lower temperature $T_1$. As used herein, $T_2$ is the highest temperature in carbon-addition station 105 (in some embodiments, this is the temperature of solvent 99 at the exit port of carbon-addition station 105, $T_1$ is the highest temperature used for diamond deposition in diamond-addition station 110, and $T_0$ is the lowest temperature used for diamond deposition in diamond-addition station 110.

Thus, in some embodiments, the present invention operates by dissolving carbon from a graphite source into solvent 99 in carbon-addition station 105 up to a graphite saturation concentration at $T_2$, and then cools the solvent and deposits carbon as diamond in diamond-deposition station 110, starting at a temperature $T_1$ and a carbon concentration just over $X_{DL}(T_1)$, and continuously cooling solvent 99 as its carbon concentration decreases until solvent 99 reached the ending temperature $T_0$ for deposition of diamond in diamond-deposition station 110. Thus, unlike prior systems (e.g., Brinkman et al.) that only attempt to deposit as diamond at one temperature, some embodiments of the present invention progressively cool the solvent over a range of deposition temperatures such that carbon continues to deposit as diamond even as its concentration in solvent 99 is decreasing. For example, from one assumed extension of calculations of the carbonsolubility-versus-temperature data from Ainsley et al., the saturation limit $X_{GL}$ (relative to graphite) for sodium at 1010° C. is about 1000 PPM, while the saturation concentration limit $X_{DL}$ (relative to diamond) for sodium at 932° C. is about 1000 PPM, such that sodium solvent saturated with carbon from a graphite source at 1010° C. must be cooled by slightly more than 78 Kelvin in order to deposit carbon as diamond crystal; then, diamond can be deposited over a range of temperatures, for example across the range from 932° C. to 860° C., the carbon concentration limit $X_{DL}$ drops from about 1000 PPM to about 491 PPM. Larger or smaller temperature ranges and different starting and ending temperatures and concentration ranges are used in other embodiments.

For temperatures above 883° C. the sodium loop is pressurized to prevent boiling of the solvent. From similar assumptions and calculations, the carbon-concentration saturation limit $X_{GL}$ (relative to graphite) for sodium at 930° C. is about 495 PPM (i.e., solvent 99 leaving carbon-addition station 105 at 930° C. may hold about 495 PPM carbon), while the saturation limit $X_{DL}$ (relative to diamond deposition) for sodium at 860° C. is about 491 PPM, such that sodium solvent saturated with carbon from a graphite source at 930° C. must be cooled by about 70 Kelvin to about 860° C. in order to deposit carbon as diamond crystal; in some such embodiments, the solvent 99 in diamond-deposition station 110 is cooled over across a range from 860° C. to 800° C. (for example), and across that temperature range, the carbon concentration limit $X_{DL}$ drops from about 495 PPM to about 251 PPM. Also from similar assumptions, in some embodiments, the saturation limit $X_{GL}$ (relative to graphite) for sodium at 850° C. is about 219 PPM (e.g., at the exit of carbon-addition station 105), while the saturation limit $X_{DL}$ (relative to diamond) for sodium at 790° C. is about 219 PPM, such that sodium solvent saturated with 219 PPM carbon from a graphite source at 850° C. must be cooled by slightly more than 60 Kelvin to about 790° C. by the time it reaches diamond-deposition station 110 in order to deposit carbon as diamond crystal; in some such embodiments, the solvent 99 in diamond-deposition station 110 is cooled over across a range from 790° C. to 740° C. (for example), and across that 50 Kelvin temperature range, the carbon concentration limit $X_{DL}$ drops from about 219 PPM to about 116 PPM.

Also from similar assumptions, the saturation limit $X_{GL}$ for sodium at 800° C. is about 124 PPM (e.g., at the exit of carbon-addition station 105), while the saturation limit $X_{DL}$ (relative to diamond) for sodium at about 745° C. is about 124 PPM, such that sodium solvent saturated with 124 PPM carbon from a graphite source at 800° C. must be cooled by slightly more than 55 Kelvin to about 745° C. by the time it reaches diamond-deposition station 110 in order to deposit carbon as diamond crystal; in some such embodiments, the solvent 99 in diamond-deposition station 110 is cooled over across a range from 745° C. to 710° C. (for example), and across that 35-Kelvin temperature range, the carbon concentration limit $X_{DL}$ drops from about 124 PPM to about 78 PPM.

The above calculations and assumptions are approximate, so in some embodiments, slight experimentation is used to empirically determine more optimal operating temperatures, temperature ranges and concentrations (of course, in some such embodiments, the exact concentrations need not be determined, as long as a satisfactory set of parameters is determined to provide the desired diamond-growth characteristics. For example, one such empirical method includes running a solvent 99 (e.g., sodium) having a given starting carbon concentration through a given carbon-addition station 105 at a given flow rate and to given temperature $T_2$ or temperature range. The solvent 99 exiting that carbon-addition station 105 will have a carbon concentration $X_{GL}(T_2)$, although for these purposes the numerical value of carbon concentration $X_{GL}(T_2)$ need not be known. For test purposes, the solvent 99 can then be passed through a temporary graphite-deposition station having graphite seed material, and have its temperature dropped across a given range to a lower temperature $T_X$ (such that its carbon concentration is reduced to $X_{GL}(T_X)$), and the depleted solvent then circulated back to the carbon-addition station 105, where its carbon concentration would again be restored to $X_{GL}(T_2)$. This will establish a "steady-state" rate of carbon transfer (i.e., the amount of carbon added per unit time by this carbon-addition station 105, starting with a carbon concentration $X_{GL}(T_X)$ and ending with a carbon concentration $X_{GL}(T_2)$. The temporary graphite-deposition station is then replaced by a diamond-deposition station 110 having one or more pre-weighed diamond seeds at one or more respective locations in the diamond-deposition station 110. The temperature of the solvent 99 leaving diamond-deposition station 110 is cooled by about 50 Kelvin such that as solvent 99 enters diamond-deposition station 110 it is at a temperature $T_1$ equaling about $T_2$ minus 50 Kelvin.

In some embodiments, diamond seeds that are located in diamond-deposition station 110 at a location that is at a temperature above the correct diamond-deposition temperature will either not gain diamond mass or, more likely, lose mass as diamond will tend to dissolve into a solvent that is not with a carbon concentration saturated relative to deposition of diamond. In the other hand, diamond seeds that are located in diamond-deposition station 110 at a location that is at a temperature too low relative to the correct diamond-deposition temperature will tend to get inclusions or other graphite deposits. Diamond seeds located at temperatures in between the too-high and the too-low temperatures will exhibit diamond growth, and an optimum starting deposition temperature $T_1$ for a carbon concentration of $X_{GL}(T_2)$ can be determined by examining the weight gain and crystal quality of the resulting grown diamond seeds.

In some embodiments, the value of $X_{GL}(T_2)$ need not be known, once the needed temperature drop from $T_2$ to $T_1$ is determined by this or another suitable method. By then adjusting the starting deposition temperature to $T_1$ and placing a suitable (large) number of seed diamonds at the entry to diamond-deposition station 110 (these diamonds will grow because the earlier tests found an optimum starting deposition temperature $T_1$ for a carbon concentration of $X_{GL}(T_2)$), and additional pre-weighed test diamond seeds are then placed downstream to determine the rate of temperature drop needed for continued diamond deposition at each successive location in diamond-deposition station 110. In embodiments using a fluidized-bed configuration to suspend diamond seed in the flowing solvent, the above empirical methods can be supplemented by empirical tests in which a plurality of diamond seeds (e.g., a counted number of seeds of each of one or more different predetermined weights) are suspended in the fluidized solvent flow for a relatively short period of time, and then removed. For example, a plurality of (e.g., ten) diamond seeds at each of a plurality of weights (e.g., 0.1, 0.2, 0.5, 1, 2, and 5 carats, wherein the larger seeds are previously grown from smaller seeds). In some embodiments, the smaller seeds are provided in greater numbers than the numbers of larger seeds. If seeds of certain weights (e.g., larger seeds) lost weight (because they were dissolving in the solvent) the temperature for that region of the deposition station 110 would need to be lowered faster, while if graphite or inclusions showed up in seeds of certain other weights, the temperature for those regions of the deposition station 110 would need to be lowered at a slower rate (or more diamond seeds provided at the weight that suspends at the required level in diamond-deposition station 110 to remove carbon from the solvent at a higher rate, in order to match the rate of temperature drop), in order that a sufficient amount of diamond was deposited on seeds in those regions such that the concentration of carbon was sufficiently reduced before the temperature was further lowered. Each different temperature range may need to be optimized differently, but undue experimentation is clearly not required, using these or other suitable methods.

In some embodiments, solvent 99 is a suitable carbon-bearing solvent. In some such embodiments, during operation of system 100, the maximum temperature of the solvent 99 at carbon-addition station 105 is controlled to a suitable value in the range of approximately 300 to approximately 350 degrees Celsius. In some such embodiments, the maximum temperature at carbon-addition station 105 is controlled to a suitable value in the range of approximately 350 to approximately 400 degrees Celsius. In some such embodiments, the maximum temperature at carbon-addition station 105 is controlled to a suitable value in the range of approximately 400 to approximately 450 degrees Celsius. In some such embodiments, the maximum temperature at carbon-addition station 105 is controlled to a suitable value in the range of approximately 450 to approximately 500 degrees Celsius. In some such embodiments, the maximum temperature at carbon-addition station 105 is controlled to a suitable value in the range of approximately 500 to approximately 550 degrees Celsius. In some such embodiments, the maximum temperature at carbon-addition station 105 is controlled to a suitable value in the range of approximately 550 to approximately 600 degrees Celsius. In some such embodiments, the maximum temperature at carbon-addition station 105 is controlled to a suitable value in the range of approximately 600 to approximately 650 degrees Celsius. In some such embodiments, the maximum temperature at carbon-addition station 105 is controlled to a suitable value in the range of approximately 650 to approximately 700 degrees Celsius. In some such embodiments, the maximum temperature at carbon-addition station 105 is controlled to a suitable value in the range of approximately 700 to approximately 750 degrees Celsius. In some such embodiments, the maximum temperature at carbon-addition station 105 is controlled to a suitable value in the range of approximately 750 to approximately 800 degrees Celsius. In some such embodiments, the maximum temperature at carbon-addition station 105 is controlled to a suitable value in the range of approximately 785 to approximately 800 degrees Celsius. In some such embodiments, the maximum temperature at carbon-addition station 105 is controlled to a suitable value in the range of approximately 800 to approximately 825 degrees Celsius. In some such embodiments, the maximum temperature at carbon-addition station 105 is controlled to a suitable value in the range of approximately 800 to approximately 850 degrees Celsius. In some such embodiments, the maximum temperature at carbon-addition station 105 is controlled to a suitable value in the range of approximately 850 to approximately 900 degrees Celsius. In some such embodiments, the maximum temperature at carbon-addition station 105 is controlled to a suitable value in the range of approximately 900 to approximately 950 degrees Celsius. In some such embodiments, the maximum temperature at carbon-addition station 105 is controlled to a suitable value in the range of approximately 950 to approximately 1000 degrees Celsius. In some such embodiments, the maximum temperature at carbon-addition station 105 is controlled to a suitable value in the range of approximately 1000 to approximately 1050 degrees Celsius. In some such embodiments, the maximum temperature at carbon-addition station 105 is controlled to a suitable value in the range of approximately 1050 to approximately 1100 degrees Celsius. In some such embodiments, the maximum temperature at carbon-addition station 105 is controlled to a suitable value in the range of approximately 1100 to approximately 1150 degrees Celsius. In some such embodiments, the maximum temperature at carbon-addition station 105 is controlled to a suitable value in the range of approximately 1150 to approximately 1200 degrees Celsius. In some such embodiments, the maximum temperature at carbon-addition station 105 is above 1200 degrees Celsius. In some of each of the embodiments listed in this paragraph wherein the maximum temperature of solvent 99 is above its boiling point at normal atmospheric pressure, the system is pressurized to prevent boiling of solvent 99. In some of each of the embodiments listed in this paragraph, solvent 99 includes sodium. In some of each of the embodiments listed in this paragraph, solvent 99 is sodium. In some of each of the embodiments listed in this paragraph, solvent 99 includes NaK. In other embodiments, the present invention uses a solvent that includes other molten metals and/or salts that dissolve carbon.

In some of each of the embodiments listed in this paragraph, solvent 99 includes a gallium-indium-tin alloy. In some such embodiments, solvent 99 includes gallium, indium, and tin in eutectic ratios (e.g., ratios that give a minimum melting temperature), while in other embodiments, the amount(s) of the most costly elements (indium and/or gallium) are reduced relative to the eutectic ratio in order to save the expense of the solvent materials, which of course increases the melting temperature somewhat. Using alloys that include gallium, indium, and/or tin rather than sodium and/or potassium reduces the danger of fast or explosive reactions of sodium and/or potassium with air, should the solvent come into contact with air or its components (such as oxygen and/or water vapor). In some of each of the embodiments listed in this paragraph, solvent 99 includes a gallium-indium-tin alloy further including less than 5% by weight each of one or more elements selected from the group consisting of gold, silver, bismuth and aluminum. In some such embodiments, the solvent is liquid at room temperature (about 25 degrees Celsius).

In some of each of the embodiments, the maximum temperature of solvent 99 in diamond-deposition station 110 and the minimum temperature of solvent 99 in diamond-deposition station 110 are controlled to suitable values that are lower than that of solvent 99 as it leaves carbon-addition station 105. In some embodiments, the maximum temperature of solvent 99 in diamond-deposition station 110 is about 50 to 80 Kelvin lower than the carbon saturation temperature relative to graphite dissolving. In some such embodiments, the minimum temperature of solvent 99 at diamond-deposition station 110 during diamond deposition is controlled to a value in the range of approximately 200 to approximately 250 degrees Celsius, a suitable value in the range of approximately 250 to approximately 300 degrees Celsius, a suitable value in the range of approximately 300 to approximately 350 degrees Celsius, a suitable value in the range of approximately 350 to approximately 400 degrees Celsius, a suitable value in the range of approximately 400 to approximately 450 degrees Celsius, a suitable value in the range of approximately 450 to approximately 500 degrees Celsius, a suitable value in the range of approximately 500 to approximately 550 degrees Celsius, a suitable value in the range of approximately 550 to approximately 600 degrees Celsius, a suitable value in the range of approximately 600 to approximately 635 degrees Celsius, a suitable value in the range of approximately 635 to approximately 655 degrees Celsius, a suitable value in the range of approximately 655 to approximately 675 degrees Celsius, a suitable value in the range of approximately 675 to approximately 685 degrees Celsius, a suitable value in the range of approximately 685 to approximately 695 degrees Celsius, a suitable value in the range of approximately 695 to approximately 705 degrees Celsius, a suitable value in the range of approximately 705 to approximately 715 degrees Celsius, a suitable value in the range of approximately 715 to approximately 725 degrees Celsius, a suitable value in the range of approximately 725 to approximately 735 degrees Celsius, a suitable value in the range of approximately 735 to approximately 745 degrees Celsius, a suitable value in the range of approximately 745 to approximately 755 degrees Celsius, a suitable value in the range of approximately 755 to approximately 765 degrees Celsius, a suitable value in the range of approximately 765 to approximately 775 degrees Celsius, a suitable value in the range of approximately 775 to approximately 785 degrees Celsius, a suitable value in the range of approximately 785 to approximately 795 degrees Celsius, a suitable value in the range of approximately 795 to approximately 805 degrees Celsius, a suitable value in the range of approximately 805 to approximately 815 degrees Celsius, a suitable value in the range of approximately 815 to approximately 825 degrees Celsius, a suitable value in the range of approximately 825 to approximately 835 degrees Celsius, a suitable value in the range of approximately 835 to approximately 845 degrees Celsius, a suitable value in the range of approximately 845 to approximately 855 degrees Celsius, a suitable value in the range of approximately 855 to approximately 865 degrees Celsius, a suitable value in the range of approximately 865 to approximately 875 degrees Celsius, a suitable value in the range of approximately 875 to approximately 885 degrees Celsius, a suitable value in the range of approximately 885 to approximately 895 degrees Celsius, a suitable value in the range of approximately 895 to approximately 905 degrees Celsius, a suitable value in the range of approximately 905 to approximately 925 degrees Celsius, a suitable value in the range of approximately 925 to approximately 950 degrees Celsius, a suitable value in the range of approximately 950 to approximately 1000 degrees Celsius, a suitable value in the range of approximately 1000 to approximately 1050 degrees Celsius, a suitable value in the range of approximately 1050 to approximately 1100 degrees Celsius, a suitable value in the range of approximately 1100 to approximately 1150 degrees Celsius, or a suitable value in the range of approximately 1150 to approximately 1200 degrees Celsius.

In some such embodiments, the minimum temperature of solvent 99 at diamond-deposition station 110 during diamond deposition is controlled to a value in the range of approximately 10 to approximately 20 degrees Celsius lower than the graphite-saturation temperature of solvent 99 as it exits carbon-addition station 105, or in the range of approximately 20 to approximately 30 degrees Celsius lower than the temperature of solvent 99 as it exits carbon-addition station 105, or in the range of approximately 30 to approximately 40 degrees Celsius lower than the temperature of solvent 99 as it exits carbon-addition station 105, or in the range of approximately 40 to approximately 50 degrees Celsius lower than the temperature of solvent 99 as it exits carbon-addition station 105, or in the range of approximately 50 to approximately 60 degrees Celsius lower than the temperature of solvent 99 as it exits carbon-addition station 105, or in the range of approximately 60 to approximately 70 degrees Celsius lower than the temperature of solvent 99 as it exits carbon-addition station 105, or in the range of approximately 70 to approximately 80 degrees Celsius lower than the temperature of solvent 99 as it exits carbon-addition station 105, or in the range of approximately 80 to approximately 90 degrees Celsius lower than the temperature of solvent 99 as it exits carbon-addition station 105, or in the range of approximately 95 to approximately 105 degrees Celsius lower than the temperature of solvent 99 as it exits carbon-addition station 105, or in the range of approximately 100 to approximately 150 degrees Celsius lower than the temperature of solvent 99 as it exits carbon-addition station 105, or in the range of approximately 150 to approximately 200 degrees Celsius lower than the temperature of solvent 99 as it exits carbon-addition station 105, in the range of approximately 200 to approximately 250 degrees Celsius lower than the temperature of solvent 99 as it exits carbon-addition station 105, in the range of approximately 250 to approximately 300 degrees Celsius lower than the temperature of solvent 99 as it exits carbon-addition station 105, in the range of approximately 300 to approximately 350 degrees Celsius lower than the temperature of solvent 99 as it exits carbon-addition station 105, in the range of approximately 350 to approximately 400 degrees Celsius lower than the temperature of solvent 99 as it exits carbon-addition station 105, in the range of approximately 400 to approximately 450 degrees Celsius lower than the temperature of solvent 99 as it exits carbon-addition station 105, in the range of approximately 450 to approximately 500 degrees Celsius or more than approximately 500 degrees Celsius lower than the temperature of solvent 99 as it exits carbon-addition station 105.

In one preferred embodiment, the maximum temperature of solvent 99 at diamond-addition station 105 is in a range of approximately 900 degrees Celsius to approximately 1050 degrees Celsius and the minimum temperature of solvent 99 at diamond-deposition station 110 is in a range of approximately 200 degrees Celsius to approximately 300 degrees Celsius lower. In some embodiments, the maximum temperature of solvent 99 at diamond-addition station 105 is in a range of approximately 800 degrees Celsius to approximately 825 degrees Celsius and the minimum temperature of solvent 99 at diamond-deposition station 110 is in a range of approximately 700 degrees Celsius to approximately 775 degrees Celsius. In some embodiments, the carbon concentration in solvent 99 as it leaves carbon-addition station 105 is in the range of 75 PPM to 150 PPM.

In some such embodiments, the carbon concentration in solvent 99 as it leaves diamond-deposition station 110 is in the range of 10 PPM to 75 PPM. In some embodiments, the carbon concentration in solvent 99 as it leaves carbon-addition station 105 is in the range of 150 PPM to 250 PPM. In some such embodiments, the carbon concentration in solvent 99 as it leaves diamond-deposition station 110 is in the range of 75 PPM to 125 PPM. In some embodiments, the carbon concentration in solvent 99 as it leaves carbon-addition station 105 is in the range of 250 PPM to 500 PPM. In some such embodiments, the carbon concentration in solvent 99 as it leaves diamond-deposition station 110 is in the range of 125 PPM to 250 PPM. In some embodiments, the carbon concentration in solvent 99 as it leaves carbon-addition station 105 is in the range of 500 PPM to 1000 PPM. In some such embodiments, the carbon concentration in solvent 99 as it leaves diamond-deposition station 110 is in the range of 250 PPM to 500 PPM.

In some embodiments, before the solvent 99 is introduced into system 100, an inert gas (e.g., argon) is purged through system 100 and a cleaning solvent (e.g., an alcohol) is run through system 100 to clear out any unwanted surface contaminants, and then system 100 is heated and/or vacuum dried to remove any residual solvent. In some embodiments, system 100 is initially evacuated to a pressure of not less than 0.0001 millimeters of mercury ($1 \times 10^{-4}$ mm Hg) and the solvent is introduced into system 100 in a vacuum.

In some embodiments, the piping and walls of the carbon-addition and diamond-deposition stations that carry and contain the solvent throughout system 100, as well as diamond-holding cages or certain other features of the systems described are made of a corrosion-resistant material (e.g., in some embodiments, 304-type stainless steel or other steel or non-ferrous metals (such as molybdenum) or alloys into which carbon does not substantially diffuse at the temperatures used in the method of the present invention, and which are substantially non-reactive with the solvent being used). In some embodiments, the material makeup of the piping in system 100 varies in different portions of system 100. For example, in some embodiments, the hot leg of system 100 (i.e., the portion of system 100 running through carbon-addition station 105 and from station 105 to diamond-deposition station 110) is made of a material that includes 304-type stainless steel, and the cold leg of system 100 (i.e., the portion of system 100 running through station 110 and from station 110 to station 105) is made of a material that has a higher-carbon content (e.g., in some embodiments, carburized steel) such that the carbon carried in the solvent will prefer depositing on seed diamonds 112 over diffusing into the piping walls.

Figure 2A:
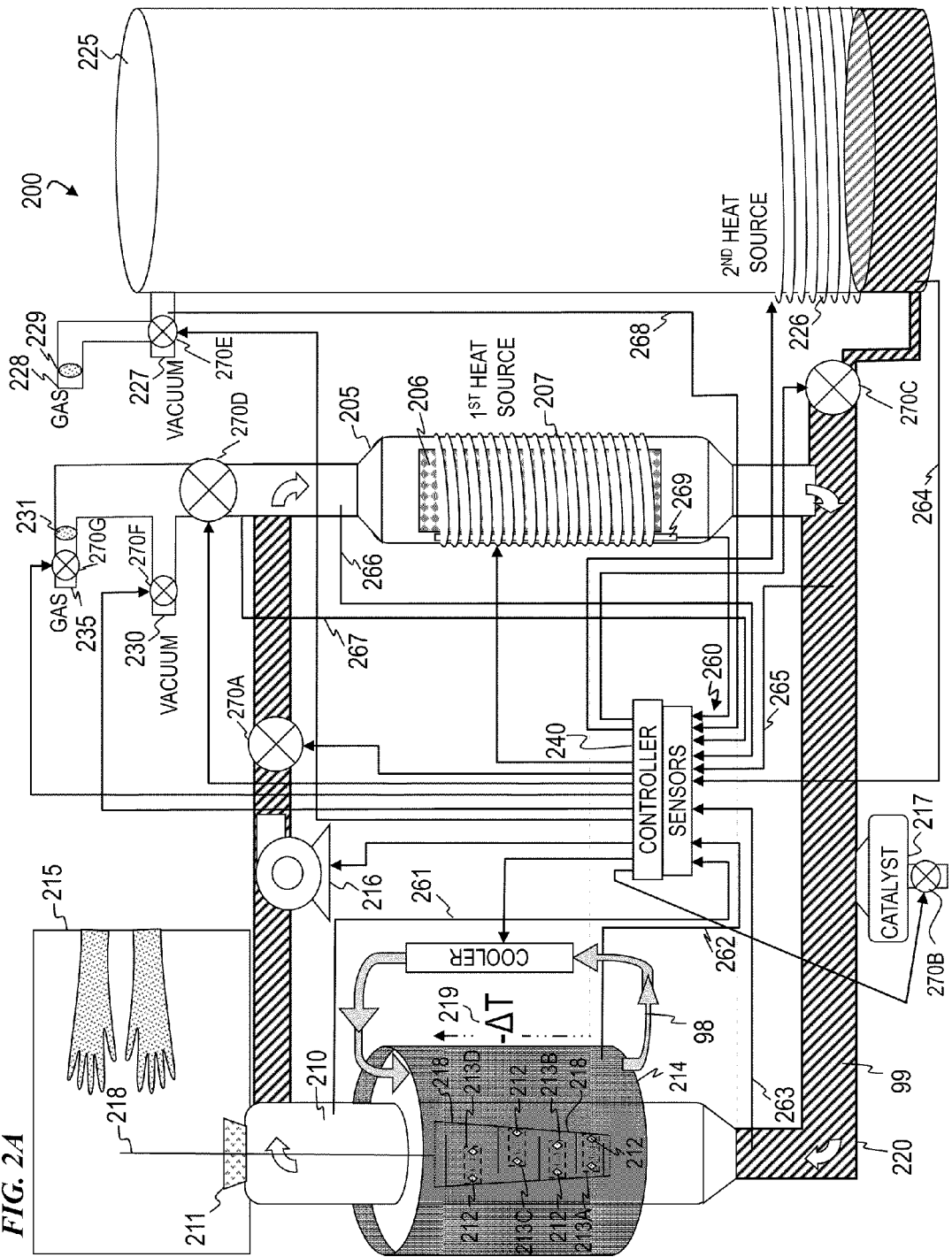
FIG. 2A is a isometric block diagram, partially in cross-section, of a fluidized-bed liquid-solvent diamond-deposition system 200 actively depositing diamond, wherein a pump is pumping solvent through the system in a direction opposite to the direction that solvent would flow if induced only by the thermal convection caused by the temperature gradient.

FIG. 2A is a cross-sectional view of a fluidized-bed liquid-solvent diamond-deposition system 200 actively depositing diamond. In some embodiments, system 200 includes a carbon-addition station 205, a diamond-deposition station 210, a carbon circulation conduit 220, and a solvent reservoir 225. In some embodiments, solvent 99 is heated at reservoir 225 by heat source 226 to provide the amount of heat necessary to keep solvent 99 in a liquid form. In other embodiments, a metal solvent such as NaK, GaInSn, or other solvent that is liquid at room temperature is used, and in some such embodiments, heat source 226 is omitted. In some embodiments, solvent 99 from reservoir 225 fills circulation conduit 220 and a temperature gradient 219 is applied to system 200 (i.e., in some embodiments, the lower portion of diamond-deposition station 210 is hotter than the upper portion of diamond-deposition station 210) such that carbon from a carbon source 206 dissolves into solvent 99 (e.g., a liquid alkali metal such as sodium) at carbon-addition station 205 and carbon leaves solvent 99 and deposits epitaxially in diamond-crystal structure onto one or more seed diamonds 212 at the diamond-deposition station 210. In some embodiments, solvent 99 is forced into conduit 220 by evacuating conduit 220 via vacuum source 230 and then forcing an inert gas (e.g., helium) into reservoir 225 via gas source 228 such that solvent 99 flows from reservoir 225 into conduit 220. In some embodiments, conduit 220 is evacuated to a pressure of not less than 0.0001 millimeters of mercury ($1 \times 10^{-4}$ mm Hg).

In some embodiments, carbon source 206 includes one or more solid pieces of graphite. In some embodiments, carbon source 206 includes a gaseous hydrocarbon. In some embodiments, carbon source 206 uses solid carbon that is configured such that carbon source 206 has the maximum surface area that is reasonably attainable given the physical constraints of system 200 (e.g., in some embodiments, carbon source 206 has a large surface area, but it still fits inside carbon-addition station 205 such that the flow of solvent through station 205 is not significantly slowed). In some embodiments, carbon source 206 includes one or more of the carbon sources 106A-106E depicted in FIG. 1A. In some embodiments, carbon source 206 includes star-shaped piece of graphite as depicted by element 106A of FIG. 1A. In some embodiments, carbon source 206 includes a plurality of carbon spears. In some embodiments, carbon source 206 includes chunks, granules, or other pieces of carbon held in a cage such that pieces cannot escape carbon-addition station 205, as depicted by assembly 106E in FIG. 1A.

In some embodiments, as illustrated in FIG. 2A, station 205 has a larger diameter than conduit 220 in order to reduce the velocity of solvent 99 through station 205 and increase the resident dwell time of solvent 99 in station 205. In some embodiments, the increase in resident dwell time provides more contact time between solvent 99 and carbon source 206, thereby ensuring that the carbon-saturation point of solvent 99 is reached.

In some embodiments, solvent 99 is a molten metal. In some embodiments, the molten metal includes a Group I Alkali Metal such as sodium. In some embodiments, Group I Alkali Metals are used because they are significantly less dense than seed diamonds 212. For example, see FIG. 1B, which compares the densities of the Group I Alkali Metals with the densities of diamond and graphite. In some embodiments, the molten metal includes a Group I Alkali Metal other than sodium. In some embodiments, the molten metal includes a mixture of sodium and potassium. In some embodiments, the molten metal includes a eutectic mixture of sodium and potassium. In some embodiments, the molten metal includes a mixture of sodium and one or more carbon-absorbing low-melting-point metals other than potassium. In some embodiments, the molten metal includes a carbon-absorbing low-melting-point metal other than sodium (e.g., lead). In some embodiments, the molten metal includes a mixture of two or more carbon-absorbing low-melting-point metals other than sodium. In some embodiments, the solvent includes one or more carbon-absorbing low-melting-point salts. For example, see FIG. 1C, which provides the physical properties for a plurality of carbon-absorbing low-melting-point salts.

In some embodiments, the macro shape of seed diamonds 212 is a thinly-sliced wafer. In some embodiments, the macro shape of seed diamonds 212 is octahedron (the most common natural crystal habit for a face-centered cubic diamond crystal), while in other embodiments, the starting shape is cubic or other shape that is easily sawn, cleaved, formed or even formed by crushing, in some embodiments. In some embodiments, seed diamonds 212 are made using a CVD process (for example, in some embodiments, seed diamonds 212 are made according to U.S. Pat. No. 7,258,741 (hereinafter "Linares et al."), titled "SYSTEM AND METHOD FOR PRODUCING SYNTHETIC DIAMOND", issued Aug. 21, 2007, and incorporated herein by reference). In some embodiments, seed diamonds 212 are made using a high-temperature, high-pressure process (for example, in some embodiments, seed diamonds 212 are made according to U.S. Pat. No. 3,906,082 (hereinafter, "Shulzhenko et al."), titled "METHOD OF MAKING DIAMONDS SYNTHETICALLY", issued Sep. 16, 1975, and incorporated herein by reference). In some embodiments, seed diamonds 212 are made according to U.S. Pat. No. 4,984,534 (hereinafter, "Ito et al."), titled "METHOD FOR SYNTHESIS OF DIAMOND", issued Jan. 15, 1991, and incorporated herein by reference. In some embodiments, seed diamonds 212 are made according to U.S. Pat. No. 7,235,130 (hereinafter, "Mao et al."), titled "APPARATUS AND METHOD FOR DIAMOND PRODUCTION", issued Jun. 26, 2007, and incorporate herein by reference. In some embodiments, seed diamonds 212 are natural diamonds. In some embodiments, seed diamonds 212 are in a powder form.

In some embodiments, seed diamonds 212 are doped during diamond deposition such that the finished diamonds have semi-conducting qualities (e.g., in some embodiments, seed diamonds 112 are doped with boron or other element that provides semiconducting properties). In some embodiments, seed diamonds 112 are doped according to U.S. Pat. No. 5,609,926, which is incorporated herein by reference. In some embodiments, seed diamonds 212 doped with boron also produce finished diamonds having a blue or grey hue. In some embodiments, nitrogen is added to system 200 during diamond deposition to impart varying shades of yellow to the finished diamonds. In some embodiments, the nitrogen is added as nitrogen gas ($N_2$). In some embodiments, the nitrogen is added as sodium nitride ($Na_3N$), which decomposes at 300 degrees Celsius (see FIG. 1C). In some embodiments, inclusions other than nitrogen and boron are added to system 200 during diamond deposition to impart hues and/or semi-conducting properties to the finished diamonds (see, for example, the various inclusion compounds listed in FIG. 1C).

In some embodiments, the seed diamonds 212 should be as clean as reasonably possible, as is described above for FIG. 1A. In some embodiments, therefore, seed diamonds 212 are cleaned, rinsed and thoroughly dried in order to provide a clean surface before the diamond-deposition operation begins. In some embodiments, getters 231 and 229 (e.g., in some embodiments, heated zirconium (or other appropriate types of) getters 231 and 229) remove any remaining oxygen, nitrogen and like contaminants from system 200 before (or after) placing seed diamonds 212 into system 200.

In some embodiments, temperature gradient 219 causes the solvent to flow in a counter-clockwise direction due to the hotter solvent rising up through hotter carbon-addition station 205 and sinking down through the cooler diamond-deposition station 210. In some embodiments, system 200 is configured such that temperature gradient 219 causes the solvent to flow in a clockwise direction. In some embodiments, temperature gradient 219 is applied by heating carbon-addition station 205 and by cooling diamond-deposition station 210. In some embodiments, conduit 220 is also heated such that the leg of conduit 220 carrying solvent 99 away from station 205 has a temperature that is substantially similar to the temperature at station 205 and such that the leg taking solvent 99 away from station 210 has a temperature that is substantially similar to the temperature at station 210.

In some embodiments, carbon-addition station 205 is heated via a heat exchanger that includes an external electrical heating coil 207. In some embodiments, station 205 is heated via an electrical heating coil that is located within the walls of station 205. In some embodiments, station 205 is heated via a heat exchanger other than an electrical heating coil (e.g., a natural-gas-fired heat exchanger).

In some embodiments, station 210 is cooled via a heat exchanger 214 that includes a cooling jacket. In some embodiments (e.g., where seed diamonds 212 are fluidized in a solvent 99 that is more dense than seed diamonds 212 during diamond deposition and solvent 99 flows in a downward direction through diamond-deposition station 210 (i.e., wherein the seed diamonds 212, rather than floating to the top, are suspended within the growth stations (i.e., cages) 213 by the downward flow of the solvent) or where seed diamonds 212 are not fluidized (but rather are held in a substantially fixed relationship to one or more holding facilities 213) during diamond deposition and solvent 99 flows in a downward direction through diamond-deposition station 210), the cooling jacket coolant enters at the bottom of station 210 and exits at the top of station 210 (this is in a direction generally counter to the flow of the solvent 99). Since solvent 99 loses carbon as it moves down station 210, a larger driving force (i.e., lower carbon solubility due to a further decrease in temperature) is needed to get carbon out of solvent 99 at the lower portion of station 210 than at the upper portion of station 210. Therefore, in some embodiments, the lower portion of station 210 is made cooler by setting up a counter-flow heat exchanger 214, wherein the coolant rising through station 210 picks up heat from the downward flowing solvent 99 (incrementally cooling the solvent as it moves through the station 210), thereby establishing a temperature and density gradient such that the lower portion of station 210 is cooler than the upper portion of station 210. In some embodiments, station 210 is cooled via a heat exchanger 214 that includes cooling pipes through which a liquid coolant is passed, and that are located within the walls of station 210. In some embodiments, the coolant includes molten metal(s) (e.g., tin, NaK, or other similar metals) or molten salt(s) or other suitable liquid. In other embodiments, coolants other than liquids are used (e.g., gasses such as $CO_2$). In some embodiments, the temperature difference needed for temperature gradient 219 is provided by transferring heat away from station 210 to the surrounding air via a plurality of heat exchanger fins connected to station 210. In some embodiments (e.g., where seed diamonds 112 are fluidized during diamond deposition), station 210 is cooled via a heat exchanger 214 that provides a substantially constant temperature across station 210 such that the carbon solubility is substantially constant throughout station 210.

Figure 2B:
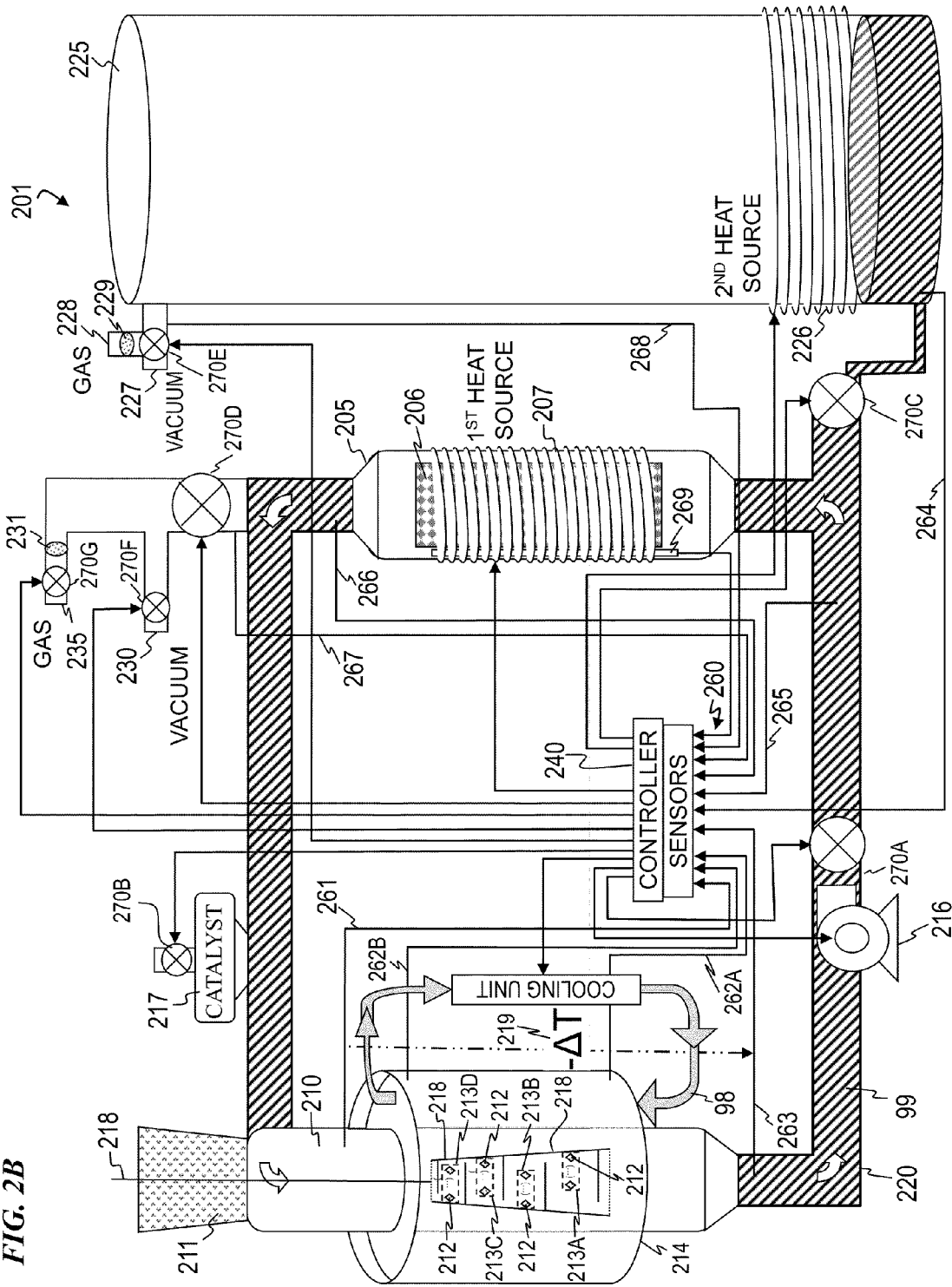
FIG. 2B is a cross-sectional block diagram of a fluidized-bed liquid-solvent diamond-deposition system 201 actively depositing diamond, wherein a pump is pumping solvent through the system in the same direction as the direction of solvent flow induced by the thermal convection caused by the temperature gradient.

In some embodiments, diamond-deposition station 210 operates as a fluidized bed. For example, since the density of seed diamonds 212 (3.8 $g\text{-}cm^{-3}$) is more than that of a light metal such as liquid sodium (less than 1 $g\text{-}cm^{-3}$), in some embodiments (as illustrated in FIG. 2A), seed diamonds 212 are suspended by flowing solvent 99 (e.g., molten sodium) upwards in station 210. However, since the density of seed diamonds 212 (3.8 $g\text{-}cm^{-3}$) is less than that of a heavy metal such as liquid lead (more than 8 $g\text{-}cm^{-3}$), in some embodiments, seed diamonds 212 are suspended by flowing solvent 99 (e.g., lead) downwards in station 210 (as illustrated in FIG. 2B). In some embodiments, as illustrated in FIG. 2A, station 210 has a larger diameter than conduit 220 in order to reduce the velocity of solvent 99 through station 210 and increase the resident dwell time of solvent 99 in station 210. In some embodiments, the increase in resident dwell time provides more contact time between solvent 99 and seed diamonds 212, thereby allowing more carbon to deposit onto seed diamonds 212.

In some embodiments, a pump 216 (e.g., mechanical, eddy-current (e.g., as described in U.S. Pat. No. 3,038,409 (which, in some embodiments, can be used to pump a carbon-bearing liquid solvent (e.g., a molten metal such as sodium or a sodium-potassium solution or other suitable liquid solvent) in a liquid-solvent diamond-deposition system such as provided in some embodiments of the present invention), which is hereby incorporated by reference), or other suitable pump) pumps solvent 99 through conduit 220 in the desired direction (e.g., in a clockwise direction as illustrated in FIG. 2A). In some embodiments, the direction of flow desired for solvent 99 depends on the relative densities of solvent 99 and seed diamonds 212 as discussed above. For example, in some embodiments, the clockwise flow of solvent 99 in FIG. 2A is desired because molten sodium (which is less dense than seed diamonds 212) is used as solvent 99.

In some embodiments, as illustrated in FIG. 2A, mechanical pump 216 counters the flow direction of solvent 99 through conduit 220 that would be caused by temperature gradient 219 if there was no pump 216 (i.e., in some embodiments, temperature gradient 219 would have caused solvent 99 to flow in a counter-clockwise direction due to less-dense hot solvent 99 that would rise up through hotter carbon-addition station 205 and the more-dense cooler solvent that would sink down through the cooler diamond-deposition station 210, but mechanical pump 216 overcomes the thermal gradient and pumps solvent 99 in a upward direction in diamond-deposition station 210, resulting in an overall clockwise solvent 99 flow). In other embodiments (as illustrated in FIG. 2B), a mechanical pump 216 assists the thermal flow by pumping solvent 99 in the same direction as the flow direction that would be caused by temperature gradient 219 if there was no pump 216 (i.e., in some embodiments, temperature gradient 219 causes solvent 99 to flow in a counter-clockwise direction due to solvent 99 rising up through hotter carbon-addition station 205 and sinking down through the cooler diamond-deposition station 210, and mechanical pump 216 also pumps solvent 99 in a counter-clockwise direction).

Figure 2C:
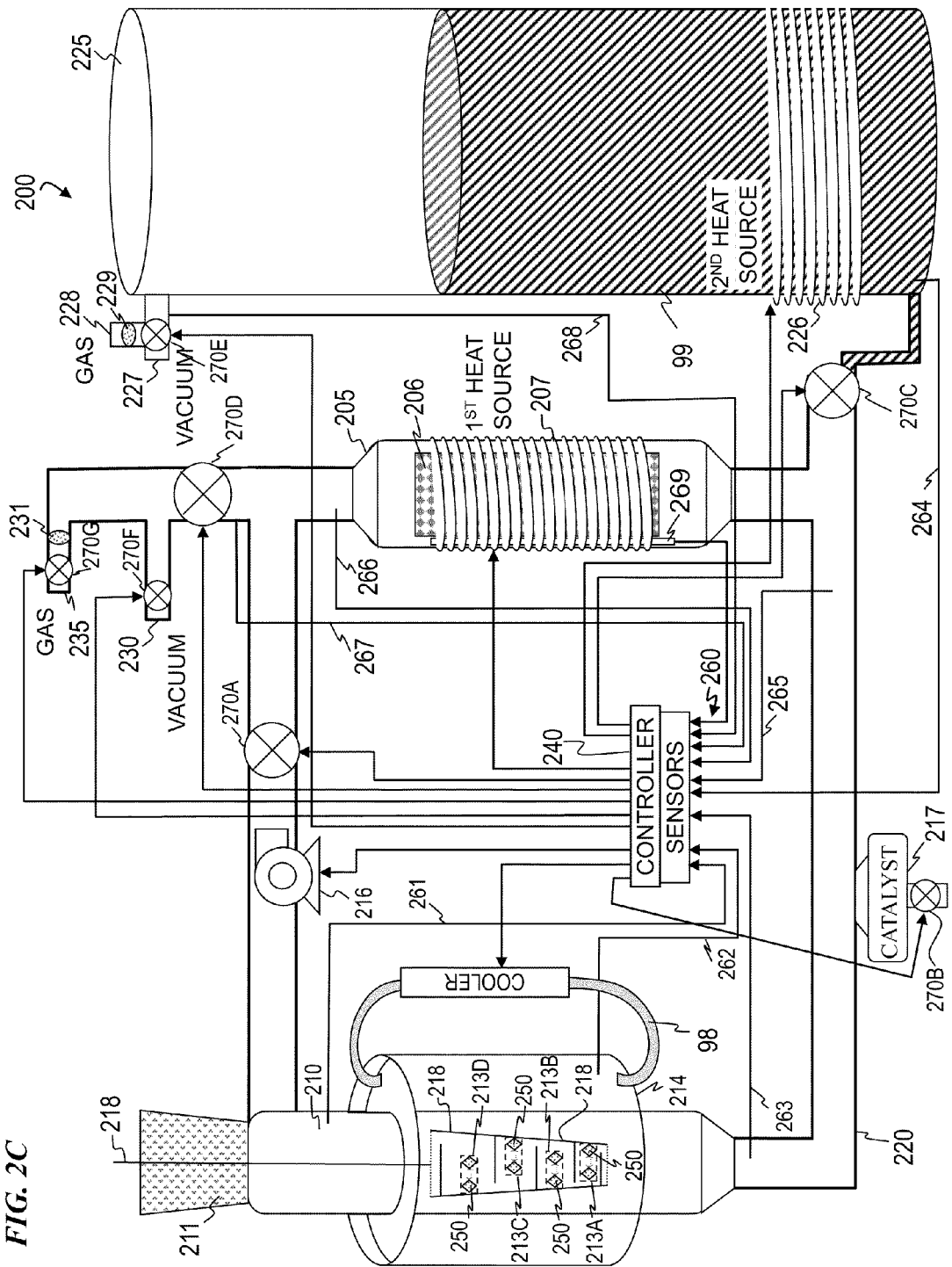
FIG. 2C is a cross-sectional block diagram of fluidized-bed liquid-solvent diamond-deposition system 200 during removal of grown diamonds.

In some embodiments, diamond seeds 212 are prevented from being flushed through station 210 by growth stations 213. In some embodiments, growth stations 213 are attached to frame 218 such that the finished diamonds can be removed by pulling frame 218 up into retrieval port 211. In some embodiments, prior to starting diamond deposition, each seed diamond 212 is placed on its own growth station 213, and during diamond deposition, each seed diamond 212 floats above (or within) its respective station 213 in the fluidized-bed configuration discussed above. In some embodiments, the portion of frame 218 that contains the growth stations 213 includes a perforated top and bottom (as depicted in FIGS. 2A-2C) such that solvent 99 can flow through frame 218 and through each growth station 213 during diamond deposition.

In some embodiments, growth stations 213 include completely-enclosed cages made of a corrosion-resistant material (e.g., in some embodiments, 304-type stainless steel) and having sufficiently small holes sized to prevent the loss of seed diamonds 212 in a fluidized-bed liquid-solvent diamond-deposition system 200 such that solvent 99 flows through the cages 213, and seed diamonds 212 float within their respective growth stations 213 during diamond deposition. The use of completely-enclosed cages ensures that seed diamonds 212 do not flow completely through station 210 during diamond deposition. In some embodiments, growth stations 213 are made of a material having a high carbon content (e.g., carburized steel). In some embodiments (as illustrated in FIG. 2A), growth stations 213 are arranged in a step configuration such that solvent 99 flows through station 210 in an evenly-dispersed manner (i.e., each growth station 213 gets exposed to approximately the same amount of solvent 99 and thus approximately the same amount of carbon is dispersed at each growth station 213). In other embodiments, growth stations 213 are arranged in a configuration other than a step configuration. In some embodiments, (e.g., where solvent 99 is less dense than the diamonds and/or flows at a sufficiently high rate in a downward direction in diamond-deposition station 210 such that seed diamonds 212 settle or are forced onto the bottom of growth stations 213 during diamond deposition) growth stations 213 are configured such that stations 213 are intermittently shaken and/or turned (e.g., rotated around a horizontal axis) during diamond deposition to rotate seed diamonds 212, thereby promoting equally-distributed diamond-crystal growth. In some embodiments, a sound-transducer diaphragm, ultrasonic transmitter or other suitable vibration source that is external to station 210 is operatively connected to each station 213 via frame 218 in order to provide the intermittent shaking of stations 213.

In some embodiments, the screens of caged growth stations 213 (e.g., steel-screen cages) are made using an etching technique such as described in U.S. Pat. No. 4,105,493 titled "Production of shaving foil" (which, in some embodiments, can be used to create steel screens having very small holes that prevent the loss of seed diamonds in a fluidized-bed liquid-solvent diamond-deposition system such as provided in some embodiments of the present invention), and incorporated herein by reference. In some embodiments, the mesh size of the screen is set to be of a size that keeps the diamond seeds of a size selected for use/

In some embodiments, a controller 240 senses various parameters of system 200 and automatically controls (using look-up tables (e.g., one or more computer look-up tables containing values for control parameters that are looked up based on the sensed signals and then used to control one or more processes) or feedback circuits or the like) a plurality of parameters of system 200 (e.g., gas pressure above solvent 99 (e.g., enough pressure to keep the solution from boiling), flow rates of solvent 99, various temperatures, and other similar parameters) such that the optimal conditions for diamond deposition exist. In some embodiments, controller 240 receives data regarding system 200 from a plurality of sensors 260, processes the data, and outputs the control signals necessary for optimum diamond deposition to a variety of control devices located in system 200. In some embodiments, the plurality of control devices includes one or more individual variable-flow valves 270A-270G. In some embodiments, the plurality of sensors 260 includes individual sensors 261-269. For example, in some embodiments, controller 240 receives data from sensor 266 (located just downstream of station 205) and sensor 269 (in some embodiments, a thermocouple that reads the temperature inside station 205) regarding solvent 99 flow rate and temperature, and if, after processing the data, controller 240 determines that more heat and flow rate are required, controller 240 sends out signals to mechanical pump 216, valve 270A, and/or heat source 207 to meet the necessary flow rates and temperatures.

In some embodiments, solvent 99 includes molten metal (e.g., sodium), the temperature at carbon-addition station 205 is controlled to a suitable value in a range of approximately 600-880 degrees Celsius, and the temperature at diamond-deposition station 110 is controlled to a suitable value such that epitaxial deposition at station 210 is optimal (e.g., in some embodiments, the temperature at station 210 is approximately 250-300 degrees cooler than the temperature at carbon-addition station 205). (Sodium has a melting point of 370.87 K (or 97.72 degrees C. (207.9° F.)) and a boiling point (at standard pressure) of 1156 K (or 883° C. (1621° F.)) and is thus liquid within a 785.13 K range, but will remain liquid over a larger range if the pressure is increased.)

In some embodiments, system 200 is pressurized via gas source 235 (e.g., an inert gas such as argon) during diamond deposition in order to raise the temperature of the solvent above its normal boiling point (i.e., its boiling point at atmospheric pressure) without actually experiencing solvent boiling. In some embodiments, the ability to raise solvent temperature results in higher carbon solubility into solvent 99, and therefore, improved diamond deposition on a larger number of seed or a larger area of diamond-deposition surface. In some embodiments, solvent 99 includes liquid sodium, system 200 is pressurized such that the temperature at carbon-addition station 205 is controlled to a suitable value in a range of approximately 850-950 degrees Celsius, and the temperature at diamond-deposition station 210 is controlled to a suitable value such that epitaxial deposition at station 210 is optimal (e.g., in some embodiments, the temperature at station 210 is approximately 250-300 degrees cooler than the temperature at carbon-addition station 205).

In some embodiments, conduit 220 is made of a corrosion-resistant (e.g., in some embodiments, 304-type stainless steel), or substantially non-reactive material that can withstand the temperatures and pressures necessary for operating system 200. In some embodiments, the material makeup of conduit 220 varies throughout system 200. For example, in some embodiments, the hot leg of conduit 220 (i.e., the portion of conduit 220 running through station 205 and from station 205 to station 210) is made of a material that includes 304-type stainless steel, and the cold leg of conduit 220 (i.e., the portion of conduit 220 running through station 210 and from station 210 to station 205) is made of a material that has a high carbon content (e.g., in some embodiments, carburized steel) such that carbon carried in solvent 99 will prefer depositing on seed diamonds 212 rather than diffusing into the walls of conduit 220. In some embodiments, the hot leg of conduit 220 is made of a material that includes nickel.

Figure 4A:
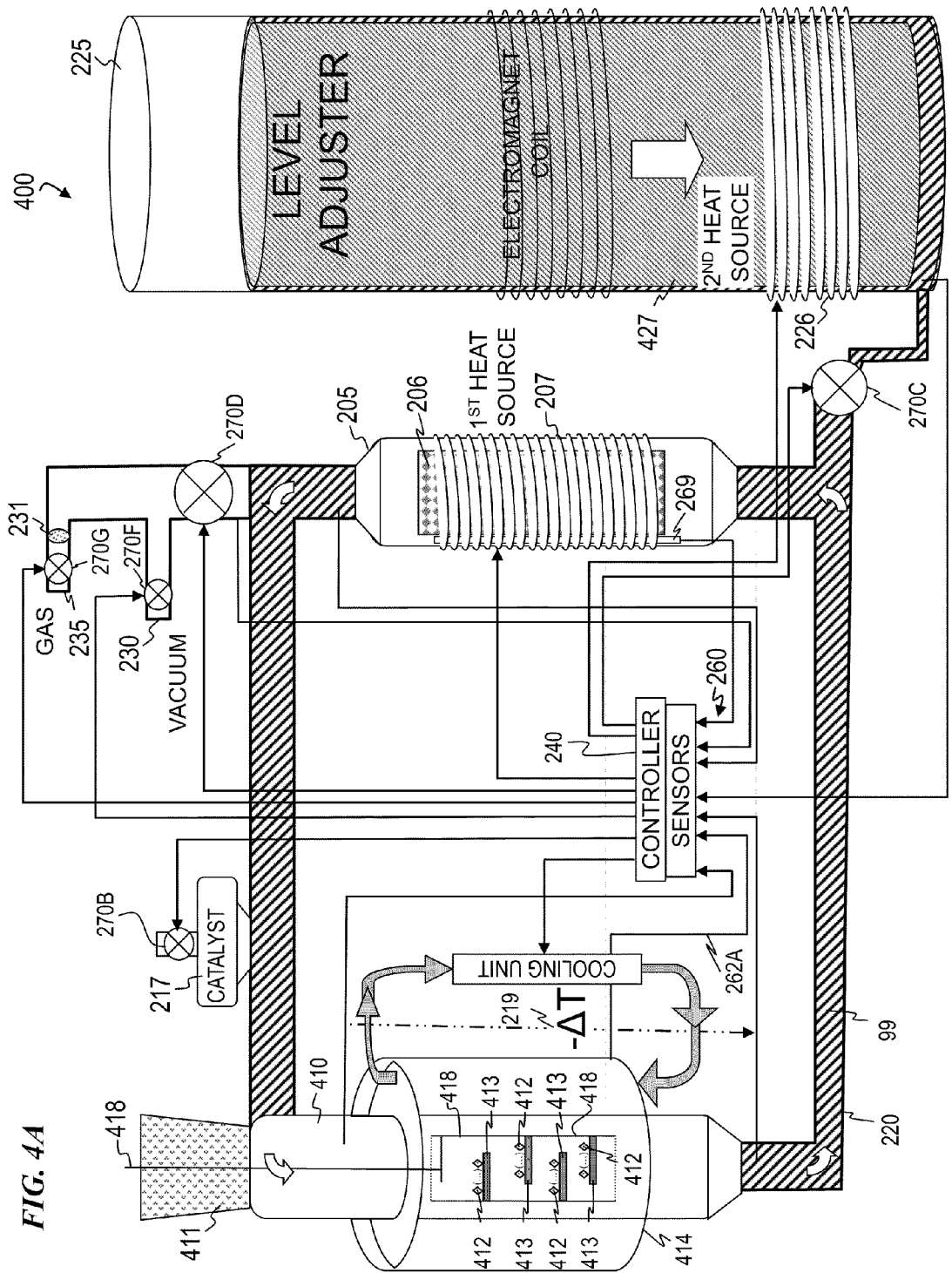
FIG. 4A is a cross-sectional block diagram of a liquid-solvent diamond-deposition system 400, wherein the seed diamonds are held in a stationary position by growth stations during diamond deposition.

In some embodiments, an optional catalyst 217 (e.g., in some embodiments, hydrogen) is provided during diamond deposition to catalyze the epitaxial deposition of carbon at diamond-deposition station 210. In some embodiments, instead of introducing catalyst 217 downstream of station 205 (as illustrated in FIGS. 2A, 2B, and 4A), catalyst 217 is introduced in station 205 itself. In some embodiments, since hydrogen forms Group I metal hydrides that decompose at high temperatures, catalyst source 217 includes a metal hydride (e.g., if hydrogen is the catalyst, the metal hydride decomposes to release the hydrogen into the solvent). In some embodiments, a hydrogen-containing gas is used as the catalyst source, wherein the hydrogen is released from the gas into solvent 99. For example, sodium hydride (NaH), which dissolves in molten sodium, decomposes at 800 degrees Celsius (see FIG. 1C), a temperature well within the range of the present invention. In some embodiments, catalyst 217 includes methane (in some embodiments, methane provides both a source of hydrogen catalyst and a source of carbon). In other embodiments, catalyst 217 includes a hydrocarbon other than methane. In some embodiments, catalyst 217 includes hydrogen gas.

FIG. 2C is a cross-sectional view of a fluidized-bed liquid-solvent diamond-deposition system 200 during removal of grown diamonds 250. In some embodiments, when diamond deposition is complete (e.g., when diamonds with the desired size have been grown), a vacuum is pulled on reservoir 225 via vacuum source 227 and an inert gas (e.g., helium) is released (e.g., from a pressurized cylinder) into system 200 from gas source 235 to force solvent 99 out of conduit 220 and into reservoir 225 such that grown diamonds 250 can be retrieved through port 211. In some embodiments, after solvent 99 is completely removed from conduit 220 (as illustrated in FIG. 2C), and prior to the next diamond-deposition run, system 200 is cleaned out by alternatively pumping inert gas (e.g., argon) from gas source 235 through system 200 and pulling a vacuum on system 200 via vacuum source 230. During the pressurizing of system 200, in some embodiments, a getter 231 (e.g., in some embodiments, a heated zirconium getter or other suitable getter such as are well known in the vacuum-tube art) filters out any oxygen, nitrogen, water vapor or other like contaminants that may be in system 200. In some embodiments, before fresh solvent 99 is introduced into system 200, a cleaning solvent (e.g., an alcohol) is run through system 200 to clear out any unwanted surface contaminants, and system 200 is then heated and/or vacuum dried to remove any residual solvent.

In some embodiments, grown diamonds 250 are removed from station 210 by pulling a frame 218 containing grown diamonds 250 up into retrieval port 211. In some embodiments, as depicted in FIG. 2A, port 211 includes a glove box 215 or other suitable enclosure that allows manipulation of its interior components without exposing the interior of the diamond-deposition system to atmospheric contaminants such as oxygen and water vapor (which could react with the sodium or other solvent and interfere with the deposition process). In some such embodiments, glove box 215 has storage facilities for holding a plurality of seed-diamond loads and a plurality of grown-diamond loads, in order that a plurality of diamond-deposition runs may be processed without having to open the interior portions of the conduit 220 and diamond-deposition station 210 to the external atmosphere, thus reducing the amount of purging and cleaning of those interior portions of system 200. As used herein, a "seed-diamond load" is a unit of seed diamonds (also referred to as seeds), and "grown-diamond load" refers to the resulting unit of grown diamonds that were grown in diamond-deposition station 210 from the seeds and then harvested as commercial-sized or grown diamonds, such that once one load is processed, another is started. In some embodiments, a substantially continuous process is used, wherein diamond crystals are periodically or continuously added to the solvent and grown diamonds are periodically or continuously harvested (see the descriptions of FIG. 7A-7E, FIG. 8 and FIG. 9 below). In some embodiments, port 211 contains its own source of inert gas (e.g., helium) such that port 211 is purged with inert gas before frame 218 is pulled into port 211. In some embodiments, port 211 includes a getter (e.g., a zirconium getter) that helps remove unwanted contaminants from the inert purge gas.

Figure 2D:
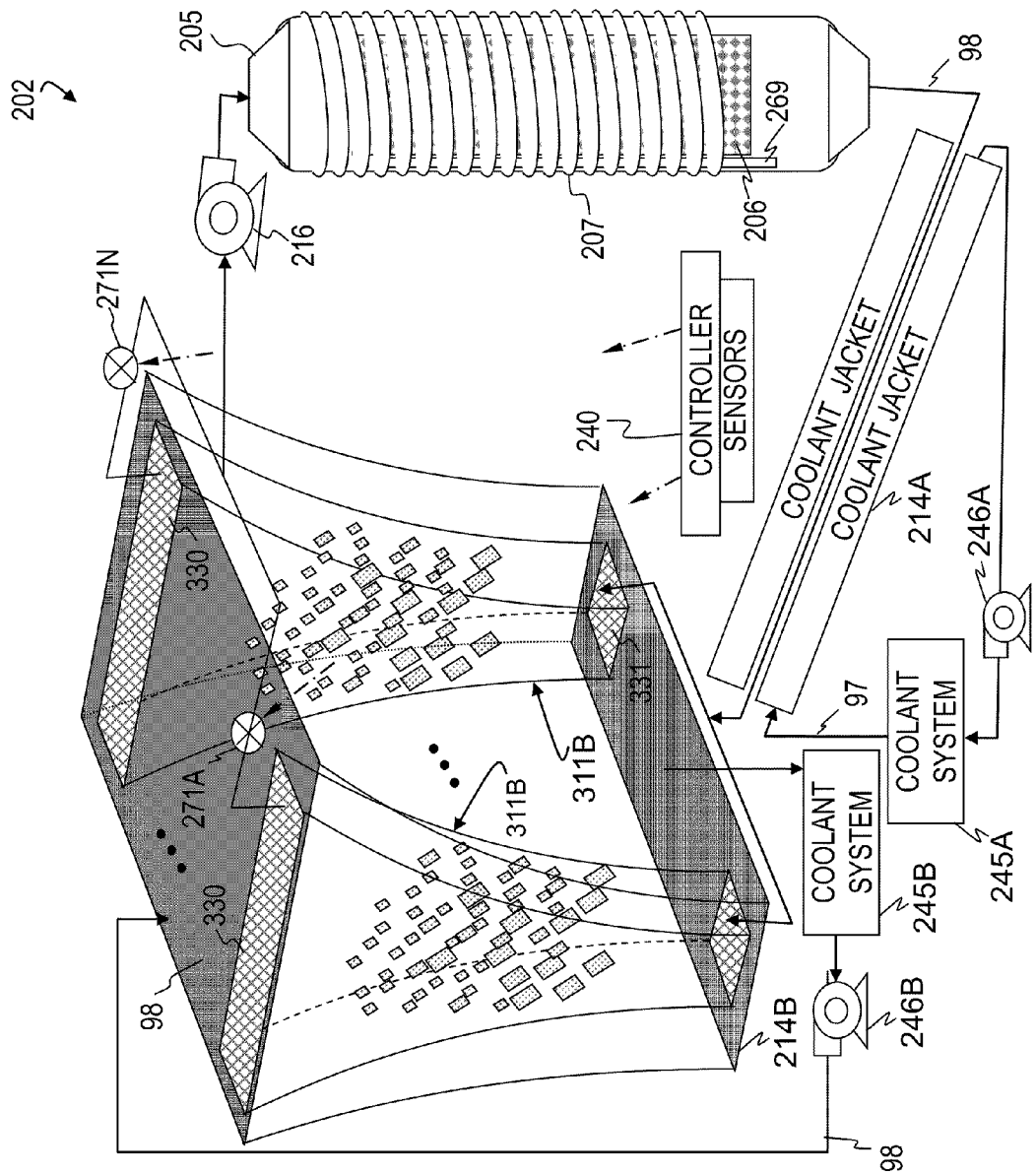
FIG. 2D is a perspective schematic diagram of a fluidized-bed liquid-solvent diamond-deposition system 202 using motor-pumped flow and a plurality of deposition stations having independent flow control.

FIG. 2D is a perspective schematic diagram of a fluidized-bed liquid-solvent diamond-deposition system 202 using motor-pumped flow and a plurality of deposition stations having independent flow control. In some embodiments, system 202 includes a plurality of diamond-deposition stations 311B (as described below in FIG. 3E) that are running in parallel and each of whose flow is independently controlled (e.g., using variable-flow valves 271A through 271N). This independent control of the flow in each diamond-deposition station 311B allows more precise control of the levels at which each size of growing diamond is suspended. (In some embodiments, in general, smaller diamond particles will be suspended further up in the flow, while larger diamonds will sink to a lower level. Because the diamond-deposition stations 311B increase in cross-sectional area toward the top regions, the flow velocity in the upward direction slows, which allows the smaller particles to suspend at a level corresponding to their size. The cross-sectional area is further increased such that even the smallest seed used will reach a suspension equilibrium level in the diamond-deposition stations 311B rather than being swept out by the flow. Just in case, some embodiments include a screen 330 at the top exit port and a screen 331 at the bottom entry port for the solvent, to prevent loss of diamond seeds not sufficiently controlled by the flow control and the slowing flow toward the top of each diamond-deposition stations 311B.

In some embodiments, each diamond-deposition station 311B has substantially upward flow of a carbon carrying solvent that is less dense than the growing diamonds which keeps the diamonds suspended in the solvent, promoting even growth on all faces of the diamonds. In some embodiments, each diamond-deposition station 311B has substantially flat parallel faces that face the adjacent diamond-deposition station(s) 311B allowing substantially even flow of coolant in a counter-flow configuration (solvent flows generally upward in the diamond-deposition stations 311B while the coolant in jacket 214B flows in a generally downward direction). In some embodiments, the rate of cross-sectional area increase per unit of upward direction accelerates toward the top of diamond-deposition stations 311B so that the upward velocity of the solvent becomes progressively slower as it reaches the upper-most regions of diamond-deposition stations 311B (the solvent flow becomes very slow), in order to provide the desired level of suspension (not having them swept away or forced into the top retention screen 330) for those diamonds that are still very small.

In some embodiments, a shaped manifold (shaped in a manner that follows the curved sides and flat faces of the diamond-deposition stations 311B to contain and direct the coolant onto the sides of diamond-deposition stations 311B evenly) is provided in order to provide an even flow of coolant along the sides of the diamond-deposition stations 311B to prevent some spots from being left too hot or cooled too much. In some embodiments, two or more coolant circulating systems are provided to obtain a finer control of the amounts, locations and rates of cooling provided to the solvent (e.g., in some embodiments, a first coolant system 245A circulates a first coolant 97 that cools the solvent (e.g., to air or water), a first pump 246A and a first cooling jacket 214A to cool the solvent to the temperature that is desired at the entries to diamond-deposition stations 311B (in some embodiments, first cooling jacket 214A is omitted if the solvent is sufficiently close to its desired saturation temperature for diamond deposition, in other embodiments, if the solvent 99 is to a temperature where carbon is depositing or precipitating in the conduit in the area of jacket 214A (such unwanted carbon could drift into the diamond-deposition station and interfere with the desired diamond deposition), the tube can be heated to prevent any (or an undue amount of) carbon from depositing in that conduit, and in still other embodiments, cooling by first cooling jacket 214A is needed to lower the temperature of solvent 99 to, or slightly above, its saturation point—i.e., the temperature is controlled to a level such that little or no deposition occurs in the conduits and substantially all (or a sufficiently large amount) of the carbon deposition from the solvent is occurring as diamond deposition on the diamond seeds). A second coolant system 245B circulates a second coolant 98 in a manner that cools the coolant 98 (e.g., to air or water), a second pump 246B and a second cooling jacket 214B using coolant 98 to cool the solvent to the different temperatures that are desired at each of the various levels along the solvent flow in the diamond-deposition stations 311B. This provides more precise control of the flow of solvent (via valves 271A-271N) and of the flow, temperatures and locations of coolant interaction (via the shaped jacket 214B, the pre-cooling jacket 214A, and the controlled temperatures provided by first coolant system 245A, first pump 246A, and first cooling jacket 214A and second coolant system 245B, second pump 246B and second cooling jacket 214B). In some embodiments, a single coolant system and a single coolant are used in place of both coolant systems shown in FIG. 2D. In some embodiments, a single large carbon-addition station 205 having one or more carbon sources 206, one or more heating elements 207 and one or more temperature sensors 269 provide sufficient carbon-bearing solvent through cooling jacket 214A, and the cooled spent solvent is returned by pump 206.

FIG. 2E is a perspective schematic diagram of a fluidized-bed liquid-solvent diamond-deposition system 203A using thermal-gradient-driven flow with a solvent that is less dense than the diamonds being grown. In some such embodiments, the solvent 99 becomes less dense as it is heated, and thermal convection (due to the differential effects of gravity on the various densities of the solvent) thus forces the less-dense hot solvent upward in carbon-addition station 205, and the solvent becomes denser as it is cooled, and gravity thus forces the more-dense cooled solvent downward in cooling jacket 214A. In some embodiments, after a desired amount of carbon is added to the solvent 99, for example, such that sufficient carbon is in solvent 99 so that its saturation temperature is 800 degrees, the solvent then exits the carbon solute and its temperature is further raised another 100 to 200 degrees (for example) to 900 or 1000 degrees at the top of the column of deposition station 205, and in cooling jacket 214A, the temperature is lowered back to the saturation temperature of 800 degrees at the bottom of cooling jacket 214A and the saturated solvent then enters diamond-deposition station 311B, and its temperature is further lowered in a temperature-gradient manner in diamond-deposition station 311B such that as the diamond is incrementally deposited, the temperature is incrementally lowered (e.g., from say 800 degrees at the entry to say 500 degrees at the exit), and the carbon level in the solvent is incrementally lowered such that the solvent is at about its saturation temperature (or such concentration as may be empirically determined to deposit diamond at a desired rate while avoiding depositing graphite-like material) at each level in diamond-deposition station 311B.

The carbon-depleted solvent 99 then re-enters carbon-addition station 205, where it again dissolves the carbon solute while its temperature rises, such that when the solvent again leaves the carbon solute, it has a carbon level that corresponds to a saturation temperature of 800 degrees. In some embodiments, a solvent pump is added to ensure the proper rate of solvent flow. In some embodiments, a variable-flow-control valve is added to regulate the rate of solvent flow that is desired. Because the solvent in this case is less dense than the diamonds being grown (e.g., using a sodium (Na) solvent), the fluidized bed of diamond-deposition station 311B uses an upward flow of solvent and the cross-sectional area of the fluidized bed of diamond-deposition station 311B increases the further up one measures the cross-sectional area (in some embodiments, the rate of increase in cross-sectional area increases toward the top, due, as shown, to the curved sides joining the flat parallel faces). In some embodiments, the solvent is further cooled in the fluidized bed of diamond-deposition station 311B, but the density increase due to the long cooling jacket 214A in this configuration forces a flow in the desired upward direction even though the solvent may be further cooled (e.g., by a cooling jacket 214B, see FIG. 2D) in the diamond-deposition station 311B.

FIG. 2F is a perspective schematic diagram of a fluidized-bed liquid-solvent diamond-deposition system 203B using thermal-gradient-driven flow with a solvent that is more dense than the diamonds being grown. This embodiment is similar to that shown in FIG. 2E, except that, because the solvent is more dense, the diamonds will tend to float and the solvent must flow downward in the fluidized bed of diamond-deposition station 341B. As in FIG. 2E, in some such embodiments, the solvent becomes less dense as it is heated, and gravity thus forces the less-dense hot solvent upward in carbon-addition station 205, and the solvent becomes denser as it is cooled, and gravity thus forces the more-dense cooled solvent downward in cooling jacket 214A. In some embodiments, the amount of cooling is controlled to keep the solvent 99 from becoming so cooled that carbon is depositing or precipitating out in the conduit in cooling jacket 214A or before it reaches diamond-deposition station 341B. Because the solvent in this case is more dense than the diamonds being grown (e.g., using a lead (Pb) solvent), the fluidized bed of diamond-deposition station 341B uses a downward flow of solvent and the cross-sectional area of the fluidized bed of diamond-deposition station 341B increases the further up one measures the cross-sectional area (in some embodiments, the rate of increase in cross-sectional area increases toward the bottom, due, as shown, to the curved sides joining the flat parallel faces). In some embodiments, the solvent is further cooled in the fluidized bed of diamond-deposition station 341B due to its own cooling jacket 214B (see FIG. 2D) in this configuration forces a flow in the desired upward direction even though the solvent may be further cooled in the diamond-deposition station 311B.

FIG. 2G is a perspective schematic diagram of a spiral-flow liquid-solvent diamond-deposition system 204 using pump-driven flow with a solvent that is less dense than the diamonds being grown. In some embodiments, system 204 inserts solvent 99 at nearly a horizontal tangent direction along the inside wall from an entry port 256 (e.g., a nozzle) of carbon-addition station 205, where in this case, carbon-addition station 205 is substantially cylindrical in shape. This imparts a spiral swirl to the solvent 99, which, in some embodiments, provides better heat transfer and carbon dissolving characteristics in carbon-addition station 205. In other embodiments, non-cylindrical shapes are used, but entry port 256 still imparts a spiral swirl to the solvent 99 within whatever shape is used. Solvent 99 leaves carbon-addition station 205 through exit port 266 at an opposite end of carbon-addition station 205 from entry port 256 and in some embodiments, solvent 99 is pumped using a pump 216 to entry port 258 (e.g., a nozzle) of diamond-deposition station 278, where, in some embodiments, solvent 99 is inserted initially in nearly a horizontal tangent direction along the inside of the outer wall of diamond-deposition station 278 from entry port 258. Although in the embodiment shown, the initial direction is nearly horizontal, the flow proceeds in an upward spiral until it leaves through exit port 268 and travels through a conduit to entry port 256 of carbon-addition station 205, where it repeats the above-described loop. In other embodiments, the initial direction is angled somewhat upward or downward and somewhat tangent to the outer wall of diamond-deposition station 278. In some embodiments, diamond-deposition station 278 is a concentric cylindrical toroid-like shape that surrounds an inner coolant-conducting cylinder 277, and in turn is surrounded by an outer coolant-conducting cylinder 279, each of which coolant-conducting cylinders circulate a coolant 98 in a counter-circulating spiral to the spiral of the solvent 99. In the embodiment shown, as viewed from above, the solvent 99 spirals upward in a clockwise direction, wherein the inner wall of carbon-addition station 205 is the outer wall of inner coolant-conducting cylinder 277, and the outer wall of diamond-deposition station 278 is the inner wall of outer coolant-conducting cylinder 279. In the embodiment shown, the solvent 99 spirals upward while the coolant 98 spirals downward. In other embodiments (not shown here), the solvent enters diamond-deposition station 278 at the top and spirals downward, and the coolant 98 enters inner coolant-conducting cylinder 277 and outer coolant-conducting cylinder 279 near their respective bottom ends and spirals upward to exit at their top ends. In some embodiments, the coolant 98 is circulated using a pump 275 through its loop (which includes cooler 261, and a parallel flow into entry port 259 and entry port 257. From these entry ports, the coolant 98 then spirals downward through outer coolant-conducting cylinder 279 to exit port 269, and spirals downward through inner coolant-conducting cylinder 277 to exit port 267). In some embodiments, a plurality of cages 213A, 213B, . . . 213C and 213D are located at a plurality of locations spread around the circumference within diamond-deposition station 278 and also spread up and down in the cylinder of diamond-deposition station 278, each cage located at a successively lower solvent temperature than the station preceding it. In other embodiments (not shown here), the walls of outer coolant-conducting cylinder 279, diamond-deposition station 278, and inner coolant-conducting cylinder 277 are other shapes, such as conical sections or curved-funnel shapes, and in some such embodiments, the diamond seeds again located in cages or on trays, while in other such embodiments, the diamond seeds are suspended in a spiral fluidized-bed-type flow pattern in such a funnel-shaped diamond-deposition station 278, wherein the flow pattern of solvent 99 is in a spiral shape having a larger diameter at elevations where slower solvent velocity is desired. In some embodiments of system 204, the spiral swirling flow of solvent 99 and/or of coolant 98 provides a better heat conduction between the solvent flow and the counter-direction coolant flow than is observed in non-spiral chambers described elsewhere herein.

FIG. 3A is a cross-sectional view of a fluidized-bed liquid-solvent diamond-deposition station 310, wherein no fixed or caged growth stations are used, but instead the diamonds are suspended in a fluid flow. In some embodiments, station 310 is interchangeable with station 210 depicted in FIGS. 2A and 2C. In some embodiments, station 310 has a smaller cross-sectional-area-per-vertical-distance at its lower portion and a larger cross-sectional-area-per-vertical-distance at its upper portion (e.g., a trapezoid-shaped station 310, as illustrated in FIG. 3A). This configuration is designed for situations where solvent 99 is less dense than seed diamonds 212 such that seed diamonds 212 sink to the bottom of station 310 during diamond deposition (e.g., where solvent 99 is a molten Group I Alkali Metal like sodium). In some embodiments, the rate of horizontal-cross-sectional-area increase per unit of vertical distance is selected to obtain a velocity profile that has a sufficiently high vertical velocity at the entry to suspend the growing diamonds (typically the larger diamonds) away from the solvent-entry end, and a sufficiently low vertical velocity at the solvent exit to suspend the growing diamonds (typically the smaller diamonds) away from the solvent-exit end. Since the velocity of solvent 99 slows as the cross-sectional-area-per-vertical-distance increases, the higher velocity of solvent 99 at the entrance of station 310 moves seed diamonds 212 and growing diamonds away from that solvent-entry vicinity and to a level between the bottom and top where the flow rate (and/or density or viscosity) of solvent 99 and the shape, size, and/or weight of individual seed diamonds 212 balance, thus keeping the seed diamonds 212, relative to the density, viscosity and/or flow rate of the solvent, in a circulatory suspension, rather than settling at a top or bottom wall (generally these entry and exit areas are screened, in some embodiments, to retain the diamonds within the station; see, for example, screens 330 and 331). In diamond-deposition stations 210 that have horizontal cross-sectional areas that are smaller at the entry and that increase in size toward the exit, the vertical velocity of solvent 99 will decrease from a higher value near the entry to a lower value near the exit, and this change in velocity accommodates various diamond characteristics (e.g., different sizes) that otherwise might settle to one end or the other of the diamond-deposition station 210. Although the use of liquid metals with higher density than diamond is discussed below, in some embodiments, the use of liquid metals with lower density than diamond is preferred since it is easier, in some embodiments, to contain seed diamonds 212 that do not float naturally.

In some embodiments, station 310 includes a top screen 330 and a bottom screen 331 in order to prevent seed diamonds 212 from flushing out of station 310 and from sinking through station 310, respectively. In some embodiments, screens 330 and 331 are made of a corrosion-resistant material (e.g., in some embodiments, 304-type stainless steel). In some embodiments, screens 330 and 331 are made of a material that has a high-carbon content (e.g., in some embodiments, carburized steel) such that the carbon atoms carried in solvent 99 prefer to deposit onto seed diamonds 212 over diffusing into screens 330 and 331. In some embodiments, an enlarged cross-sectional-area-per-vertical-distance on the upper portion of station 310 (and thus a slower solvent velocity through the upper section of station 310) also provides more contact time between solvent 99 and seed diamonds 212, thereby allowing more carbon to deposit onto seed diamonds 212.

Although the precise level (or range of levels) to which each individual seed diamond 212 suspends varies based, in part, on a given seed diamond's weight and size compared to the density, viscosity and flow rate of the solvent, in some embodiments, an average suspension level 320 for the plurality of seed diamonds 212 is controlled by controlling the flow rate of solvent 99 moving through station 310 via controller 240. In some embodiments, the suspension level (or range of levels) of an individual seed diamond 212 depends on the equilibrium between the weight and/or size of the given seed diamond 212 and the solvent velocity (cm/s), which in turn depends on solvent flow rate ($cm^3/s$) and cross-sectional area ($cm^2$), wherein changing the cross-sectional area changes the solvent velocity when the flow rate is constant.

In some embodiments, controller 240 also controls the cooling of station 310 such that station 310 is cooled to a substantially uniform temperature. In some embodiments, station 310 is circular (or oval) in horizontal cross section (for example, see FIG. 3D), such that the rate of horizontal cross-section area increases as the square of the vertical distance (in other similar embodiments, station 310 is formed of four sloped walls (e.g., as a square or rectangle in horizontal cross section) such that the cross section area increases as a square of the vertical distance). In other embodiments, station 310 is rectangular in horizontal cross section (for example, see FIG. 3E) with substantially flat parallel front and back faces (toward and away from the viewer as referenced in FIG. 3A), such that the rate of horizontal cross-section area increases linearly with increased vertical distance. By having parallel faces, the rate of area increase can be easily calculated and controlled by the shape of the left and right side walls. In still other embodiments (not shown) the front and back faces are not parallel, but provide another variable in the control of cross-sectional area change. In some embodiments, the varying cross-sectional-area-per-vertical-distance design includes shapes other than the trapezoidal vertical cross-section shape of station 310 of FIG. 3A.

For example, FIG. 3B is a vertical cross-sectional view of a fluidized-bed liquid-solvent diamond-deposition station 311, wherein the station 311 is substantially similar to the station 310 illustrated in FIG. 3A except that the station 311 has a funnel-like shape whose cross section has convex interior sides, rather than having a vertical-cross-section shape that is trapezoidal. In some embodiments, station 311 is circular (or oval) in horizontal cross section (for example, see station 311A in FIG. 3D), such that the rate of horizontal cross-section area increases as a power function of the shape of the side walls (e.g., as the cube or other function that depends on the shapes of all the walls) of the change in vertical distance. In other embodiments, station 311 is rectangular in horizontal cross section (for example, see station 311B FIG. 3E) with substantially flat parallel front and back faces (toward and away from the viewer as referenced in FIG. 3B), such that the rate of horizontal cross-section area increases as a function of the shape of the side walls (e.g., as the square or other function that depends on the rate of change of the distance between the left-hand and right-hand walls, since the front face and back face are parallel) with increased vertical distance. In some embodiments, station 311 is used as station 210 depicted in FIGS. 2A and 2C.

FIG. 3C is a vertical cross-sectional view of a fluidized-bed liquid-solvent diamond-deposition station 312, wherein station 312 is identical to station 310 except that the vertical cross-sectional shape of station 312 is somewhat hemispherical (if circularly symmetric around a vertical axis—in some embodiments, station 312 is circular (or oval) in horizontal cross section (for example, in a manner similar to station 311A in FIG. 3D), such that the rate of horizontal cross-section area increases as a partial power function of the shape of the side walls (e.g., such as $Y^{1.5}$ (where Y is based on vertical distance) or other power between 1 and 2, in some embodiments) of the vertical distance. In other embodiments, station 312 is rectangular in horizontal cross section (for example, see station 311B FIG. 3E) with substantially flat parallel front and back faces (toward and away from the viewer as referenced in FIG. 3B), such that the rate of horizontal cross-section area increases as, e.g., a square-root or sine function of the shape of the side walls (e.g., such as $Y^{0.5}$ (where Y is based on vertical distance) or other power between 0 and 1, or as sine(Y) or other suitable rate, in some embodiments) with increased vertical distance. In some embodiments, station 312 is used as station 210 depicted in FIGS. 2A and 2C.

FIG. 3D is a perspective schematic representation of a fluidized-bed liquid-solvent diamond-deposition station 311A, wherein the station has a vertical cross section as shown in FIG. 3B, and is oval or circularly symmetric in horizontal cross section.

FIG. 3E is a perspective schematic representation of a fluidized-bed liquid-solvent diamond-deposition station 311B, wherein the station has a vertical cross section as shown in FIG. 3B, but is rectangular in horizontal cross section, with substantially parallel front and back walls.

In some embodiments, in situations where solvent 99 is more dense than seed diamonds 212 such that seed diamonds 212 float to the top of a diamond-deposition station during diamond deposition (e.g., embodiments where solvent 99 is molten lead), stations 310, 311, and 312 are inverted such that each respective station has a larger cross-sectional-area-per-vertical-distance at its lower portion and a smaller cross-sectional-area-per-vertical-distance at its upper portion (see FIGS. 3F, 3G, and 3H).

FIG. 3F is a vertical cross-sectional block diagram of a downward-flow fluidized-bed liquid-solvent diamond-deposition station 340, wherein the station 340 has a cone-frustum shape having a trapezoidal cross section similar to station 310 of FIG. 3A, except upside down in order to accommodate solvents that are more dense than the diamond crystals.

FIG. 3G is a vertical cross-sectional block diagram of a downward-flow fluidized-bed liquid-solvent diamond-deposition station 341, wherein the station 341 has a funnel-like shape whose cross section has convex interior sides, similar to station 311 of FIG. 3B, except upside down in order to accommodate solvents that are more dense than the diamond crystals.

FIG. 3H is a vertical cross-sectional block diagram of a downward-flow fluidized-bed liquid-solvent diamond-deposition station 342, wherein the station 342 has a funnel-like shape whose cross section has concave interior sides similar to station 312 of FIG. 3C, except upside down in order to accommodate solvents that are more dense than the diamond crystals.

FIG. 3I is a perspective schematic representation of a fluidized-bed liquid-solvent diamond-deposition station 341A, wherein the station has a vertical cross section as shown in FIG. 3G, and is oval or circularly symmetric in horizontal cross section.

FIG. 3J is a perspective schematic representation of a fluidized-bed liquid-solvent diamond-deposition station 341B, wherein the station has a vertical cross section as shown in FIG. 3G, but is rectangular in horizontal cross section, with substantially parallel front and back walls.

In the embodiments of FIGS. 3F-3J, solvent 99 enters the respective diamond-deposition stations at the upper portion of each station such that the higher velocity at the upper entrance of each station moves seed diamonds 212 down and away from that solvent-entry vicinity and to a level between the bottom and top where the velocity of solvent 99 and the shape, size, and/or weight of individual seed diamonds 212, relative to the density, viscosity and/or velocity of the solvent, balance, thus keeping seed diamonds 212 in a circulatory suspension, rather than settling at a top or bottom wall (generally these entry and exit areas are screened, in some embodiments, to retain the diamonds within the station; see, for example, screens 330 and 331). In some embodiments, the inverted versions 340, 341 or 342 of stations 310, 311, and 312 are used for station 210 depicted in FIG. 2B.

FIG. 4A is a cross-sectional view of a liquid-solvent diamond-deposition system 400. In some embodiments, diamond-deposition station 410 is not a fluidized bed, and seed diamond(s) 412 are instead held in stationary position(s) during diamond deposition by growth stations 413. Since diamonds 412 do not need to be fluidized in diamond-deposition station 410, in some embodiments, system 400 does not use a pump and the flow of solvent 99 is induced solely by the thermal convection caused by temperature gradient 219. In other embodiments, a mechanical or other type of pump is used with the stationary-bed configuration of system 400. In some embodiments, growth stations 413 are arranged in a step configuration as illustrated in FIG. 4A, in order to provide a serpentine flow path for the carbon-bearing solvent.

In some embodiments, growth stations 413 include trays that allow solvent 99 to flow onto, across and past seed diamonds 412, but not through growth stations 413 (e.g., growth station(s) 413 include tray(s) having solid (rather than perforated) bottom surfaces, such that the solvent flows across the top(s) of the trays and over the diamonds held in the tray(s)). In some embodiments, growth stations 413 include enclosed perforated cages made of a corrosion-resistant material (e.g., in some embodiments, 304-type stainless-steel) that allows solvent 99 to flow past seed diamonds 412 and through the perforated walls of growth stations 413.

In some embodiments, (as illustrated in FIG. 4A) solvent 99 is moved between conduit 220 (where it circulates during the diamond-deposition process) and reservoir 225 (where it is stored during loading of the diamond seeds and unloading of the diamonds whose growth is complete, or when the system is turned off) by displacement of magnetic level adjuster 427 within reservoir 225. In some embodiments, magnetic level adjuster 427 is moved up and down within reservoir 225 by a magnet (either an electromagnet or a permanent magnet) that is external to reservoir 225. In some such embodiments, the solvent enclosure (e.g., conduit 220 and/or reservoir 225) includes tubing and/or cylinders made of fused-quartz or other suitable glass or glass-like materials that are usable to contain liquids up to 1100 degrees Celsius (centigrade) or more. In some embodiments, reservoir 225 includes a storage portion made of a metal (such as stainless steel) used to hold solvent when it is in a solid state and when it is being melted and/or solidified, in order that the expansion and contraction stresses that occur during melting and solidification do not overstress the fused-quartz and/or glass portions. In some embodiments, such a fused-quartz and/or glass portion allows control of magnetic level adjuster 427 from outside the container. In some embodiments, magnetic level adjuster 427 is moved up and down by a magnet located on the inside of reservoir 225. In other embodiments, solvent 99 is moved between reservoir 225 and conduit 220 via vacuum source 227 and/or gas source 228 of FIG. 2A.

Figure 4B:
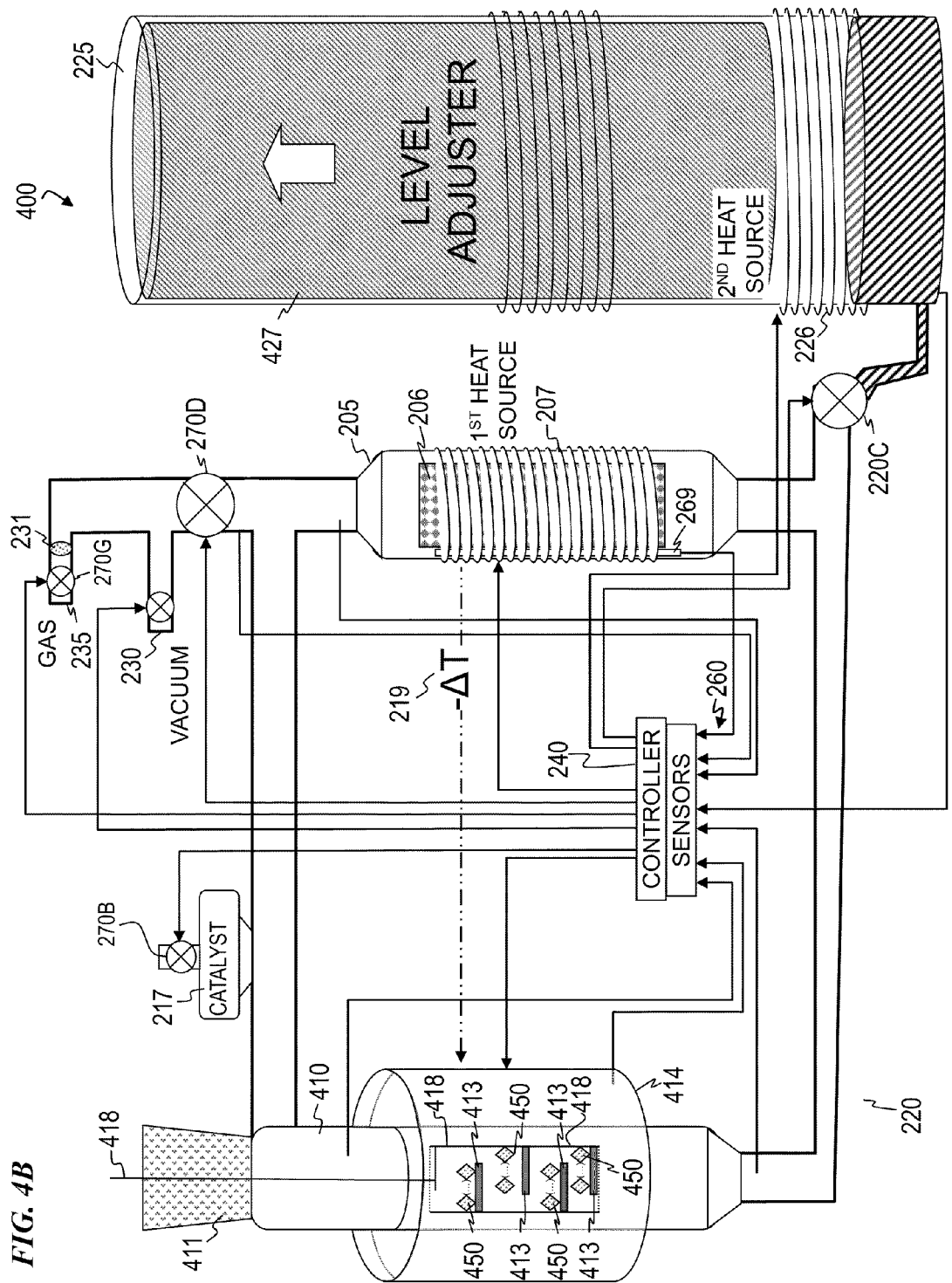
FIG. 4B is a cross-sectional block diagram of the liquid-solvent diamond-deposition system 400 of FIG. 4A during the removal of grown diamonds.

FIG. 4B is a cross-sectional view of liquid-solvent diamond-deposition system 400 during the removal of grown diamonds 450. In some embodiments, growth stations 413 are attached to a frame 418 such that grown diamonds 450 are removed by pulling frame 418 up into retrieval port 411. In some embodiments, the portion of frame 418 that contains the growth stations 413 includes a perforated top and bottom (as depicted in FIGS. 4A and 4B) such that solvent 99 can flow through frame 418 during diamond deposition. In some embodiments, port 411 includes a glove box or other suitable enclosure that allows manipulation of its interior components without exposing the interior to atmospheric contaminants such as oxygen and water vapor. In some such embodiments, the glove box has storage facilities for holding a plurality of seed-diamond loads (before growth) and a plurality of grown-diamond loads (after diamond growth), in order that a plurality of diamond-deposition runs may be processed without having to open the interior portions of the conduit 220 and diamond-deposition station 410 to the external atmosphere, thus reducing the amount of purging and cleaning of those interior portions of system 400. In some embodiments, port 411 contains its own source of inert gas (e.g., helium) such that port 411 is purged with inert gas before frame 418 is pulled into port 411. In some embodiments, solvent 99 is drained or otherwise removed from conduit 220 by vertically raising magnetic level adjuster 427 within reservoir 225 such that the resultant negative displacement causes the level of solvent 99 in conduit 220 to drop and empty into reservoir 225. In some embodiments, an inert gas from gas source 235 is pushed into conduit 220 to help remove any solvent 99 that does not return to reservoir 225 after level adjuster 427 is raised.

Figure 5A:
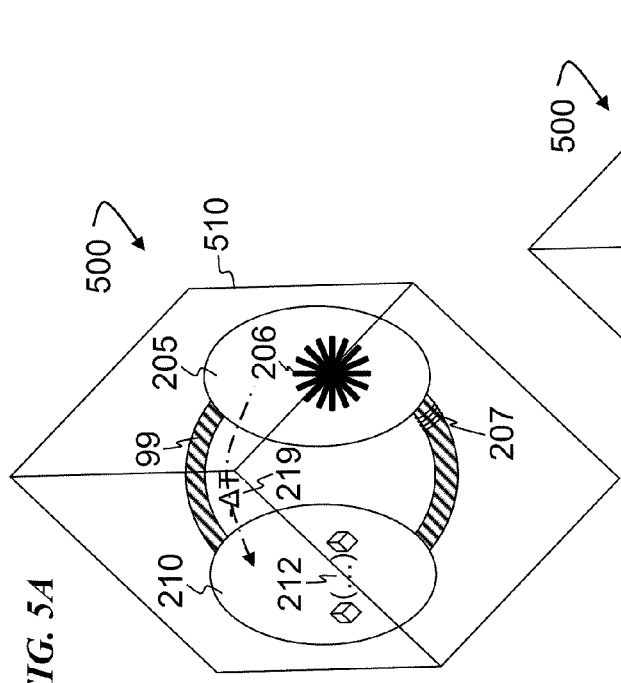
FIG. 5A is a schematic view of a liquid-solvent diamond-deposition system 500 enclosed in a pressurized chamber, wherein the carbon-transport mechanism includes channeled solvent flow, and wherein active diamond deposition is taking place.
Figure 5B:
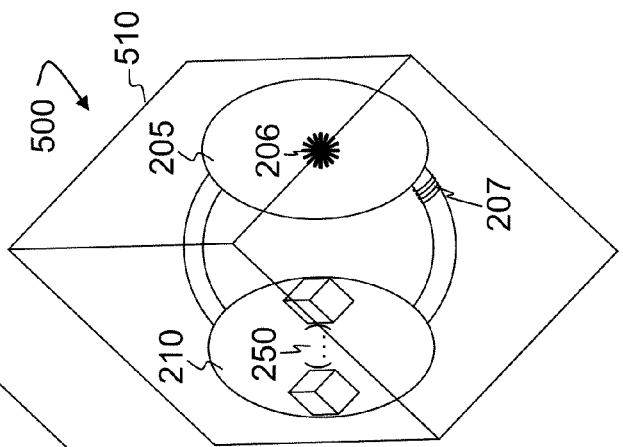
FIG. 5B s a schematic view of the liquid-solvent diamond-deposition system 500 of FIG. 5A, wherein diamond deposition has occurred.

In some embodiments, the process of the present invention can be practiced at an elevated (higher-than-normal pressure), for example by introducing pressurized gas into the conduit. In some embodiments, both the reservoir and conduit of the systems described above can be pressurized. In other embodiments, the systems described above can be enclosed in a pressurized chamber. FIG. 5A is an abstract schematic view of an embodiment wherein a liquid-solvent diamond-deposition system 500 that is enclosed in a pressurized chamber, wherein the carbon-transport mechanism includes channeled solvent flow, and wherein active diamond deposition is taking place. In some embodiments, system 500 combines a fluidized-bed configuration (e.g., system 200 in FIGS. 2A-2C) with pressurized chamber 510 or other pressurization mechanism that provides a higher-than atmospheric-pressure environment for the process of the present invention to take place. FIG. 5A therefore illustrates some of the individual elements found in system 200 including, but not limited to, carbon-addition station 205, carbon source 206, heat source 207 (the location of coil 207 in FIGS. 5A and 5B represents one embodiment—in other embodiments, coil 207 is placed at other locations within system 500), solvent 99, diamond-deposition station 210, seed diamonds 212, and temperature gradient 219. In some embodiments, station 210 includes a heat exchanger (not illustrated) which cools station 210 such that temperature gradient 219 is created across station 210. In some embodiments, one of stations 310, 311, or 312 (illustrated in FIGS. 3A, 3B, and 3C) replaces station 210 in system 500. In other embodiments, system 500 combines a stationary configuration (e.g., system 400 in FIGS. 4A-4B) with pressurized chamber 510.

In some embodiments, pressurized chamber 510 allows system 500 to raise the temperature of solvent 99 significantly higher than its normal boiling point (i.e., its boiling point at atmospheric pressure) without actually experiencing solvent boiling. In some embodiments, the ability to raise solvent temperature results in higher carbon solubility into solvent 99, and therefore, improved diamond deposition. In some embodiments, therefore, solvent 99 includes liquid sodium, system 500 is pressurized such that the temperature at carbon-addition station 205 is controlled to a suitable value in a range of approximately 850-950 degrees Celsius, and the temperature at diamond-deposition station 210 is controlled to a suitable value such that epitaxial deposition at station 210 is optimal (e.g., in some embodiments, the temperature at station 210 is approximately 250-300 degrees cooler than the temperature at carbon-addition station 205). (Sodium has a melting point of 370.87 K (or 97.72 degrees C. (207.9° F.)) and a boiling point (at standard pressure) of 1156 K (or 883° C. (1621° F.)) and is thus liquid within a 785.13 K range, but will remain liquid over a larger range if the pressure is increased.) In some embodiments, the pressure is increased by the addition of pressurized gas above the liquid sodium.

In some embodiments, pressurized chamber 510 is configured similarly to the growth chamber disclosed in U.S. Patent Application Publication 2006 288927 A1 (hereinafter "Chodelka et al."), titled "SYSTEM AND HIGH PRESSURE, HIGH TEMPERATURE APPARATUS FOR PRODUCING SYNTHETIC DIAMONDS", published Dec. 28, 2006, and incorporated herein by reference. In these embodiments, fluidized-bed liquid-solvent diamond-deposition system 200 or liquid-solvent diamond-deposition system 400 is modified such that the respective diamond-deposition system replaces reaction core 22 of Chodelka et al.

FIG. 5B s a schematic view of liquid-solvent diamond-deposition system 500, wherein diamond deposition is complete. As depicted in FIG. 5B, seed diamonds 212 have become grown diamonds 250, and solvent 99 has been removed from system 500 (thereby eliminating temperature gradient 219). In some embodiments, grown diamonds 250 are removed according to the procedure disclosed above in the description of systems 200 and 400.

Figure 6A:
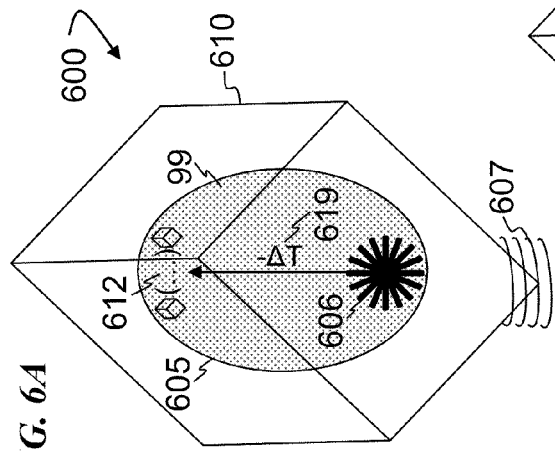
FIG. 6A is a schematic view of a liquid-solvent diamond-deposition system 600 enclosed in a pressurized chamber, wherein the carbon-transport mechanism includes open solvent flow, and wherein active diamond deposition is taking place.

FIG. 6A is an abstract schematic view of an embodiment wherein a liquid-solvent diamond-deposition system 600 enclosed in a pressurized chamber, wherein the carbon-transport mechanism includes open solvent flow, and wherein active diamond deposition is taking place. In some embodiments, system 600 includes seed diamonds 612, reaction chamber 605, temperature gradient 619, carbon source 606, pressure chamber 610, solvent 99, and heat source 607. In some embodiments, reaction chamber 605 is filled with solvent 99 (e.g., a molten alkali metal such as sodium) and the combination of the vertical configuration of chamber 605 and the temperature gradient 619 caused by heat source 607 and a heat exchanger at the top of chamber 605 (not illustrated) results in a flow of solvent 99 from carbon source 606 up to seed diamonds 612 and back down. As with the channeled solvent flow of system 500, carbon from carbon source 606 is transported by solvent 99 from carbon source 606 to seed diamonds 612 where the transported carbon then deposits in a diamond-crystal structure onto seed diamonds 612 (homoepitaxial deposition). In some embodiments, system 600 is less complex and therefore less costly than system 500 due to system 600's lack of channeled flow.

In some embodiments, solvent 99 is less dense than seed diamonds 612 (e.g., molten sodium), and therefore reaction chamber 605 functions as a fluidized bed similar to the fluidized-bed configurations disclosed in FIGS. 2A-2C and FIGS. 3A-3C. In other embodiments, solvent 99 is more dense than seed diamonds 612 (e.g., molten lead), and therefore seed diamonds 612 are held in a stationary position within reaction chamber 605 during diamond deposition.

In some embodiments, variations of each of the systems and processes of the present invention raise the temperature of solvent 99 significantly higher than its normal boiling point (i.e., its boiling point at atmospheric pressure) and raise the pressure in the system so the solvent 99 does not experience solvent boiling. In some embodiments, pressurized chamber 610 allows system 600 to raise the temperature of solvent 99 significantly higher than its normal boiling point (i.e., its boiling point at atmospheric pressure) without actually experiencing solvent boiling. In some embodiments, the ability to raise solvent temperature results in higher carbon solubility into solvent 99, and therefore, improved diamond deposition. In some embodiments, therefore, solvent 99 includes liquid sodium, system 600 is pressurized such that the temperature at the bottom of reaction chamber 605 is controlled to a suitable value in a range of approximately 850-950 degrees Celsius, and the temperature at the top of reaction chamber 605 is controlled to a suitable value such that epitaxial deposition at the top of chamber 605 is optimal (e.g., in some embodiments, the temperature at the top of chamber 605 is approximately 250-300 degrees cooler than the temperature at the bottom of chamber 605). (Sodium has a melting point of 370.87 K (or 97.72 degrees C. (207.9° F.)) and a boiling point (at standard pressure) of 1156 K (or 883° C. (1621° F.)) and is thus liquid within a 785.13 K range, but will remain liquid over a larger range if the pressure is increased.) In some embodiments, pressurized chamber 610 is configured similarly to the growth chamber disclosed in U.S. Patent Application Publication 2006 288927 A1 (hereinafter "Chodelka et al."), titled "SYSTEM AND HIGH PRESSURE, HIGH TEMPERATURE APPARATUS FOR PRODUCING SYNTHETIC DIAMONDS", published Dec. 28, 2006, and incorporated herein by reference.

Figure 6B:
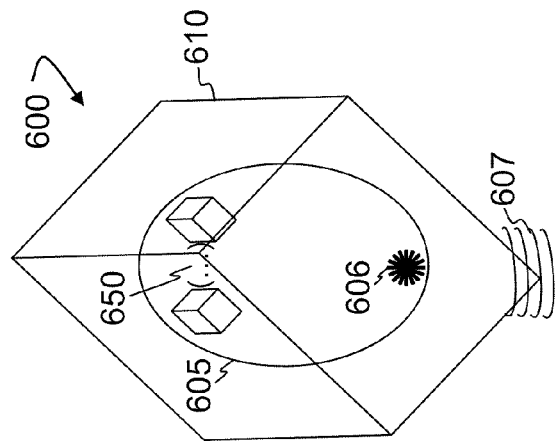
FIG. 6B is a schematic view of the liquid-solvent diamond-deposition system 600 of FIG. 6A, wherein diamond deposition has occurred.

FIG. 6B is a schematic view of liquid-solvent diamond-deposition system 600, wherein diamond deposition is complete. As depicted in FIG. 6B, seed diamonds 612 have become grown diamonds 650, and solvent 99 has been removed from system 600 (thereby eliminating temperature gradient 619).

Figure 7A:
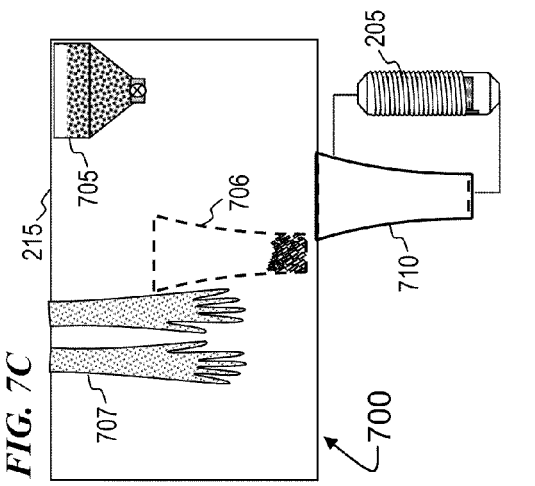
FIG. 7A is a schematic view of a liquid-solvent diamond-deposition system 700, wherein the seed diamond source 705 is contained within a glove box 215.

FIG. 7A is a schematic view of a liquid-solvent diamond-deposition system 700, wherein the seed diamond source 705 is contained within a glove box 215.

Figure 7B:
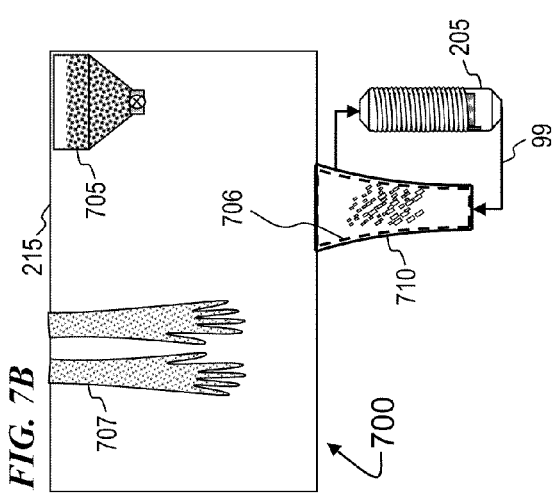
FIG. 7B is a schematic view of liquid-solvent diamond-deposition system 700 during diamond deposition.

FIG. 7B is a schematic view of liquid-solvent diamond-deposition system 700 during diamond deposition.

Figure 7D:
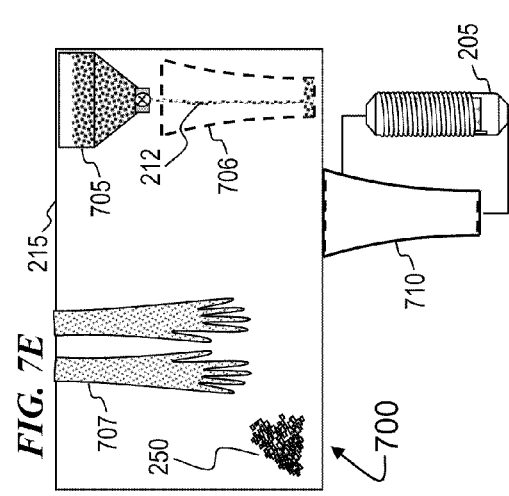
FIG. 7D is a schematic view of liquid-solvent diamond-deposition system 700 during removal of grown diamonds from the diamond-transfer basket 706.
Figure 7C:
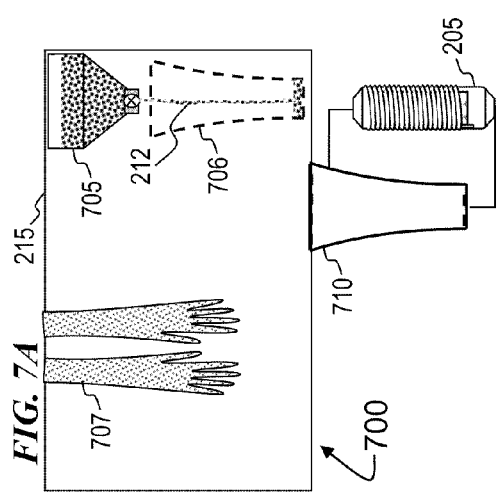
FIG. 7C is a schematic view of liquid-solvent diamond-deposition system 700 during removal of a diamond-transfer basket 706 from the deposition station 710.

FIG. 7C is a schematic view of liquid-solvent diamond-deposition system 700 during removal of a diamond-transfer basket 706 from the deposition station 710.

FIG. 7D is a schematic view of liquid-solvent diamond-deposition system 700 during removal of grown diamonds from the diamond-transfer basket 706.

Figure 7E:
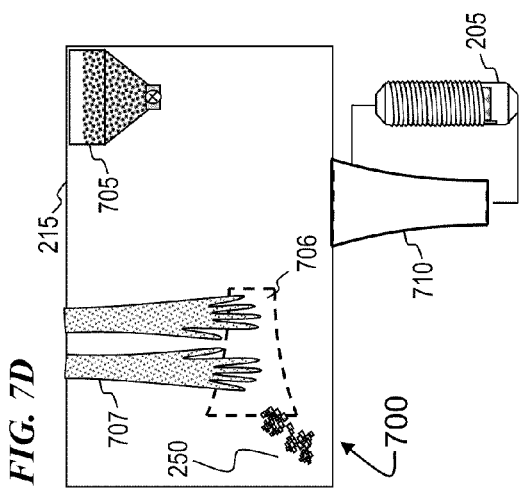
FIG. 7E is a schematic view of liquid-solvent diamond-deposition system 700 during refilling of the diamond-transfer basket with seed diamonds.

FIG. 7E is a schematic view of liquid-solvent diamond-deposition system 700 during refilling of the diamond-transfer basket with seed diamonds.

Together FIGS. 7A-7E depict successive stages or operations of a liquid-solvent diamond-deposition process, wherein a seed diamond source 705 is contained within a glove box 215 (substantially similar to glove box 215 depicted in FIG. 2A) (or equivalently connected in a sealed manner outside the main cavity of the glove box such that it can supply seed material to the inside of the glove box 215) such that a plurality of grown diamonds 250 can be processed within glove box 215 before seed source 705 and/or carbon source 206 has to be refilled and/or replenished (i.e., at least partially refilled), thereby reducing the amount of purging and cleaning of the interior portions of glove box 215. In some embodiments, glove box 215 (or a separate but similar glove box) connects to carbon-addition station 205, and is configured to allow exchange or addition of carbon source material 206 to that input portion of the system 700.

In some embodiments, a plurality of grown diamonds 250 (e.g., in a plurality of individual loads, or as a continuous process wherein seeds are substantially continuously added and grown diamonds are substantially continually removed from diamond-deposition station 710) are processed before seed source 705 needs to be replenished. In some embodiments, at least five grown diamonds 250 are processed before source 705 needs to be replenished. In some embodiments, at least ten grown diamonds 250 are processed before source 705 needs to be replenished. In some embodiments, at least twenty grown diamonds 250 are processed before source 705 needs to be replenished. In some embodiments, at least fifty grown diamonds 250 are processed before source 705 needs to be replenished. In some embodiments, at least one hundred grown diamonds 250 are processed before source 705 needs to be replenished. In some embodiments, at least two hundred grown diamonds 250 are processed before source 705 needs to be replenished. In some embodiments, at least five hundred grown diamonds 250 are processed before source 705 needs to be replenished. In some embodiments, at least a thousand grown diamonds 250 are processed before source 705 needs to be replenished. In some embodiments, at least two thousand grown diamonds 250 are processed before source 705 needs to be replenished. In some embodiments, at least five thousand grown diamonds 250 are processed before source 705 needs to be replenished. In some embodiments, at least ten thousand grown diamonds 250 are processed before source 705 needs to be replenished.

In some embodiments, seed diamonds 212 are added from source 705 to a diamond-transfer basket 706 within glove box 215 (see FIG. 7A), basket 706 is transferred using gloves 707 into a diamond-deposition station 710 and a fluidized-bed diamond-deposition process begins (see FIG. 7B), basket 706 is removed from diamond-deposition station 710 using gloves 707 (see FIG. 7C), grown diamonds 250 are dumped out of basket 706 using gloves 707 into a storage area within glove box 215 (see FIG. 7D), and basket 706 is refilled with seed diamonds 212 (see FIG. 7E). In some embodiments, basket 706 includes at least a screened bottom entry and a screened exit at an upper side wall, while the top is open or includes an opening through which the seed diamonds can be added and the grown diamonds may be withdrawn or poured out.

In some embodiments, seed diamond source 705 is a hopper or other suitable container. In some embodiments, basket 706 is an enclosed, perforated cage made from a corrosion-resistant material to which the solvent and carbon do not substantially interact (e.g., stainless steel), such that a molten-metal carbon-bearing solvent can flow up through basket 706 during diamond deposition. In some embodiments, diamond-deposition station 710 is substantially similar to diamond-deposition station 210 depicted in FIGS. 2A-2C and/or diamond-deposition stations 310, 311, or 312 depicted in FIGS. 3A, 3B, and 3C, respectively, and in some embodiments, carbon-addition station 205 is substantially similar to carbon-addition station 205 depicted in FIGS. 2A-2C and FIGS. 4A-4B. In some such embodiments, during diamond deposition, a molten carbon-bearing solvent 99 (e.g., molten sodium, molten sodium-potassium, or other suitable solvents; see FIG. 7B) circulates between carbon-addition station 205 and carbon-deposition station 710 such that carbon added at carbon-addition station 205 is brought to carbon-deposition station 710 and epitaxially deposits onto one or more seed diamonds 212 at carbon-deposition station 710.

Figure 8:
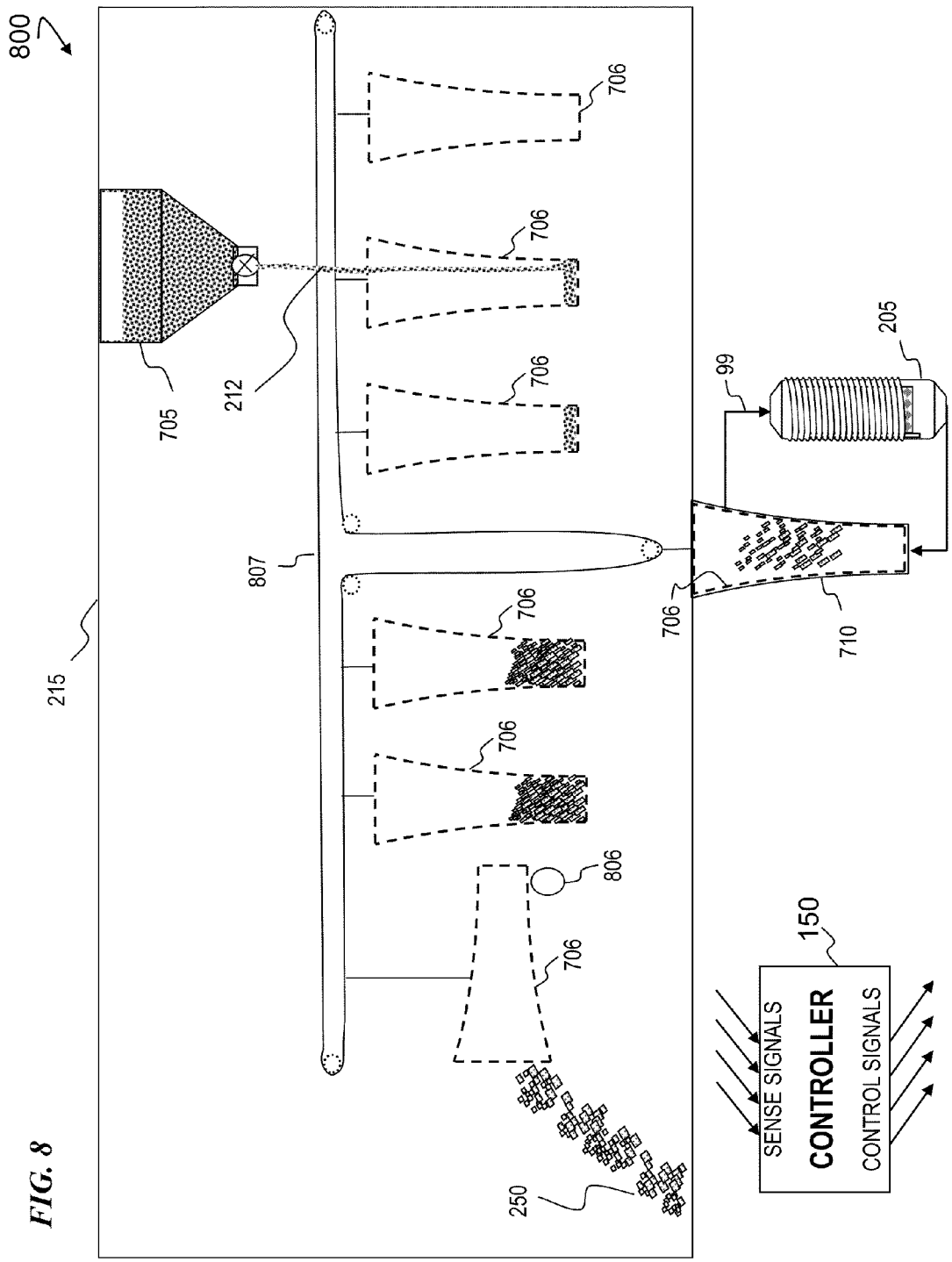
FIG. 8 is a schematic view of an automated liquid-solvent diamond-deposition system 800 that is substantially the same as diamond-deposition system 700 except that process 800 operates in a substantially automated and semi-continuous manner.

FIG. 8 is a schematic view of a liquid-solvent diamond-deposition system 800 that is substantially similar to diamond-deposition system 700 except that system 800 operates in a substantially automated and semi-continuous or batch manner. In some embodiments, an automated transfer mechanism 807 automatically transfers baskets 706 from one point of system 800 to another (in contrast to system 700, which requires manual transfer of basket 706). In some embodiments, device 806 provides a pivot point (or other suitable tipping mechanism) over which baskets 706 are tipped over in order to empty out grown diamonds 250 to a temporary storage location. In some embodiments, mechanism 807 moves a single basket 706 back and forth through system 800 (e.g., to the successive locations indicated by the several baskets shown in FIG. 8) during the overall diamond-deposition process. In other embodiments, mechanism 807 includes a plurality of baskets 706 that run in a semi-continuous loop through system 800 during the overall diamond-deposition process. In some embodiments, controller 150 receives sensor signals from a plurality of sensors monitoring system 800, processes those signals, and transmits one or more control signals to a plurality of process control devices in order to control diamond-deposition system 800. For example, in some embodiments, controller 150 controls the function of mechanism 807 such that baskets 706 are removed from diamond-deposition station 710 after a sufficient amount of time has passed (or a sufficient weight of diamond has been added) such that basket 706 contains grown diamonds 250.

In some embodiments, diamond-deposition station 710 is substantially similar to diamond-deposition station 210 depicted in FIGS. 2A-2C and/or diamond-deposition stations 310, 311, or 312 depicted in FIGS. 3A, 3B, and 3C, respectively, and in some embodiments, carbon-addition station 205 is substantially similar to carbon-addition station 205 depicted in FIGS. 2A-2C and FIGS. 4A-4B. In some such embodiments, during diamond deposition, a molten carbon-bearing solvent 99 (e.g., molten sodium, molten sodium-potassium, or other suitable solvents) circulates between carbon-addition station 205 and carbon-deposition station 710 such that carbon added at carbon-addition station 205 is brought to carbon-deposition station 710 and epitaxially deposits onto one or more seed diamonds 212 at carbon-deposition station 710.

Figure 9:
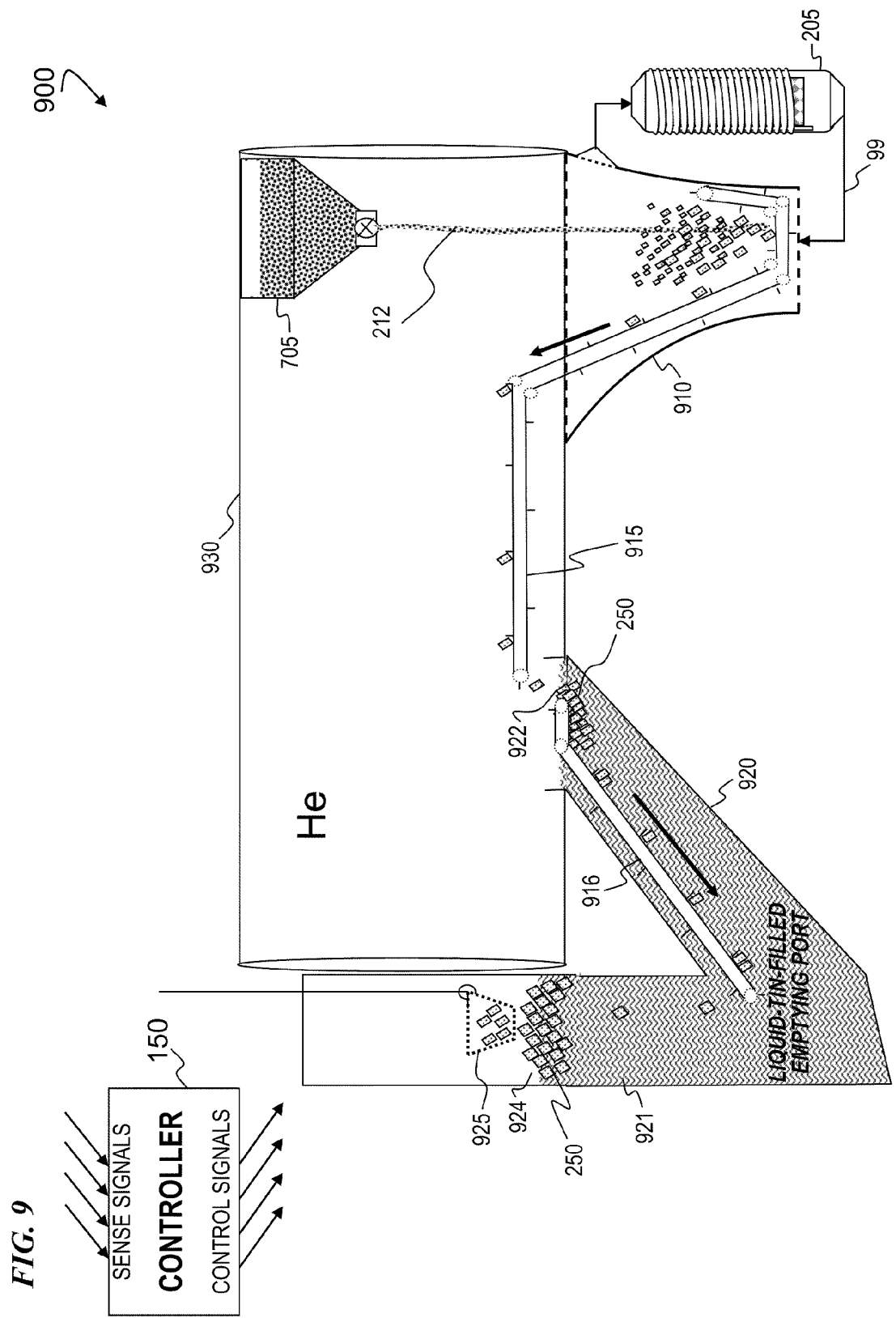
FIG. 9 is a schematic view of an automated liquid-solvent diamond-deposition system 900 that performs diamond deposition in a substantially continuous manner and uses a liquid metal emptying port to retrieve grown diamonds.

FIG. 9 is a schematic view of an automated liquid-solvent diamond-deposition system 900 that performs diamond deposition in a substantially continuous manner (i.e., rather than discrete loads, the seeds are dropped in as needed and the conveyor removes the diamonds that have grown sufficiently, such that the deposition process is not stopped or interrupted in order to add new seeds or remove grown diamonds) and uses a liquid-metal-filled emptying port usable to retrieve grown diamonds without letting atmospheric contaminants into the interior of the system. In some embodiments, system 900 includes a sealed chamber 930 (in some embodiments, a hermetically sealed chamber that substantially prevents helium from escaping) that is operatively connected to diamond-deposition station 910 and emptying port 920 (in some embodiments, a liquid-filled trap). In some embodiments, chamber 930 contains source 705 for seed diamonds 212 and is pressurized with an inert gas (e.g., helium). In some embodiments, during diamond deposition, seed diamonds 212 from source 705 are added to station 910 at a substantially continuous rate and once in station 910, these seed diamonds 212 undergo diamond deposition in a fluidized-bed configuration that also operates in a substantially continuous manner. In some such embodiments, as diamond deposition continues, grown diamonds 250 gradually sink to the bottom of station 910 (or are collected by a size-sensitive screen, sieve, comb or rake, or are otherwise sorted and/or separated from seeds and growing diamonds that have not reached the size desired for harvesting are left to continue growing) and are picked up by, e.g., a rake conveyor 915 (e.g., a conveyor having periodic rows of spaced-apart teeth, wherein diamonds that fit through such a spacing fall through and thus remain in the fluidized bed, while diamonds that have grown sufficiently large are held by the rake and lifted out to the harvesting-port end, wherein some embodiments include a circulating pump and a fine screen to collect solvent 99 and squirt it through a nozzle to wash off any too-small diamonds that may have stuck to the conveyor so that they drop back into the fluidized bed 910), which takes grown diamonds 250 out of station 910 and transfers them to emptying port 920.

In some embodiments, the grown diamonds 250 that are placed or dropped into emptying port 920 float in the liquid 921 (e.g., if using liquid tin, which has a density of 7.3 grams per cc), in which case some embodiments include a conveyor 916 that rakes the floating diamonds under the liquid trap used to exclude ambient air and the diamonds are allowed to float up and are retrieved via retrieval bucket 925, or in other embodiments, not shown, the diamonds sink to the bottom of liquid 921 in emptying port 920 (if the liquid 921 used in emptying port 920 to seal out ambient air is less dense than diamond, e.g., if using liquid aluminum, which has a density of 2.7 grams per cc). In some such embodiments, bucket 925 is used to retrieve grown diamonds 250 by placing bucket 925 into emptying port 920 from a side of emptying port 920 that is exposed to atmospheric pressure. By using emptying port 920, grown diamonds 250 can be retrieved without having to open chamber 930, thereby reducing the amount of purging and cleaning of the interior portions of chamber 930. In some embodiments, emptying port 920 includes a molten metal (e.g., tin (which has a melting point of about 293 degrees Celsius) or other suitable molten metals or liquids) as the liquid. In some embodiments, the molten metal is more dense than the diamonds 250, such that the diamonds float on the chamber-sealing liquid (i.e., at the interior end 922 of port 920 where they drop into the liquid 921 and/or at the exterior end 924 of port 920 where they float up to after being released by conveyor 916). In some such embodiments, a second conveyor 916 is used to submerge the diamonds.

In some embodiments, controller 150 receives sensor signals from a plurality of sensors monitoring system 900, processes those signals, and transmits one or more control signals to a plurality of process control devices in order to control diamond-deposition system 900. For example, in some embodiments, controller 150 controls the function of conveyor 915 such that grown diamonds 250 are removed from diamond-deposition station 910 and placed into diamond-removal port 920 at a rate necessary to keep up with the diamond deposition occurring at diamond-deposition station 910.

In some embodiments, diamond-deposition station 910 operates in a manner that is substantially similar to diamond-deposition station 210 depicted in FIGS. 2A-2C and/or diamond-deposition stations 310, 311, or 312 depicted in FIGS. 3A, 3B, and 3C, respectively, and in some embodiments, carbon-addition station 205 is substantially similar to carbon-addition station 205 depicted in FIGS. 2A-2C and FIGS. 4A-4B. In some such embodiments, during diamond deposition, a molten carbon-bearing solvent 99 (e.g., molten sodium, molten sodium-potassium, or other suitable solvents) circulates between carbon-addition station 205 and carbon-deposition station 910 such that carbon added at carbon-addition station 205 is brought to carbon-deposition station 910 and epitaxially deposits onto one or more seed diamonds 212 at carbon-deposition station 910.

In some embodiments, the present invention provides a method for growing diamond crystal. The method includes heating a carbon-bearing molten solvent; adding carbon solute to the carbon-bearing molten solvent in order to produce a solution of the molten solvent and an amount of carbon; flowing the solution; cooling the flowing solution across a distance in the flowing solution and substantially maintaining a temperature gradient from a first temperature at a first location in the flowing solution to a second temperature at a second location further downstream in the flowing solution than the first location, wherein the second temperature is lower than the first temperature; and depositing carbon in diamond-crystal structure from the flowing solution onto at least one diamond-deposition surface, wherein the depositing of carbon in diamond-crystal structure occurs at both the first location at the first temperature and the second location at the second temperature. In some embodiments, the first temperature is at least three degrees Celsius higher than the second temperature. In some embodiments, the first temperature is at least fifteen degrees Celsius higher than the second temperature. In some embodiments, the first temperature is at least thirty degrees Celsius higher than the second temperature. In some embodiments, the first temperature is at least seventy degrees Celsius higher than the second temperature.

Some embodiments further include generating sense signals from a plurality of process parameters, the sense signals including a signal representative of a concentration of carbon in the solution; and controlling the amount of carbon in the solution resulting from the adding of carbon, the flowing of the solution and the maintaining of the temperature gradient based on the sensed signals.

In some embodiments, the flowing of the solution includes pumping the solution in a circulation loop that includes the adding of carbon solute to the solvent and the depositing of carbon in diamond-crystal structure.

In some embodiments, the solvent includes at least one Group IA alkali metal selected from the group consisting of lithium, sodium, potassium, rubidium, cesium and francium.

In some embodiments, the at least one diamond-deposition surface includes a plurality of diamond seeds, and the method further includes suspending the diamond seeds in a fluidized bed using the flowing solution, wherein the temperature gradient is maintained across a length of the fluidized bed. In some such embodiments, the suspending of the diamond seeds includes maintaining a higher velocity of the flowing solution past the suspended diamond seeds at the first location and a lower velocity of the flowing solution past the suspended diamond seeds at the second location.

In some embodiments, the at least one diamond-deposition surface includes a plurality of diamond seeds, and the method further includes containing the diamond seeds in a plurality of cages in the flowing solution, the plurality of cages including a first cage and a second cage, wherein the temperature gradient is maintained across the plurality of cages such that the first location and the first temperature of the solution are within the first cage and the second location and the second temperature of the solution are within the second cage.

In some embodiments, the first temperature at the first location is at least ten degrees Celsius higher than the second temperature at the second location.

In some embodiments, the present invention provides an apparatus for growing diamond crystal. The apparatus includes a vessel that includes a carbon-addition station configured to heat a carbon-bearing molten solvent and add an amount of carbon to the carbon-bearing molten solvent in order to produce a solution of the molten solvent and the amount of carbon, diamond-deposition station configured to receive the solution from the carbon-addition station and cool the solution and substantially maintain a temperature gradient from a first temperature at a first location in the flowing solution to a second temperature at a second location further downstream in the flowing solution than the first location, wherein the second temperature is lower than the first temperature, and wherein the diamond-deposition station is configured to deposit carbon in a diamond-crystal structure from the solution at a plurality of locations in the temperature gradient onto at least one diamond-deposition surface, wherein the deposition of carbon in a diamond-crystal structure occurs at both the first location at the first temperature and the second location at the second temperature, and a solution-flow system configured to flow the solution through the carbon-addition station and to and through the diamond-deposition station.

Some embodiments further include a plurality of sensors operatively coupled to the vessel, wherein each one of the plurality of sensors is configured to detect and transmit at least one process parameter, the plurality of sensors including a sensor that measures an amount of dissolved carbon in the solution; and a controller operatively coupled to receive the at least one transmitted parameter from each of the plurality of sensors, and operatively coupled to send out at least one control signal to each of a plurality of control devices based on the at least one transmitted parameter.

In some embodiments of the apparatus, the solution-flow system includes a pump configured to flow the solvent against a thermal convection due to temperature differential, and/or to assist in creating and maintaining a desired flow rate through the system, whether with the thermal convection or against the thermal convection. In some such embodiments, the solution-flow system includes a pump configured to flow the solvent in a direction against a thermal-convection flow direction caused by a temperature differential. In other embodiments, the solution-flow system includes a pump configured to flow the solvent in a same direction as a thermal convection flow direction caused by a temperature differential.

In some embodiments of the apparatus, the solvent includes at least one Group IA alkali metal selected from the group consisting of lithium, sodium, potassium, rubidium, cesium and francium.

In some embodiments of the apparatus, the at least one diamond-deposition surface includes a plurality of diamond seeds, wherein the diamond-deposition station further includes a fluidized bed operatively coupled to suspend the diamond seeds in the solution; and a counter-flow cooling system operative coupled to the fluidized bed and configured to maintain the temperature gradient across a solvent-flow length of the fluidized bed.

In some embodiments of the apparatus, the fluidized bed and solution-flow system are configured to maintain a first velocity of the flowing solution past the suspended diamond seeds at the first location and a second velocity of the flowing solution past the suspended diamond seeds at the second location, wherein the second velocity is lower than the first velocity.

In some embodiments of the apparatus, the at least one diamond-deposition surface includes a plurality of diamond seeds, the apparatus further including the plurality of cages including a first cage and a second cage, wherein the temperature gradient is maintained across the plurality of cages such that the first location and the first temperature of the solution are within the first cage and the second location and the second temperature of the solution are within the second cage.

In some embodiments of the apparatus, the difference between the first temperature at the first location and the second temperature at the second location is ten degrees Celsius.

In some embodiments, the present invention provides an apparatus for growing diamond crystal. The apparatus includes means for heating a carbon-bearing molten solvent; means for adding carbon solute to the carbon-bearing molten solvent in order to produce a solution of the molten solvent and an amount of carbon; means for flowing the solution; means for cooling the flowing solution across a distance in the flowing solution and substantially maintaining a temperature gradient from a first temperature at a first location in the flowing solution to a second temperature at a second location further downstream than the first location in the flowing solution, wherein the second temperature is lower than the first temperature; and means for depositing carbon in a diamond-crystal structure from the flowing solution onto at least one diamond-deposition surface, wherein the depositing of carbon in a diamond-crystal structure occurs at both the first location at the first temperature and the second location at the second temperature.

Some embodiments further include means for generating sense signals from a plurality of process parameters, the sense signals including a signal representative of a concentration of carbon in the solution; and means for controlling the means for adding carbon, the means for flowing the solution and the means for maintaining the temperature gradient based on the sensed signals.

In some embodiments of this apparatus, the means for flowing the solution includes means for pumping the solution in a circulation loop that includes the means for adding carbon solute to the solvent to form a carbon-bearing solution and the means for depositing carbon in a diamond-crystal structure.

In some embodiments of this apparatus, the solvent includes at least one Group IA alkali metal selected from the group consisting of lithium, sodium, potassium, rubidium, cesium and francium.

In some embodiments of this apparatus, the at least one diamond-deposition surface includes a plurality of diamond seeds, the apparatus further including means for suspending the diamond seeds in a fluidized bed using the flowing solution, wherein the temperature gradient is maintained across a length of the fluidized bed.

In some embodiments of this apparatus, the means for suspending the diamond seeds includes means for controlling a velocity of the solution.

In some embodiments of this apparatus, the at least one diamond-deposition surface includes a plurality of diamond seeds, the apparatus further including means for containing the diamond seeds in a plurality of cages in the flowing solution, wherein the temperature gradient is maintained across the plurality of cages.

In some embodiments of this apparatus, the difference between the first temperature at the first location and the second temperature at the second location is ten degrees Celsius.

In some embodiments, the present invention provides an apparatus for growing diamond crystal, the apparatus comprising a carbon-addition station, a diamond-deposition station, and a solvent-flow system configured to flow a carbon-bearing solvent used to carry dissolved carbon from the carbon-addition station to the diamond-deposition station.

In some embodiments, the solvent is a carbon-bearing solvent that carries dissolved carbon and the carbon-flow system circulates the carbon-bearing solvent from the diamond-deposition station back to the carbon-addition station.

In some embodiments, the carbon-addition station is configured to dissolve carbon from a solid source of carbon. In other embodiments, the carbon-addition station is configured to dissolve carbon from a gaseous source of carbon. In some embodiments, the carbon-addition station is configured to dissolve a hydrocarbon.

In some embodiments, the present invention provides a method for growing diamond crystal, the method comprising heating a carbon-bearing solvent, dissolving carbon into the heated carbon-bearing solvent at a first location, moving the carbon-bearing solvent to a second location, cooling the carbon-bearing solvent at the second location, depositing carbon from the cooled carbon-bearing solvent in a diamond-crystal structure onto one or more diamond seeds, and recirculating the carbon-bearing solvent and repeating the above operations.

In some embodiments, the method further comprises suspending the one or more diamond seeds in the carbon-bearing fluid by controlling solvent velocity. In some embodiments, the method further comprises suspending the one or more diamond seeds in a fluidized-bed configuration by controlling solvent velocity. In some embodiments, the method further comprises suspending the one or more diamond seeds in a non-fixed position by controlling solvent velocity. In some embodiments, the method further comprises suspending the one or more diamond seeds in a freely-moving manner by controlling solvent velocity. In some embodiments, the method further comprises suspending the one or more diamond seeds in a central volume of the diamond-deposition station through which solvent flows by controlling solvent velocity. In some embodiments, the method further comprises suspending the one or more diamond seeds in a funnel-shaped container having a narrower entry portion and a wider exit portion.

In some embodiments, the present invention provides a method for growing diamond crystal, the method comprising providing a carbon-addition station, providing a diamond-deposition station, and flowing a carbon-bearing solvent in order to carry dissolved carbon from the carbon-addition station to the diamond-deposition station.

In some embodiments, the present invention provides an apparatus for growing diamond crystal, the apparatus comprising a carbon-addition station, a diamond-deposition station, a solvent-flow system configured to flow a carbon-bearing molten solvent used to carry dissolved carbon from the carbon-addition station to the diamond-deposition station, wherein epitaxial deposition of the carbon onto one or more seed diamonds occurs at the diamond-deposition station, a plurality of sensors located throughout the apparatus, wherein each one of the plurality of sensors is configured to detect and transmit one or more diamond-deposition parameters, and a controller operatively coupled to receive the one or more transmitted parameters from each one of the plurality of sensors, and operatively coupled to send out control signals to a plurality of control devices based on the one or more transmitted parameters. In some embodiments, the solvent-flow system circulates the carbon-bearing molten solvent from the diamond-deposition station back to the carbon-addition station.

In some embodiments, the one or more diamond-deposition parameters include a first temperature of the diamond-deposition station, and the first temperature is no more than 1200 Kelvin. In some embodiments, the first temperature is no more than 1100 Kelvin. In some embodiments, the first temperature is no more than 1000 Kelvin. In some embodiments, the first temperature is no more than 900 Kelvin. In some embodiments, the first temperature is no more than 800 Kelvin. In some embodiments, the first temperature is no more than 700 Kelvin.

In some embodiments, the carbon-addition station is configured to dissolve carbon from a solid source of carbon. In some embodiments, the solid source of carbon is a star-shaped piece of graphite. In some embodiments, the carbon-addition station is configured to dissolve carbon from a gaseous source of carbon. In some embodiments, the carbon-addition station is configured to dissolve a hydrocarbon. In some embodiments, the carbon-bearing molten solvent includes one or more Group I alkali metals. In some embodiments, the one or more alkali metals include a eutectic mixture of two or more alkali metals. In some embodiments, the carbon-bearing molten solvent includes one or more carbon-absorbing salts.

In some embodiments, the one or more process parameters include a first temperature associated with a first location in the diamond-deposition station and a second temperature associated with a second location in the diamond-deposition station, wherein the second temperature is cooler than the first temperature such that a temperature gradient is maintained between the first and second locations in the diamond-deposition station (and, in some embodiments, one or more additional deposition locations or one or more ranges of locations that continuously vary temperature and/or solvent velocity), and wherein the controller controls the temperature gradient such that the epitaxial deposition at the diamond-deposition station occurs at both the first and second locations in the diamond-deposition station.

In some embodiments, the one or more process parameters include a flow rate of the carbon-bearing molten solvent, and wherein the controller controls the flow rate such that the epitaxial deposition in the diamond-deposition station occurs at a plurality of separate locations. In some embodiments, the one or more process parameters include a gas pressure of the apparatus, and wherein the controller controls the gas pressure such that the epitaxial deposition at the diamond-deposition station occurs.

In some embodiments, the one or more seed diamonds are suspended within the carbon-bearing molten solvent at the diamond-deposition station in a fluidized-bed configuration by controlling solvent velocity. In some embodiments, the one or more seed diamonds are suspended within the carbon-bearing molten solvent at the diamond-deposition station in a non-fixed position. In some embodiments, the one or more seed diamonds are suspended within the carbon-bearing molten solvent at the diamond-deposition station in a freely-moving manner. In some embodiments, the one or more seed diamonds are suspended within the flow of carbon-bearing molten solvent 99 at the diamond-deposition station 110 in a central volume (i.e., a volume that is generally within the diamond-deposition station 110 and through which the solvent 99 flows, but in which the diamond seeds remain due to an approximate balance between the upward flow of a solvent that is lighter than the diamonds pushing the diamonds up and the downward force of gravity on the diamonds) In some such embodiments, the seeds are held in a series of wire cages, each at a different temperature and different carbon concentration (e.g., such that the solvent is at a given temperature, and a temperature gradient is maintained across the series cages).

In some embodiments, the present invention provides a method of for growing diamond crystal, the method comprising providing a carbon-addition station, providing a diamond-deposition station, providing a controller, flowing a carbon-bearing molten solvent in order to carry dissolved carbon from the carbon-addition station to the diamond-deposition station, wherein epitaxial deposition of the carbon onto one or more seed diamonds occurs at the diamond-deposition station, measuring one or more process parameters, wherein the measuring of the one or more parameters include transmitting the one or more parameters to the controller, and receiving the transmitted parameters at the controller, and maintaining, via the controller, the epitaxial deposition based on the transmitted parameters. In some embodiments, the flowing of the carbon-bearing molten solvent includes circulating the carbon-bearing molten solvent from the diamond-deposition station back to the carbon-addition station.

In some embodiments, the carbon-addition station is configured to dissolve carbon from a solid source of carbon. In some embodiments, the providing of the carbon-addition station includes dissolving carbon from a gaseous source of carbon at the carbon-addition station. In some embodiments, the providing of the carbon-addition station includes dissolving carbon from a hydrocarbon. In some embodiments, the flowing of the carbon-bearing molten solvent includes flowing one or more Group I alkali metals. In some embodiments, the flowing of the one or more alkali metals includes flowing a eutectic mixture of two or more alkali metals. In some embodiments, the flowing of the one or more alkali metals includes flowing a mixture of two or more alkali metals having a melting point temperature lower that is lower than the melting point temperatures of either alkali metal alone. In some embodiments, the flowing of the carbon-bearing molten solvent includes flowing one or more carbon-absorbing salts.

In some embodiments, the measuring of the one or more process parameters include measuring a first temperature associated with a first location in the diamond-deposition station and a second temperature associated with a second location in the diamond-deposition station, wherein the second temperature is cooler than the first temperature such that a temperature gradient is created and maintained between the first and second locations in the diamond-deposition station, and wherein the method further comprises controlling the temperature gradient, via the controller, such that the epitaxial deposition at the diamond-deposition station occurs at both the first and second locations. In some embodiments, the measuring of the one or more process parameters includes measuring a flow rate of the carbon-bearing molten solvent, and wherein the method further comprises controlling the flow rate, via the controller, such that the epitaxial deposition at the diamond-deposition station occurs at a plurality of locations in the diamond-deposition station.

In some embodiments, the flowing a carbon-bearing molten solvent includes providing an inert cover gas, wherein the measuring of the one or more process parameters include measuring a gas pressure of the neutral cover gas, and wherein the method further comprises controlling the gas pressure, via the controller, such that the epitaxial deposition at the diamond-deposition station occurs.

In some embodiments, the method further comprises suspending the one or more seed diamonds within the carbon-bearing molten solvent at the diamond-deposition station in a fluidized-bed configuration by controlling solvent velocity. In some embodiments, the method further comprises suspending the one or more seed diamonds within the carbon-bearing molten solvent at the diamond-deposition station in a non-fixed position. In some embodiments, the method further comprises suspending the one or more seed diamonds within the carbon-bearing molten solvent at the diamond-deposition station in a freely-moving manner. In some embodiments, the method further comprises suspending the one or more seed diamonds within the carbon-bearing molten solvent at the diamond-deposition station in a central volume of the diamond-deposition station through which solvent flows.

In some embodiments, the present invention provides an apparatus for growing diamond crystal, the apparatus comprising a carbon-addition station, a diamond-deposition station, and a solvent-flow system configured to flow a carbon-bearing molten-alkali-metal solvent used to carry dissolved carbon from the carbon-addition station to the diamond-deposition station, wherein epitaxial deposition of the carbon onto one or more seed diamonds occurs at the diamond-deposition station. In some embodiments, the solvent includes a eutectic mixture of two or more Group I alkali metals. In some embodiments, the solvent includes a eutectic mixture of sodium and potassium. In some embodiments, the solvent includes one or more carbon-absorbing salts.

In some embodiments, the present invention provides a method for growing diamond crystal, the method comprising providing a carbon-addition station, providing a diamond-deposition station, and flowing a carbon-bearing molten-alkali-metal solvent used to carry dissolved carbon from the carbon-addition station to the diamond-deposition station, wherein epitaxial deposition of the carbon onto one or more seed diamonds occurs at the diamond-deposition station. In some embodiments, the flowing of the molten-alkali-metal solvent includes flowing a eutectic mixture of two or more Group I alkali metals. In some embodiments, the flowing of the molten-alkali-metal solvent includes flowing a eutectic mixture of sodium and potassium.

In some embodiments, the present invention provides an apparatus for growing diamond crystal, the apparatus comprising a carbon-addition station, a diamond-deposition station, and a solvent-flow system configured to flow a carbon-bearing molten solvent used to carry dissolved carbon from the carbon-addition station to the diamond-deposition station, wherein epitaxial deposition of the carbon onto one or more seed diamonds occurs at the diamond-deposition station, and wherein a velocity of the solvent compensates for a density of the one or more seed diamonds such that the diamond-deposition station functions as a fluidized bed.

In some embodiments, the solvent has a density that is greater than a density of the one or more seed diamonds such that the one or more seed diamonds float in the solvent, wherein the diamond-deposition station has an inverted-funnel shape such that a top portion of the diamond-deposition station is narrower than a bottom portion of the diamond-deposition station, and wherein the solvent enters the diamond-deposition station at the top portion. In some embodiments, the solvent includes lead. In some embodiments, the solvent has a density that is less than a density of the one or more seed diamonds such that the one or more seed diamonds sink in the solvent, wherein the diamond-deposition station has a funnel shape such that a upper portion of the diamond-deposition station has a larger cross-sectional area than a lower portion of the diamond-deposition station, and wherein the solvent enters the diamond-deposition station at the lower portion. In some embodiments, the solvent includes one or more Group I alkali metals. In some embodiments, the solvent includes a eutectic mixture of two or more Group I alkali metals. In some embodiments, the solvent includes one or more carbon-absorbing salts.

In some embodiments, the present invention provides a method for growing diamond crystal, the method comprising providing a carbon-addition station, providing a diamond-deposition station, flowing a carbon-bearing molten solvent used to carry dissolved carbon from the carbon-addition station to the diamond-deposition station, wherein epitaxial deposition of the carbon onto one or more seed diamonds occurs at the diamond-deposition station, and suspending the one or more seed diamonds within the diamond-deposition station by using a velocity of the solvent to compensate for a density of the one or more seed diamonds.

In some embodiments, the flowing of the solvent includes flowing a solvent having a density that is greater than a density of the one or more seed diamonds such that the one or more seed diamonds float in the solvent, wherein the providing of the diamond-deposition station includes providing a diamond-deposition station having an inverted-funnel shape such that a top portion of the diamond-deposition station is narrower than a bottom portion of the diamond-deposition station, and wherein the suspending of the one or more seed diamonds includes introducing the solvent at the top portion of the diamond-deposition station. In some embodiments, the flowing of the solvent includes flowing lead.

In some embodiments, the flowing of the solvent includes flowing a solvent having a density that is less than a density of the one or more seed diamonds such that the one or more seed diamonds sink in the solvent, wherein the providing of the diamond-deposition station includes providing a diamond-deposition station having a funnel shape such that a top portion of the diamond-deposition station is wider than a bottom portion of the diamond-deposition station, and wherein the suspending of the one or more seed diamonds includes introducing the solvent at the bottom portion of the diamond-deposition station. In some embodiments, the flowing of the solvent includes flowing a eutectic mixture of two or more Group I alkali metals. In some embodiments, the flowing of the solvent includes flowing one or more carbon-absorbing salts.

In some embodiments, the present invention provides an apparatus comprising a carbon-addition station, a diamond-deposition station, and a solvent-flow system configured to flow a carbon-bearing molten solvent used to carry dissolved carbon from the carbon-addition station to the diamond-deposition station, wherein epitaxial deposition of the carbon onto one or more seed diamonds occurs at the diamond-deposition station, and wherein a motorized pump drives the solvent-flow system in a direction that is opposite to a direction of solvent flow caused by thermal convection between the carbon-addition station and the diamond-deposition station.

In some embodiments, the present invention provides a method comprising providing a carbon-addition station, providing a diamond-deposition station, and flowing a carbon-bearing molten solvent used to carry dissolved carbon from the carbon-addition station to the diamond-deposition station, wherein epitaxial deposition of the carbon onto one or more seed diamonds occurs at the diamond-deposition station, and wherein the flowing of the solvent is driven by a motorized pump that flows that solvent in a direction that is opposite to a direction of solvent flow caused by a temperature gradient between the carbon-addition station and the diamond-deposition station.

In some embodiments, the present invention provides an apparatus for growing diamond crystal, the apparatus comprising a carbon-addition station, a diamond-deposition station, a pressure-vacuum system, a solvent-flow system configured to flow a carbon-bearing molten solvent used to carry dissolved carbon from the carbon-addition station to the diamond-deposition station, wherein epitaxial deposition of the carbon onto one or more seed diamonds occurs at the diamond-deposition station, and wherein the pressure-vacuum system moves solvent in and out of the solvent-flow system. In some embodiments, the pressure-vacuum system applies a pressure to the solvent-flow system to prevent solvent boiling during epitaxial deposition.

In some embodiments, the present invention provides a method for growing diamond crystal, the method comprising providing a carbon-addition station, providing a diamond-deposition station, providing a pressure-vacuum system, flowing a carbon-bearing molten solvent in order to carry dissolved carbon from the carbon-addition station to the diamond-deposition station, wherein epitaxial deposition of the carbon onto one or more seed diamonds occurs at the diamond-deposition station, and during downtime of the epitaxial deposition, introducing and removing solvent for the flowing by operating the pressure-vacuum system. In some embodiments, the providing of the pressure-vacuum system includes providing a pressure on the solvent to prevent solvent boiling during epitaxial deposition.

In some embodiments, the at least one diamond-deposition surface includes a plurality of diamond seeds, wherein the diamond-deposition station further includes: a plurality of cages, each at a different average temperature, each operatively coupled to confine movement of the diamond seeds in the solution; and a counter-flow cooling system operative coupled to the plurality of cages and configured to maintain the temperature gradient across a solvent-flow length of the fluidized bed.

In some embodiments, the at least one diamond-deposition surface includes a plurality of diamond seeds, wherein the diamond-deposition station further includes: a plurality of cages, each at a different average temperature, each operatively coupled to confine movement of the diamond seeds in the solution; one or more vibrators operatively coupled to vibrate the plurality of cages; and a counter-flow cooling system operative coupled to the plurality of cages and configured to maintain the temperature gradient across a solvent-flow length of the fluidized bed.

In some embodiments, the at least one diamond-deposition surface includes a plurality of diamond seeds, wherein the diamond-deposition station further includes: a plurality of trays, each at a different average temperature, each operatively coupled to confine movement of the diamond seeds in the solution; and a counter-flow cooling system operative coupled to the plurality of trays and configured to maintain the temperature gradient across a solvent-flow length of the fluidized bed.

In some embodiments, the present invention provides an apparatus for growing diamond crystal, the apparatus comprising a solvent-containing vessel that includes: a carbon-addition station configured to add carbon to a molten solvent in order to produce a carbon-bearing molten solvent, a diamond-deposition station configured to deposit carbon in a diamond-crystal structure from the carbon-bearing molten solvent onto at least one diamond-deposition surface, a solvent-flow system configured to flow the carbon-bearing molten solvent from the carbon-addition station to the diamond-deposition station, and a plurality of control devices operatively coupled to control operation of the solvent-containing vessel; the apparatus further comprising a plurality of sensors operatively coupled to the solvent-containing vessel, wherein each one of the plurality of sensors is configured to detect and transmit one or more process parameters; and a controller operatively coupled to receive the one or more transmitted parameters from each of the plurality of sensors, and operatively coupled to send out one or more control signals to each of the plurality of control devices based on the one or more transmitted parameters.

In some embodiments, the one or more process parameters include a first temperature of the diamond-deposition station, wherein the first temperature is no more than 1200 Kelvin. In some embodiments, the first temperature is no more than 1100 Kelvin. In some embodiments, the first temperature is no more than 1000 Kelvin. In some embodiments, the first temperature is no more than 900 Kelvin. In some embodiments, the first temperature is no more than 800 Kelvin. In some embodiments, the first temperature is no more than 700 Kelvin.

In some embodiments, the solvent-flow system circulates the carbon-bearing molten solvent from the diamond-deposition station back to the carbon-addition station.

In some embodiments, the carbon-addition station is configured to dissolve carbon from a solid source of carbon. In some embodiments, the solid source of carbon is a star-shaped piece of graphite. In some embodiments, the carbon-addition station is configured to add carbon from a gaseous source of carbon. In some embodiments, the carbon-addition station is configured to add a hydrocarbon.

In some embodiments, the carbon-bearing molten solvent includes one or more Group I alkali metals. In some embodiments, the carbon-bearing molten solvent includes one or more carbon-absorbing salts. In some embodiments, the one or more alkali metals include a eutectic mixture of two or more alkali metals.

In some embodiments, the at least one diamond-deposition surface includes a plurality of diamond seeds. In some embodiments, the diamond-deposition station is configured to deposit carbon epitaxially.

In some embodiments, the one or more process parameters include a first temperature associated with a first location in the diamond-deposition station and a second temperature associated with a second location in the diamond-deposition station, wherein the second temperature is cooler than the first temperature such that a temperature gradient is created and maintained between the first and second locations in the diamond-deposition station, and wherein the controller controls the temperature gradient such that the deposition at the diamond-deposition station occurs at the first location and at the second location.

In some embodiments, the one or more process parameters include a flow rate of the carbon-bearing molten solvent, and wherein the controller controls the flow rate such that the deposition at the diamond-deposition station occurs at a plurality of locations in the diamond-deposition station. In some embodiments, the one or more process parameters include a gas pressure of the apparatus, and wherein the controller controls the gas pressure such that diamond deposition at the diamond-deposition station occurs.

In some embodiments, the one or more seed diamonds are suspended within the carbon-bearing molten solvent at the diamond-deposition station in a fluidized-bed configuration by controlling solvent velocity. In some embodiments, a plurality of different solvent velocities (e.g., in some embodiments, measured in cm/second) are provided by varying the cross-sectional area (e.g., in some embodiments, measured in $cm^2$) of the solvent flow (e.g., in some embodiments, measured in $cm^3$/second flowing through a given cross section of the solvent-flow system). In some embodiments, the one or more seed diamonds are suspended within the carbon-bearing molten solvent at the diamond-deposition station in a non-fixed position. In some embodiments, the one or more seed diamonds are suspended within the carbon-bearing molten solvent at the diamond-deposition station in a substantially freely-moving manner. In some embodiments, the one or more seed diamonds are suspended within the flowing carbon-bearing molten solvent at the diamond-deposition station in a central volume of the diamond-deposition station through which solvent flows. In some embodiments, as the diamonds grow, the solvent flow rate is increased.

In some embodiments, the present invention provides a method for growing diamond crystal, the method comprising providing a carbon-addition station configured to add carbon to a molten solvent in order to produce a carbon-bearing molten solvent; providing a diamond-deposition station configured to deposit carbon in a diamond-crystal structure from the carbon-bearing molten solvent onto at least one diamond-deposition surface; providing a controller; flowing the carbon-bearing molten solvent from the carbon-addition station to the diamond-deposition station; measuring one or more process parameters, wherein the measuring of the one or more parameters include transmitting the one or more parameters to the controller; and receiving the transmitted parameters at the controller, and maintaining, via the controller, the deposition based on the transmitted parameters.

In some embodiments, the flowing of the carbon-bearing molten solvent includes circulating the carbon-bearing molten solvent from the diamond-deposition station back to the carbon-addition station.

In some embodiments, the flowing of the carbon-bearing molten solvent includes flowing one or more alkali metals. In some embodiments, the flowing of the carbon-bearing molten solvent includes flowing one or more carbon-absorbing salts. In some embodiments, the flowing of the one or more alkali metals includes flowing a eutectic mixture of two or more alkali metals.

In some embodiments, the at least one diamond-deposition surface includes a plurality of diamond seeds. In some embodiments, the diamond-deposition station is configured to deposit carbon epitaxially.

In some embodiments, the measuring of the one or more process parameters include measuring a first temperature associated with a first location in the diamond-deposition station and a second temperature associated with a second location in the diamond-deposition station, wherein the second temperature is cooler than the first temperature such that a temperature gradient and carbon-concentration gradient form between the first location in the diamond-deposition station and the second location in the diamond-deposition station, and wherein the method further comprises controlling the temperature gradient, via the controller, such that the deposition at the diamond-deposition station occurs at both the first and second locations. For example, in some embodiments, the temperature gradient is controlled by varying the flow rate of the solvent, varying the amount of heat added to the solvent in the carbon addition station, varying the flow rate of the coolant, varying the amount of heat removed from the coolant used in the diamond-deposition station and/or varying the shape of the diamond-deposition station (e.g., by moving the walls or moving a shaped insert in the diamond-deposition station).

In some embodiments, the measuring of the one or more process parameters include measuring a flow rate of the carbon-bearing molten solvent, wherein the method further comprises controlling the flow rate, via the controller, such that the deposition at the diamond-deposition station occurs at each of a plurality of locations in the diamond-deposition station.

In some embodiments, the flowing a carbon-bearing molten solvent includes providing an inert cover gas, wherein the measuring of the one or more process parameters include measuring a gas pressure of the neutral cover gas, and wherein the method further comprises controlling the gas pressure, via the controller, such that diamond deposition at the diamond-deposition station occurs.

In some embodiments, the method further comprises suspending the one or more seed diamonds within the carbon-bearing molten solvent at the diamond-deposition station in a fluidized-bed configuration by controlling solvent velocity. In some embodiments, the method further comprises suspending the one or more seed diamonds within the carbon-bearing molten solvent at the diamond-deposition station in a non-fixed position. In some embodiments, the method further comprises suspending the one or more seed diamonds within the carbon-bearing molten solvent at the diamond-deposition station in a freely-moving manner. In some embodiments, the method further comprises suspending the one or more seed diamonds within the carbon-bearing molten solvent at the diamond-deposition station in a central volume of the diamond-deposition station through which solvent flows.

In some embodiments, the present invention provides an apparatus for growing diamond crystal, the apparatus comprising a carbon-addition station; a diamond-deposition station; and a solvent-flow system configured to flow a carbon-bearing molten-alkali-metal solvent used to carry carbon from the carbon-addition station to the diamond-deposition station, wherein epitaxial deposition of the carbon onto one or more seed diamonds occurs at the diamond-deposition station.

In some embodiments, the solvent includes a eutectic mixture of two or more alkali metals. In some embodiments, the solvent includes a eutectic mixture of sodium and potassium.

In some embodiments, the present invention provides a method for growing diamond crystal, the method comprising providing a carbon-addition station; providing a diamond-deposition station; and flowing a carbon-bearing molten-alkali-metal solvent used to carry carbon from the carbon-addition station to the diamond-deposition station, wherein epitaxial deposition of the carbon onto one or more seed diamonds occurs at the diamond-deposition station.

In some embodiments, the flowing of the molten-alkali-metal solvent includes flowing a eutectic mixture of two or more alkali metals. In some embodiments, the flowing of the molten-alkali-metal solvent includes flowing a eutectic mixture of sodium and potassium.

In some embodiments, the present invention provides an apparatus for growing diamond crystal, the apparatus comprising a carbon-addition station; a diamond-deposition station; and a solvent-flow system configured to flow a carbon-bearing molten solvent used to carry carbon from the carbon-addition station to the diamond-deposition station, wherein epitaxial deposition of the carbon onto one or more seed diamonds occurs at the diamond-deposition station, and wherein a velocity of the solvent compensates for a density of the one or more seed diamonds such that the diamond-deposition station functions as a fluidized bed.

In some embodiments, the solvent has a density that is greater than a density of the one or more seed diamonds such that the one or more seed diamonds float in the solvent, wherein the diamond-deposition station has an inverted-funnel shape such that a top portion of the diamond-deposition station is narrower than a bottom portion of the diamond-deposition station, and wherein the solvent enters the diamond-deposition station at the top portion.

In some embodiments, the solvent includes lead. In some embodiments, the solvent is lead.

In some embodiments, the solvent includes sodium. In some embodiments, the solvent is sodium.

In some embodiments, the solvent includes a mixture of sodium and potassium. In some embodiments, the solvent is a mixture of sodium and potassium. In some embodiments, the solvent is a eutectic-ratio mixture of sodium and potassium.

In some embodiments, the solvent includes gallium. In some embodiments, the solvent is gallium.

In some embodiments, the solvent includes indium. In some embodiments, the solvent is indium.

In some embodiments, the solvent includes tin. In some embodiments, the solvent is tin.

In some embodiments, the solvent includes a mixture of gallium, indium and tin. In some embodiments, the solvent is a mixture of gallium, indium and tin. In some embodiments, the solvent is a eutectic-ratio mixture of gallium, indium and tin.

In some embodiments, the solvent has a density that is less than a density of the one or more seed diamonds such that the one or more seed diamonds sink in the solvent if it is not moving, wherein the diamond-deposition station has a funnel shape such that a top portion of the diamond-deposition station is wider than a bottom portion of the diamond-deposition station, and wherein the solvent enters the diamond-deposition station at the bottom portion. In some embodiments, the high-density solvent includes one or more metals selected from the group consisting of sodium, potassium, cesium, rubidium and franconium. In some embodiments, the solvent includes a eutectic mixture of two or more alkali metals. In some embodiments, the solvent includes one or more carbon-absorbing salts.

In some embodiments, the solvent has a density that is more than a density of the one or more seed diamonds such that the one or more seed diamonds float in the solvent if it is not moving, wherein the diamond-deposition station has a funnel shape such that a bottom portion of the diamond-deposition station is wider than a top portion of the diamond-deposition station, and wherein the solvent enters the diamond-deposition station at the top portion. In some embodiments, the high-density solvent includes one or more metals selected from the group consisting of gallium, indium, tin, lead, gold, silver, antimony. In some embodiments, the solvent includes a eutectic mixture of two or more metals. In some embodiments, the solvent includes one or more carbon-absorbing salts.

In some embodiments, the present invention provides a method for growing diamond crystal, the method comprising providing a carbon-addition station; providing a diamond-deposition station; flowing a carbon-bearing molten solvent used to carry carbon from the carbon-addition station to the diamond-deposition station, wherein epitaxial deposition of the carbon onto one or more seed diamonds occurs at the diamond-deposition station; and suspending the one or more seed diamonds within the diamond-deposition station by using a velocity of the solvent to compensate for a density of the one or more seed diamonds.

In some embodiments, the flowing of the solvent includes flowing a solvent having a density that is greater than a density of the one or more seed diamonds such that the one or more seed diamonds float in the solvent, wherein the providing of the diamond-deposition station includes providing a diamond-deposition station having an inverted-funnel shape such that a top portion of the diamond-deposition station is narrower than a bottom portion of the diamond-deposition station, and wherein the suspending of the one or more seed diamonds includes introducing the solvent at the top portion of the diamond-deposition station. In some embodiments, the flowing of the solvent includes flowing lead.

In some embodiments, the flowing of the solvent includes flowing a solvent having a density that is less than a density of the one or more seed diamonds such that the one or more seed diamonds sink in the solvent, wherein the providing of the diamond-deposition station includes providing a diamond-deposition station having a funnel shape such that a top portion of the diamond-deposition station is wider than a bottom portion of the diamond-deposition station, and wherein the suspending of the one or more seed diamonds includes introducing the solvent at the bottom portion of the diamond-deposition station.

In some embodiments, the flowing of the solvent includes flowing a eutectic mixture of two or more alkali metals. In some embodiments, the flowing of the solvent includes flowing one or more carbon-absorbing salts.

In some embodiments, the present invention provides an apparatus comprising a carbon-addition station; a diamond-deposition station; and a solvent-flow system configured to flow a carbon-bearing molten solvent used to carry carbon from the carbon-addition station to the diamond-deposition station, wherein epitaxial deposition of the carbon onto one or more seed diamonds occurs at the diamond-deposition station, and wherein a motorized pump drives the solvent-flow system in a direction that is opposite to a direction of solvent flow caused by thermal convection between the carbon-addition station and the diamond-deposition station. In some such embodiments, a pump is used to assist in creating and maintaining a desired flow rate through the system, whether that flow direction is the same direction as would occur with the thermal convection or in an opposite direction as the thermal convection In some embodiments, the present invention provides a method comprising providing a carbon-addition station; providing a diamond-deposition station; and flowing a carbon-bearing molten solvent used to carry carbon from the carbon-addition station to the diamond-deposition station, wherein epitaxial deposition of the carbon onto one or more seed diamonds occurs at the diamond-deposition station; and wherein the flowing of the solvent is driven by a motorized pump that flows that solvent in a direction that is opposite to a direction of solvent flow that would be caused by a temperature and density gradient between various locations in the carbon-addition station and the diamond-deposition station. In some such embodiments, a pump is used to assist in creating and maintaining a desired flow rate through the system, whether that flow direction is the same direction as would occur with the thermal convection or in an opposite direction as the thermal convection.

In some embodiments, the present invention provides an apparatus for growing diamond crystal, the apparatus comprising a carbon-addition station; a diamond-deposition station; a pressure-vacuum system; and a solvent-flow system configured to flow a carbon-bearing molten solvent used to carry carbon from the carbon-addition station to the diamond-deposition station, wherein epitaxial deposition of the carbon onto one or more seed diamonds occurs at the diamond-deposition station, and wherein the pressure-vacuum system moves solvent in and out of the solvent-flow system.

In some embodiments, the pressure-vacuum system applies a pressure to the solvent-flow system to prevent solvent boiling during epitaxial deposition.

In some embodiments, the present invention provides a method for growing diamond crystal, the method comprising providing a carbon-addition station; providing a diamond-deposition station; providing a pressure-vacuum system; flowing a carbon-bearing molten solvent in order to carry carbon from the carbon-addition station to the diamond-deposition station, wherein epitaxial deposition of the carbon onto one or more seed diamonds occurs at the diamond-deposition station; and during downtime of the epitaxial deposition, introducing and removing solvent for the flowing by operating the pressure-vacuum system.

In some embodiments, the providing of the pressure-vacuum system includes providing a pressure on the solvent to prevent solvent boiling during epitaxial deposition.

It is understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," "third," and the like are used merely as labels, and are not intended to impose numerical requirements on their objects.

What is claimed is:

1. A method for growing diamond crystal, the method comprising:
    heating a carbon-bearing molten solvent, wherein the molten solvent includes at least one alkali metal;
    adding carbon solute to the carbon-bearing molten solvent in order to produce a solution of the molten solvent and an amount of carbon;
    flowing the solution through a first diamond-deposition location;
    cooling the flowing solution to a first temperature at the first diamond-deposition location in the flowing solution; and
    depositing carbon in diamond crystal structure from the flowing solution onto at least one diamond-deposition surface, wherein the depositing of carbon in diamond crystal structure occurs at the first diamond-deposition location at the first temperature.

2. The method of claim 1, wherein the molten solvent includes a metal hydride.

3. The method of claim 2, wherein the metal hydride includes sodium hydride.

4. The method of claim 1, wherein the alkali metal includes sodium.

5. The method of claim 1, wherein the alkali metal is sodium.

6. The method of claim 1, wherein the alkali metal includes potassium.

7. The method of claim 1, wherein the alkali metal is potassium.

8. An apparatus for growing diamond crystal, the apparatus comprising:
    a vessel that includes:
        a carbon-addition station configured to heat a carbon-bearing molten solvent and add an amount of carbon to the carbon-bearing molten solvent in order to produce a solution of the molten solvent and the amount of carbon, wherein the molten solvent includes at least one alkali metal;

a diamond-deposition station configured to receive the solution from the carbon-addition station and cool the solution to a first temperature at a first diamond-deposition location in the flowing solution, wherein the diamond-deposition station includes a cooling system thermally coupled to the diamond-deposition station and configured to substantially maintain a temperature in the flowing solution at the first temperature at the first diamond-deposition location, wherein the diamond-deposition station is configured to deposit carbon in diamond crystal structure from the solution at the first diamond-deposition location onto at least one diamond-deposition surface, wherein the deposition of carbon in diamond crystal structure occurs at the first diamond-deposition location at the first temperature; and a solution-flow system configured to flow the solution through the carbon-addition station and to and through the diamond-deposition station.

9. The apparatus of claim 8, wherein the molten solvent includes a metal hydride.

10. The apparatus of claim 9, wherein the metal hydride includes sodium hydride.

11. The apparatus of claim 8, wherein the alkali metal includes sodium.

12. The apparatus of claim 8, wherein the alkali metal is sodium.

13. The apparatus of claim 8, wherein the alkali metal includes potassium.

14. The apparatus of claim 8, wherein the alkali metal is potassium.

15. An apparatus for growing diamond crystal, the apparatus comprising:
   means for heating a carbon-bearing molten solvent, wherein the molten solvent includes at least one alkali metal;
   means for adding carbon solute to the carbon-bearing molten solvent in order to produce a solution of the molten solvent and an amount of carbon;
   means for flowing the solution through a first diamond-deposition location;
   means for cooling the flowing solution to a first temperature at the first diamond-deposition location in the flowing solution; and
   means for depositing carbon in diamond crystal structure from the flowing solution onto at least one diamond-deposition surface, wherein the depositing of carbon in diamond crystal structure occurs at the first diamond-deposition location at the first temperature.

16. The apparatus of claim 15, wherein the molten solvent includes a metal hydride.

17. The apparatus of claim 15, wherein the alkali metal includes sodium.

18. The apparatus of claim 15, wherein the alkali metal is sodium.

19. The apparatus of claim 15, wherein the alkali metal includes potassium.

20. The apparatus of claim 15, wherein the alkali metal is potassium.

* * * * *